US011802053B2

(12) United States Patent
Hodes

(10) Patent No.: US 11,802,053 B2
(45) Date of Patent: Oct. 31, 2023

(54) METHOD AND APPARATUS FOR THE FABRICATION OF DIAMOND BY SHOCKWAVES

(71) Applicant: Daniel Hodes, Owings Mills, MD (US)

(72) Inventor: Daniel Hodes, Owings Mills, MD (US)

( * ) Notice: Subject to any disclaimer, the term of this patent is extended or adjusted under 35 U.S.C. 154(b) by 0 days.

(21) Appl. No.: 17/300,384

(22) Filed: Jun. 10, 2021

(65) Prior Publication Data
US 2022/0396488 A1  Dec. 15, 2022

(51) Int. Cl.
*C01B 32/26* (2017.01)
*C01B 32/28* (2017.01)
*C23C 16/27* (2006.01)
*C23C 16/452* (2006.01)
*H05H 15/00* (2006.01)
*C01B 32/25* (2017.01)
*H01J 37/32* (2006.01)

(52) U.S. Cl.
CPC .............. *C01B 32/26* (2017.08); *C01B 32/28* (2017.08); *C23C 16/274* (2013.01); *C23C 16/276* (2013.01); *C23C 16/452* (2013.01); *H05H 15/00* (2013.01); *C01B 32/25* (2017.08); *C01P 2006/80* (2013.01); *H01J 37/32192* (2013.01)

(58) Field of Classification Search
None
See application file for complete search history.

(56) References Cited

U.S. PATENT DOCUMENTS

| | | | | |
|---|---|---|---|---|
| 4,540,536 A | | 9/1985 | Altmann et al. | |
| 4,609,428 A | * | 9/1986 | Fujimura | H01J 37/32623 438/728 |
| 4,710,722 A | | 12/1987 | Jahnke | |
| 4,767,608 A | * | 8/1988 | Matsumoto | C30B 29/04 423/446 |
| 4,859,493 A | * | 8/1989 | Lemelson | B01J 8/42 427/562 |
| 5,310,512 A | * | 5/1994 | Bigelow | C23C 16/01 427/249.14 |
| 5,314,652 A | * | 5/1994 | Simpson | C23C 16/01 264/219 |
| 5,818,173 A | * | 10/1998 | Perrin | H01Q 9/32 315/111.21 |

(Continued)

FOREIGN PATENT DOCUMENTS

JP  62065997  *  3/1987  ............. C30B 29/04

OTHER PUBLICATIONS

Maeda, et al. Journal of Applied Physics 100, 014101 (2006).

(Continued)

*Primary Examiner* — Ram N Kackar
(74) *Attorney, Agent, or Firm* — William E. Beaumont; Juneau & Mitchell

(57) ABSTRACT

An apparatus for fabricating diamond by carbon assembly, which comprises:
a) a hydrocarbon radical generator in operable connection with
b) a mass flow conduit extending from the hydrocarbon radical generator in a) to an interface and into a primary magnetic accelerator containing one or more electromagnets in operable connection with
c) a diamond fabrication reactor comprising a diamond forming deposition substrate.

Also disclosed is a method for fabricating diamond by shockwaves using the disclosed apparatus.

16 Claims, 17 Drawing Sheets

(56) References Cited

U.S. PATENT DOCUMENTS

| | | | |
|---|---|---|---|
| 5,954,882 | A | 9/1999 | Wild et al. |
| 7,910,083 | B2 | 3/2011 | Twichen et al. |
| 8,101,526 | B2 | 1/2012 | Lee et al. |
| 8,232,747 | B2 * | 7/2012 | Crewson ............... H05H 9/00 315/505 |
| 8,778,295 | B2 | 7/2014 | Hodes |
| 9,061,917 | B2 | 6/2015 | Hodes |
| 10,407,062 | B2 | 9/2019 | Ikedo et al. |
| 10,407,770 | B2 | 9/2019 | Inglis et al. |
| 10,766,775 | B1 | 9/2020 | Hodes |
| 2001/0001385 | A1 * | 5/2001 | Nakamura ............ H01L 29/167 117/84 |
| 2003/0117080 | A1 * | 6/2003 | Dandl ............... H01J 37/32623 315/111.81 |
| 2004/0255867 | A1 * | 12/2004 | Ulrich ............... H01J 37/32192 118/723 MW |
| 2012/0187842 | A1 * | 7/2012 | DiVergilio .......... H01J 37/3171 315/111.41 |
| 2014/0377472 | A1 * | 12/2014 | Aizawa ............... C23C 14/0605 427/446 |
| 2018/0126629 | A1 | 5/2018 | Staal et al. |
| 2018/0130639 | A1 * | 5/2018 | Vranich ............ H01J 37/32082 |

OTHER PUBLICATIONS

NIST Chemistry Web Book (Cover Page) SRD 69.
Parizh, et al., Superconduct. Sci. Technol. Jan. 2017: 30(1) 014007.
NBS Tech Note 365, "Survey of Electrical Resistivity . . . "
NBS Monograph 109, "Investigations of the Exploding Wire Process . . . "
Ribiero, Ph.D. thesis from Florida Int. Univ. (2016).
MIT "Superconducting Magnets", Lecture 4 Magnetic Forces and Stresses.
Cryogenics, vol. 38, Issue 1, Jan. 1998.
Weisand, Lecture 7 ESS, Thermal Insulation & Cryogenics.
Balshaw, Practical Cryogenics.
Cody, et al. J. Phys. Chem. A 2002, 106, 6060-6067 Jun. 1, 2002.
Takeuchi, et al. Bull. Inst. Chem. Res. Kyoto Univ., vol. 49, No. 4, 1971.
Avni, et al. Homogeneous Reactions . . . (NASA).
Mc Carthy, J. Chem. Phys. 22, 1360 (1954) (Abstract).
De Groh, et al. NASA Technical Memorandum 113163.
Prestemon, Unit 10 Electromagnetic forces . . . .
Weisand, Lecture 7 Thermal Insulation and Cryogenic Basics.
International Standard IEC 61131-3 (Part 3 Programming Languages).
NBS Thermal and Mechanical Properties of Polyurethane Foams . . . (Apr. 1984).
Davison, Chapter 13 "Steady Detonation Waves", in part.
Guan-Ren Lai et al, Res. Natl. Inst. Stand. Technol. 100, 43 (1995).
Eaton-Magana et al. "Recent Advances in CVD Synthetic Diamond Quality" (Summer 2012).
Engeln, et al. Chem. Phys. Lett. 310 (1999).
Becker, Chem. Phys. Lett. vol. 71, Issue 2 (Apr. 15, 1980).
Zhao et al., Metals 2018, 8, 307 (2018).
Stepper Bee (Installation and Users Manual) 2009-2018 PC Control Ltd.
The Element Six CVD Diamond Handbook.
2010 Abstracts IEEE International (on Plasma science).
Landolt-Bornstein, Magnetic Properties of Free Radicals.

* cited by examiner

|          | Enthalpy of Formation kJ/mol | Gibbs Energy of Formation kJ/mol | Molar Entropy J/Kmol |
|----------|------------------------------|----------------------------------|----------------------|
| Graphite | 0                            | 0                                | 5.740                |
| Diamond  | +1.895                       | +2.900                           | +2.377               |

X-Ray Crystallographic Representation of the Cubic Diamond Unit Cell

- Externally Bonded
- Bound To Internal Carbon Atom
- Internally Bound $sp^3$
- Face Centered – External Bonds R-L Circuit Inductor Time Constants 6a 6b 6c

METHOD AND APPARATUS FOR THE FABRICATION OF DIAMOND BY SHOCKWAVES

BACKGROUND OF THE INVENTION

Disclosed herein are a method and apparatus for the fabrication of diamond similar to but technically and patentably distinct from the method of making diamond of U.S. Pat. No. 10,766,775, and the apparatus disclosed therein. The '775 diamond fabrication process is directed to the chemical synthesis of the 5-carbon atom tetrahedron which was discovered to be a basic building block of diamond from which diamond may be made. In that process, a kinetically energized carbyne radical reacts with a supported layer of the tetrahedranoidal molecule, dihydrobenzvalene, to produce this 5-carbon atom tetrahedron, i.e., carbon tetracarbide. Upon impact with the supported dihydrobenzvalene layer, carbyne radical kinetic energy is transferred to the supported layer of co-reactant as a shock wave which produces an effective instantaneous pressure to drive the chemical process of carbyne insertion into dihydrobenzvalene to form carbon tetracarbide resulting in the process of diamond formation. That process is believed to occur by self-assembly of many 5-carbon atom tetrahedrons, carbon tetracarbide, to form a diamond network.

The disclosed apparatus of the '775 patent comprises a means to generate the carbyne radical in an inert carrier gas which transits into a magnetic accelerator having multiple sequentially deployed switched drive electromagnets and interposed between each electromagnet pair is a means to prevent radical recombination using secondary radio frequency energy. The magnetic accelerator is deployed within a Dewar containing a refrigerant which is liquid nitrogen.

The method and apparatus of the present invention, in contrast, are directed to a diamond fabrication process which is the physical process of carbon atom assembly requiring entirely different and more energetic conditions for which the apparatus of this invention is better suited as a starting point.

Conventional Diamond Fabrication

Conventional processes of diamond fabrication include high pressure, high temperature (HPHT, "anvil" or belt press) and chemical vapor deposition (CVD). These processes are physical processes wherein carbon atoms assemble to form diamond. Both processes use a diamond seed as a template for carbon atom assembly. HPHT processes are conducted in a massive bomb wherein elemental carbon powder (graphite) containing diamond seed particles is maintained at high pressures and temperatures for several weeks to several months emulating the conditions of diamond formation deep with the Earth's crust. CVD diamond processes are conducted in a reactor having a heated diamond forming deposition substrate upon which diamond seed particles are spread, and a hydrocarbon gas such as methane is exposed to a source of high energy such as a microwave discharge at the reactor input to break carbon-hydrogen bonds and provide a diamond forming reactive hydrocarbon species. Propagating by diffusion under reduced pressure 200 mm Hg) to the deposition substrate, these reactive hydrocarbon species provide the carbon for diamond formation by the physical process of carbon atom assembly. Production cycle times for CVD diamond fabrication processes range from two weeks to two months, and HPHT processes can take considerably longer. Both processes inevitably contain graphite impurities, but some CVD processes have non-stoichiometric hydrocarbenoidal inclusions stabilized within the diamond lattice: $C_xH_n$ where: $x \geq 1$; $n \geq 1$.

Both HPHT and CVD diamond fabrication processes are effective means of producing appreciable quantities of diamond, but these processes are flawed and cannot produce ultra-pure diamond except as an isolated region of the diamond product and in limited yield within the overall mass of their respective production runs. The small amounts of ultra-pure diamond found within these process products is best characterized as the "pearl-in-the-oyster." For both HPHT and CVD diamond fabrication processes, it is impractical, if not impossible, to use additive manufacturing methods which could produce shaped and precisely dimensioned diamond products. Both CVD and HPHT processes are effective diamond fabrication methods, but they are flawed processes with respect to throughput, product purity, product homogeneity, and control over types of products.

Both HPHT and CVD diamond fabrication are governed by the thermodynamics of diamond formation. Specifically, the enthalpy of formation of diamond (product) is 2.8 Kj/mol, and that of graphite (reactant) is 0.0 Kj/mol (ground state carbon). Where $\Delta G_{transformation} = \Delta G_{product} - \Delta G_{reactant}$, the equilibrium expression $K = e^{-(\Delta G_{transformation}/RT)}$ reduces to $K = e^{-1.13}$ for an equilibrium constant of 3.096 favoring graphite over diamond. It is pressure which shifts this equilibrium to favor diamond over graphite as shown in FIG. 1.

CVD diamond occurs at reduced pressure, a condition which suggests that no diamond should form at all. Thus, the ground state species of this process (reactant) differs from graphite and is most likely to be the methyl radical which is in an excited energy state. The energy of the deposition substrate breaks remaining carbon-hydrogen bonds to provide a reactive carbon atom and drives the process of carbon atom assembly to produce diamond. Operating at reduced pressure, diamond forming reactants transit to the diamond forming deposition substrate by diffusion. This results in regional product differences of thickness and product purity and regionally variable surface topology: hills; valleys; voids. CVD diamond fabrication practitioners frequently observe diamond formation on the walls of their reactor.

The purity of diamond produced by CVD diamond fabrication processes may be greater than that of HPHT processes. Despite adherence to thermodynamic "law," HPHT diamond fabrication processes are plagued with graphite impurities because control over such extreme conditions is not possible. What goes on within the HPHT reactor is nearly impossible to observe to obtain data which may be useful for correcting its flaws. While more and faster diamond production may be possible as an improvement for this process, better quality diamond at any production cycle rate eludes process development for HPHT diamond fabrication. Both processes are able to produce large quantities of diamond, but both processes cannot produce diamond products which are ultra-pure thus far.

Conventional CVD diamond fabrication processes provide a reactive carbon atom source, typically a methyl radical, to a heated diamond forming deposition substrate upon which diamond seeds (powders or granules) are deployed but are complicated by the fact that the thermal energy of the diamond fabrication deposition substrate cannot be localized to ONLY that site—the reactor walls are HOT (800-1000° C.). This problem has been addressed by the use of complex nozzle structures to provide deposition substrate diffusion paths but with limited success. See for example U.S. Pat. No. 9,637,838.

Thus, a need exists for a methodology to correct the flaws of conventional diamond fabrication processes.

SUMMARY OF THE INVENTION

It is an object of this invention to correct the flaws of conventional diamond fabrication processes.

It is a further object of this invention to produce high purity diamond products in high yield and short production cycle times by a physical process of carbon atom assembly.

It is an additional object of this invention to produce high purity diamond products having controlled shape and dimension by additive manufacturing techniques.

It is yet another object of this invention to produce such diamond products by a method of making diamond using shock waves.

It is, moreover, an object of this invention to provide an apparatus for effecting the process of high purity diamond fabrication by the use of shock waves.

It is also an object of this invention to produce diamond using a novel magnetic accelerator.

Accordingly, the present invention provides a means to combine the effectiveness of HPHT and CVD diamond fabrication processes. The novelty of the method and apparatus of this invention is their amalgamation of conditions of high pressure with the process of chemical vapor deposition into a single, controllable diamond fabrication process by the use of shock wave chemical vapor deposition or ultra high-pressure chemical vapor deposition: SWCVD or UHPCVD.

The present invention provides, for example, a method for fabricating diamond by carbon assembly, which entails:
a) generating a source of single carbon atoms by subjecting methane or acetylene to a source of energy sufficient to break carbon-hydrogen bonds if methane is used, or carbon-carbon bonds if acetylene is used, to produce a fluence of paramagnetic $C_1$ hydrocarbon radicals;
b) passing the fluence of paramagnetic $C_1$ hydrocarbon radicals through an interface into a magnetic accelerator, and subjecting said fluence of paramagnetic $C_1$ hydrocarbon radicals to magnetic force produced by one or more electromagnets which confine the paramagnetic $C_1$ hydrocarbon radicals, said magnetic field force being sufficient to accelerate said $C_1$ hydrocarbon radicals to produce a fluence of kinetically energized $C_1$ hydrocarbon radicals; and
c) passing said fluence of kinetically energized $C_1$ hydrocarbon radicals into a reactor containing a diamond-forming deposition substrate, whereby said fluence of said kinetically energized C1 hydrocarbon radicals impacts said diamond-forming substrate, thereby transferring this energy to the diamond-forming substrate as a shock wave, said shock wave being of sufficient energy to produce a pressure domain which favors diamond formation by carbon assembly over graphite formation.

DETAILED DESCRIPTION OF THE PREFERRED EMBODIMENTS

Term Definitions

Figure 1:
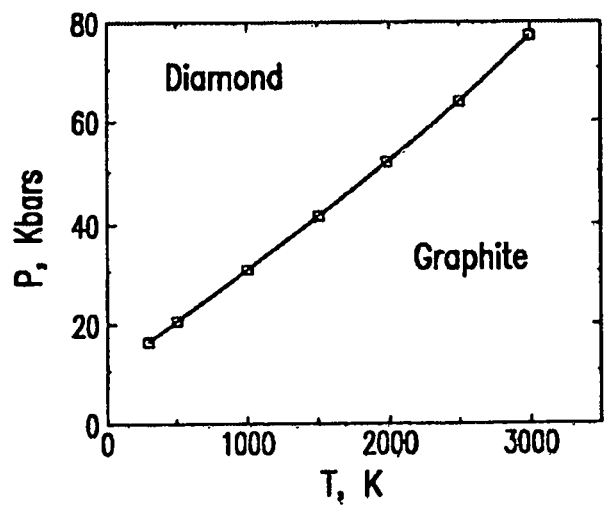
FIG. 1 graphically represents the zones of diamond and graphite as a function of temperature and pressure. It is pressure which shifts this equilibrium to favor diamond over graphite. This a pressure-domain graph.

The terms below as used in this application are defined as follows:

Radicals: this term is used to refer to the fluence of radicals generated in the radiolysis reactor and which transit to the magnetic accelerator. The radicals are also referred to as paramagnetic $C_1$ hydrocarbon radicals, $C_1$ hydrocarbon radicals, or simply paramagnetic adicals or even or a mass of these radicals. All of these terms refer to the same thing without ambiguity.

Radiolysis Reaction Chamber: this term refers to the reaction chamber where the radicals are generated by radiolytic scission of methane molecules or acetylene molecules to generate a fluence of the radicals.

Method of Diamond Fabrication Using Shockwaves

The method of this invention relies upon a very specific and novel apparatus which comprises the four main components: $C_1$ hydrocarbon radical generator (generator), interface, magnetic accelerator (accelerator), and diamond fabrication reactor (reactor).

In operation, the generator produces the $C_1$ hydrocarbon radicals methyl ($CH_3\cdot$) or carbyne ($\cdot CH$ or $:CH$; energy state dependent) by exposing their hydrocarbon sources (methane or acetylene) diluted in the inert carrier gas helium to a source of energy sufficient to break carbon-hydrogen or carbon-carbon bonds. The hydrocarbon radicals so produced are paramagnetic due to one or more unpaired valence electrons and are, as a consequence, magnetically susceptible. These $C_1$ hydrocarbon radicals transit through an interface into the accelerator and are subjected to the force of magnetic fields produced by one or more electromagnets within the core of which the $C_1$ hydrocarbon radical-carrier gas mixture is confined. The force of this magnetic field accelerates these $C_1$ hydrocarbon radicals providing them kinetic energy thus creating a fluence of diamond forming kinetically energized $C_1$ hydrocarbon radicals. This fluence of diamond forming $C_1$ hydrocarbon radicals transits from the accelerator into the reactor which contains the diamond forming deposition substrate. This fluence of kinetically energized C1 hydrocarbon radicals impacts this diamond forming deposition substrate contained therein. Upon impact, these kinetically energized $C_1$ hydrocarbon radicals transfer their energy to the deposition substrate as a shock wave. The effect of this shock wave is to produce a pressure, an effective instantaneous pressure, sufficient to produce a pressure domain for the diamond forming process of carbon atom assembly which favors diamond over graphite.

Effective Instantaneous Pressure

The velocities of these magnetically accelerated $C_1$ hydrocarbon radicals impart kinetic energy which is defined by Newton's second law of motion: $F=m\times a$ where F is a force (Newtons), m is mass (kg), and a is acceleration (meters/sec$^2$). The accelerated $C_1$ hydrocarbon radicals of the method of this invention impact the diamond forming deposition substrate with more force than is attributable to their mass alone.

Pressure is a continuous physical force exerted upon an object by a mass in contact with said object as defined by the expression: $P=F/A$ where P is pressure, F is force, and A is the area over which force is exerted. Regardless of the magnitude of kinetic energy provided to the diamond forming $C_1$ hydrocarbon radicals, the transfer of kinetic energy of these accelerated radicals due to their impact upon the diamond forming deposition substrate results in a pressure (F/A).

Figure 2:
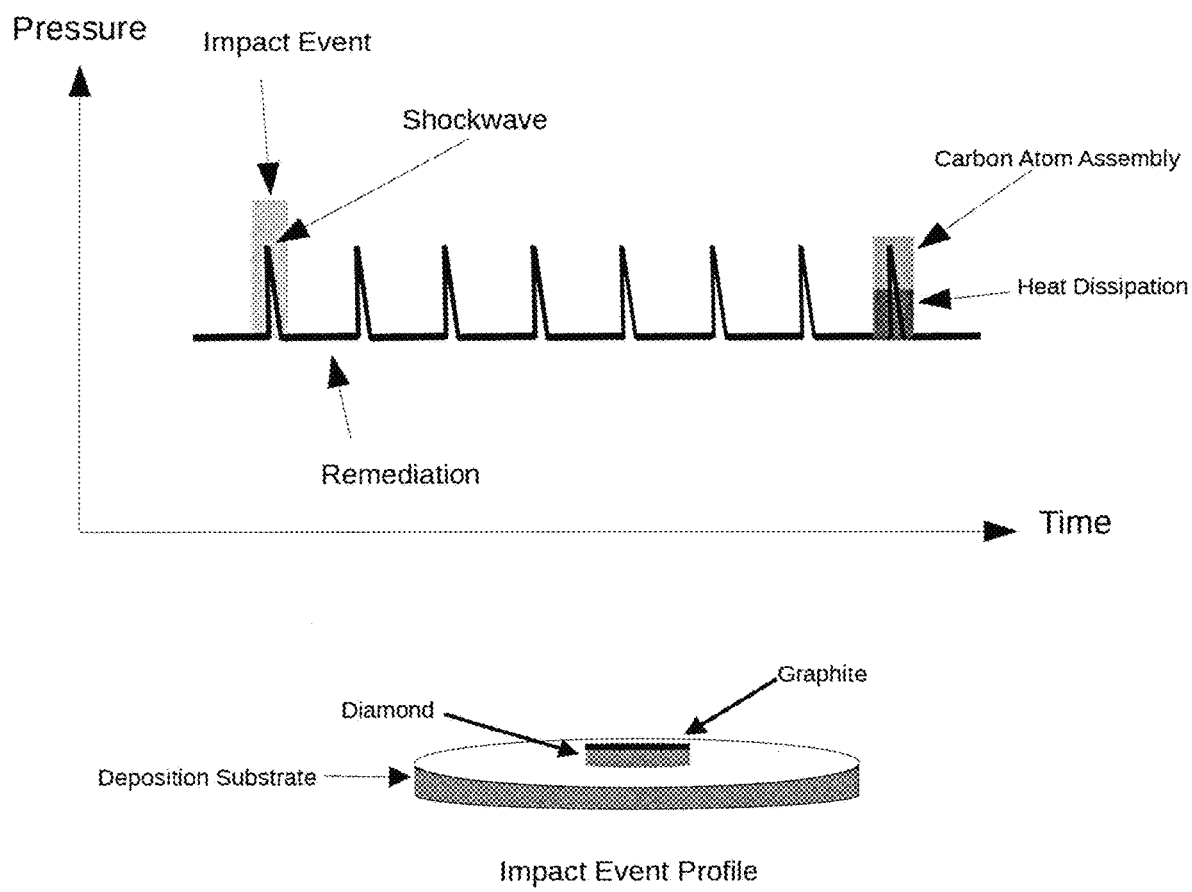
FIG. 2 depicts the pressure profile of the for the shock wave of the method of this invention. This is a shockwave-events profile.

At the instant of impact, the force of the kinetically energized $C_1$ hydrocarbon radicals results in an effective instantaneous pressure. Although the duration of this instantaneous pressure is very short, it is a pressure nonetheless: an effective instantaneous pressure. Thus, the overall profile of the pressure is pulsatile rather than constant. This is the profile of a pressure wave, a shock wave. This shock wave pressure profile is best characterized as that of a sawtooth or triangular waveform as is depicted in FIG. 2.

The region of the impact event profile attributed to carbon atom assembly is small compared to the overall profile of the impact event because the shock wave kinetic energy which drives the process of carbon atom assembly is rapidly, but not totally, consumed by the small mass of excited state diamond forming carbon. The remaining energy is dissipated as heat over and above that heat which is supplied to the diamond fabrication deposition substrate by the substrate support heater.

The ambient pressure within the diamond fabrication reactor will be sub-atmospheric just as it is in conventional CVD diamond fabrication processes but much lower. By contrast, the diamond forming reaction process pressure is the effective instantaneous pressure of the shock wave. Thus, the conditions of diamond formation are not those of the ambient conditions within the reactor; rather, they are conditions of pressure, effective instantaneous pressure, due to the impact event shock wave. Shock waves are known to promote physical processes and chemical reactions. See, for example, Davison, "Fundamentals of Shock Wave Propagation in Solids," Chapter 13, pp. 343-344.

Diamond Seed

Similar to conventional CVD diamond forming processes, the method of this invention requires a diamond seed which serves as a template or guide for the assembly of carbon atoms (atomic motion) to form diamond—the same function as diamond seed used in HPHT processes. However, the diamond seed used in HPHT and conventional CVD processes is unsuitable for use in diamond fabrication by the method of this invention.

An ideal diamond seed is disclosed in the '775 patent which is an ultra-pure and contiguous diamond mono-layer free of voids, hills or valleys which is produced by a chemical synthesis of a diamond layer by a process similar to but patentably distinct from those of my U.S. Pat. Nos. 8,778,295, and 9,061,917. These diamond fabrication methods require facilities which are not common to the majority of diamond fabrication facilities be they HPHT or CVD: a chemical synthesis laboratory. For this reason, an alternate type of diamond seed is disclosed. This is a point of difference with conventional CVD processes.

The typical diamond seed used for conventional CVD diamond fabrication are diamond powders or granules deployed upon a diamond fabrication deposition substrate. The force of gravity is more than sufficient to maintain these diamond particulates stationary as deployed upon their diamond forming surface.

Consider the fate of these same diamond particulates deployed upon the deposition substrate of the present shock wave diamond fabrication process. Upon impact by a mass of kinetically energized (high velocity) $C_1$ hydrocarbon radicals with the deposition substrate, the kinetic energy transfer (shock wave) would inevitably transfer some of that kinetic energy to the diamond particles deployed upon the diamond fabrication substrate surface. The result of this kinetic energy transfer will be to accelerate these diamond seeds ejecting them from that surface. Loss of diamond seed also means loss of kinetic energy which would otherwise be imparted to the process of carbon atom assembly including carbon-hydrogen or carbon-carbon bond breaking to provide excited state diamond forming carbon atoms.

Accordingly, an immobilized diamond seed is mandated, and this diamond seed must be free of surface non-diamond carbon impurities. Such surface impurities could propagate throughout the entire diamond forming process of the method of this invention if present. Ultra-pure diamond itself is rare and would be so costly as to be impractical for use as a diamond seed. An ideal diamond seed is one having a topology free of voids, hills, or valleys and free of non-diamond carbon impurities. The alternative diamond seed disclosed herein is NOT, of course, ideal, but it is adequate for its intended use.

Diamond seed produced by conventional diamond fabrication processes can be remediated by hydrogenolysis to remove non-diamond carbon surface impurities as is done in conventional CVD diamond fabrication processes. A review of CVD diamond remediation methods is available in Eaton-Magaña, S. E. and D'Haenens-Johanson, F. S., "Recent Advances in CVD Synthetic Diamond Quality," *Gems & Gemology*, Summer 2012, pp. 124-127 (Overview and Update). While this method cannot remediate sub-surface non-diamond carbon impurities, it is adequate for the method of this invention with respect to a pure seed surface.

Diamond is routinely immobilized onto surfaces which undergo great mechanical stress such as rock bits used for oil well drilling comprising cobalt in tungsten carbide. Diamond powder is pressed into the drill bit end effectors at high pressures (~1 million psi), and cobalt brachiates into the diamond compact upon the end effectors to bond the diamond compact to the drill bit. Issues of diamond powder purity severely effect this bonding process such that cobalt brachiation into the diamond is not entirely effective. See, for example, Zhao and Duan, *Metals* 2018, 8(5) 307 "A Review of the Diamond Retention Capacity of Metal Bond Matrices."

Such extreme immobilization conditions for diamond far exceed what is necessary for diamond particulate immobilization to produce a suitable diamond seed for the method this invention. This seed need only survive the first instant of the shock wave diamond fabrication process being rapidly overgrown by the succeeding mass of diamond produced by the fluence of diamond forming kinetically energized $C_1$ hydrocarbon radicals.

Diamond seed immobilization requires a material which retains its integrity at the temperatures used for diamond fabrication and which is sufficiently malleable or soft to allow for the immobilization of diamond within it by impressing the diamond powder into the immobilizing agent at or somewhat below its annealing temperature. This annealing temperature must be higher than the diamond fabrication temperature. Another property of this material is the longitudinal shear or extensional velocities of sound through it. Low sound velocity indicates that some shock wave energy would be dissipated or absorbed by the diamond immobilizing material making it an energy "sink" for the shock wave.

The diamond seed particulate must be immobilized so that no diamond voids are present making small grain size powders most preferred. An exposed non-diamond area can result in product defects and non-diamond carbon impurities. The immobilizing material need only be a foil (≤5 mm). Listed below are properties of materials suitable for use for diamond seed immobilization.

| Metal | Hardness | Mp; Annealing ° C. | Sound Velocity m/sec/Shear/ Ext.)* |
|---|---|---|---|
| Cu | 3 | 1084; 370-650 | 4760/2325/3810 |
| Ag | 2.5-4 | 961; 204-426 | 3650/1510/2680 |
| Au | 2.5-3 | 1063; 704 | 3240/1200/2030 |
| Ni | 4.0 | 1453; 815-925 | 6040/3000/4900 (type 200) |
| Pd | 4.8 | 1555; 500-1450 | 3570/1900/3070 (est.) |
| Pt | 4.3 | 1770; 982 | 3260/1730/2800 |

(*Longitudinal)

Compressive strengths for metals at 25° C. and decreasing with temperature

| Metal | Compressive Strength MPA | Tons/in$^2$ |
|---|---|---|
| Cu | 45 | ~2.9 |
| Ag | 45 | ~2.9 |
| Au | 14 | ~0.6 |
| Ni | 70 | ~4.5 |
| Pd | 30 | ~1.95 |
| Pt | 20 | ~0.91 |

This data shows that the best overall service is provided by platinum and nickel with annealing or softening temperatures furthest from the preferred operating temperature for diamond fabrication by the method of this invention. Gold is also suitable. The pressures required for diamond seed immobilization are readily provided by commercially available benchtop or "shop" type hydraulic and pneumatic presses.

All of these metals can be recovered from their superposed diamond mass by bringing the diamond product to the annealing temperature of the immobilizing material for mechanical separation with minimal force. Chemical methods may also be used but require a second chemical process to recover the immobilization material which will not be in the form of the original foil.

Diamond Fabrication

The apparatus of this invention provides electromagnetic force to the magnetically susceptible paramagnetic $C_1$ hydrocarbon radicals, CH or $CH_3$ (carbyne or methyl) to produce a fluence of kinetically energized diamond forming C1 hydrocarbon radicals which transit into the diamond fabrication reactor to impact the diamond forming deposition substrate deployed therein. Upon impact, this kinetic energy is transferred to the deposition substrate by the mass of kinetically energized mass of $C_1$ hydrocarbon radicals produces a shock wave of sufficient force so as to produce an effective instantaneous pressure which, as a result, drives the physical process of diamond formation by carbon atom assembly within a pressure domain favoring diamond over graphite thus resulting in graphite free diamond.

Because the diamond forming $C_1$ hydrocarbon radicals of the method of this invention are accelerated, they do not propagate onto the diamond forming deposition substrate by diffusion. Their propagation has a defined trajectory to a point of impact—the fabrication locus: that point of the diamond fabrication substrate which is intersected by the axis of propagation (vector) of the fluence of diamond forming kinetically energized $C_1$ hydrocarbon radicals transiting into the reactor from the magnetic accelerator.

The method of this invention provides a carbon atom precursor species to the diamond forming deposition substrate just as in conventional CVD diamond fabrication processes. By contrast, the deposition substrate temperature, 400-800° C., can be lower than that of its conventional CVD diamond counterpart, 800-1200° C. The method of this invention provides far more overall energy to the physical process of carbon atom assembly to form diamond than does its conventional CVD diamond counterpart. The energy difference is that of the kinetically energized diamond forming fluence of kinetically energized $C_1$ hydrocarbon radicals transferred to the diamond forming process by the impact produced shock wave manifested as heat, bond dissociation energy, pressure, or all of these forms of energy.

The diamond fabrication cycles begins with $C_1$ hydrocarbon radical generation from a source hydrocarbon: methyl radical (·$CH_3$) from methane or carbyne radical (·CH or ⫶ CH, energy state dependent) from acetylene. The hydrocarbons and are diluted in an inert carrier gas, helium, prior to radical formation. The $C_1$ hydrocarbon radicals so produced are paramagnetic due to their unpaired valence electrons and are magnetically susceptible. Both $C_1$ hydrocarbon radicals may be produced by microwave radiolysis. See U.S. Pat. No. 7,910,083 which is incorporated herein by reference regarding methane and See K. H. Becker, et al., *Chem. Phys. Lett.*, vol. 71, no. 2 (15 Apr. 1980) and R. Engeln, et al., *Chem. Phys. Lett.*, 310 (1999) 405-410.) regarding obtaining carbyne radicals by acetylene radiolysis.

The magnetically susceptible $C_1$ hydrocarbon radicals so produced transit into the accelerator by way of an interface component deployed between the $C_1$ hydrocarbon radical generator and the magnetic accelerator where these $C_1$ hydrocarbon radicals are subjected to magnetic acceleration by the force of the electromagnetic field produced by an energized electromagnet. This magnetic force creates a fluence of kinetically energized diamond forming $C_1$ hydrocarbon radicals which are confined within the electromagnet core.

This fluence of kinetically energized $C_1$ hydrocarbon radicals transit from the accelerator into the reactor and impact the diamond forming deposition substrate contained therein. The resulting kinetic energy transfer of this impact event, the shock wave, drives the process of carbon atom assembly in a pressure domain favoring diamond over graphite. Subsequent to this diamond fabrication event, the diamond fabrication locus is subjected to surface remediation by hydrogenolysis to remove any surface non-diamond carbon impurities which will inevitably form. This cycle of radical generation, magnetic acceleration, diamond formation, and surface remediation is repeated until a sufficient mass of diamond product is obtained. Thereupon, the diamond product is recovered from the reactor for final surface remediation procedures.

Remediation

Non-diamond carbon impurity formation is inevitable for the method of the present invention just as it is for conventional CVD diamond fabrication processes. Graphite is common to both processes, but non-stoichiometric hydrocarbenoidal impurities are found in conventional CVD diamond products which are stabilized or "trapped" within the diamond lattice. Remediation (removal) of non-diamond carbon impurities by hydrogen is used by both processes.

Conventional CVD diamond fabrication processes operate under conditions of continuous flow of a $C_1$ hydrocarbon (methane) in hydrogen carrier gas subjected to a level of energy at the reactor input sufficient to fission of carbon-carbon and carbon-hydrogen bonds. This energy is usually microwave, but hot filament and short wave UV have been used. The resulting mixture of methane radicals and plasma hydrogen provide the source of diamond forming carbon and the means to remediate non-diamond carbon impurities. Hydrogen in any form is chemically reactive and can interfere with carbon atom assembly to diamond at the diamond fabrication deposition substrate surface. During the diffusive propagation of methyl radicals in excited state hydrogen carrier gas from the reactor input to the diamond fabrication deposition substrate, hydrogen can react with the diamond forming $C_1$ hydrocarbon radicals. Hydrogen plasma can even react with diamond itself under very energetic conditions. See, for example, U.S. Pat. No. 8,101,526. Once released into the diamond fabrication reactor, there is no way to control the indiscriminate chemical reactivity of hydrogen in any form. Molecular hydrogen has also been provided directly to the diamond fabrication deposition substrate for non-diamond carbon species remediation using a separate flow. The existence of graphite and other non-diamond carbon impurities in conventional CVD diamond fabrication process products suggests that hydrogenolysis is slow compared to other processes which may occur during conventional CVD fabrication processes.

The method of the present invention is not a continuous flow process, and its use of chemically reactive hydrogen is restricted to remediation of the non-diamond carbon impurities which are mostly graphite, but some non-stoichiometric hydrocarbenoidal species may be present.

Figure 3:
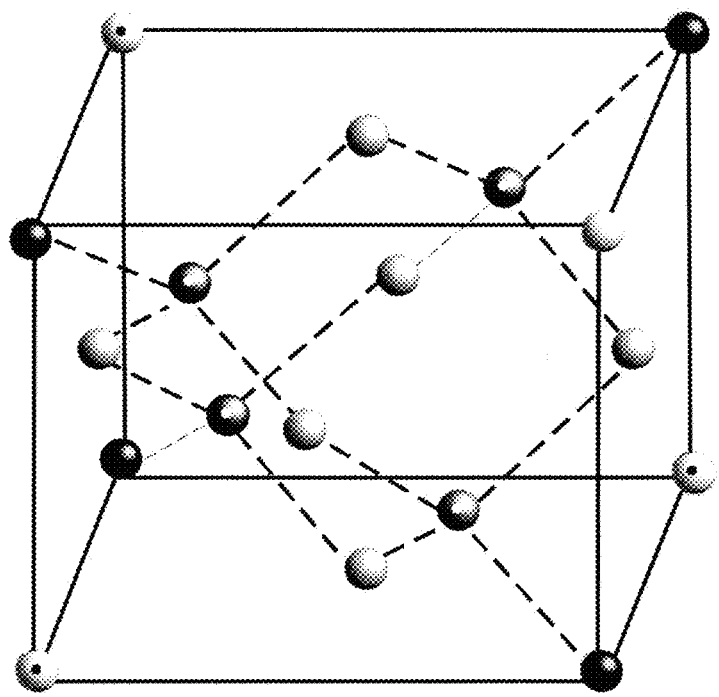
FIG. 3 shows the X-Ray crystallographic representation of the cubic diamond unit cell.

The most common crystallographic form of diamond is that of the cubic unit cell as determined by X-ray crystallography. FIG. 3 shows the X-ray crystallographic representation of the cubic diamond unit cell which comprises 8 apical carbon atoms, 4 internal $sp^3$ carbon atoms, and 6 face centered carbon atoms having external bonds as do 3 of the apical carbon atoms. As shown, this cubic unit cell comprises 18 carbon atoms.

By the method of the present invention, the fluence of diamond forming kinetically energized $C_1$ hydrocarbon radicals impacting a diamond fabrication locus is not two dimensional (X-Y plane)—it is columnar. The "height" (Z-axis dimension) of this column depends upon the mass of the fluence of kinetically energized $C_1$ hydrocarbon radicals covering the area of the fabrication locus. Diamond formation propagates from the fabrication locus surface through to the terminus of this fluence along the propagation axis (Z-axis) during a fabrication event until all of the carbon which can assemble to form diamond unit cells is consumed or until the kinetic energy of the $C_1$ hydrocarbon radical fluence has dissipated to a level insufficient to drive carbon atom assembly as diamond formation. At either of these points, non-diamond carbon impurities form and must exist entirely at the surface of the diamond fabrication locus. Those $C_1$ hydrocarbon radicals at the fabrication locus surface which could not form impurities undergo radical-radical reactions forming volatile hydrocarbons: methane or ethane from methyl radicals; acetylene from carbyne radicals. These are removed from the reactor by evacuation at the end of the remediation cycle.

Consider a single diamond fabrication locus which is not surface remediated. That surface is impure—not diamond at all. The fate of a succeeding fluence of kinetically energized $C_1$ hydrocarbon radicals impacting this fabrication locus which has not been remediated is indeterminate. The kinetic energy transfer (shock wave) and the energy of the deposition substrate (heat) are more than adequate for carbon-hydrogen bond dissociation to provide energetic carbon atoms, but no diamond seed exists at this fabrication locus. There are three possibilities: 1) diamond forms consuming the fabrication locus surface carbon impurity as part of the diamond forming process; 2) diamond forms but overgrows the surface impurity; 3) graphite forms because there is no diamond seed. Even if new diamond forms, new surface impurities will also form. Where diamond overgrowth occurs, the final diamond product will be contaminated to a large degree by embedded non-diamond carbon which is most likely to be graphite. Such a product would be a composite of diamond and graphite having little, if any, commercial application and less pure than naturally occurring diamond. Accordingly, each diamond fabrication event is followed by a remediation event using hydrogen.

Figure 4:
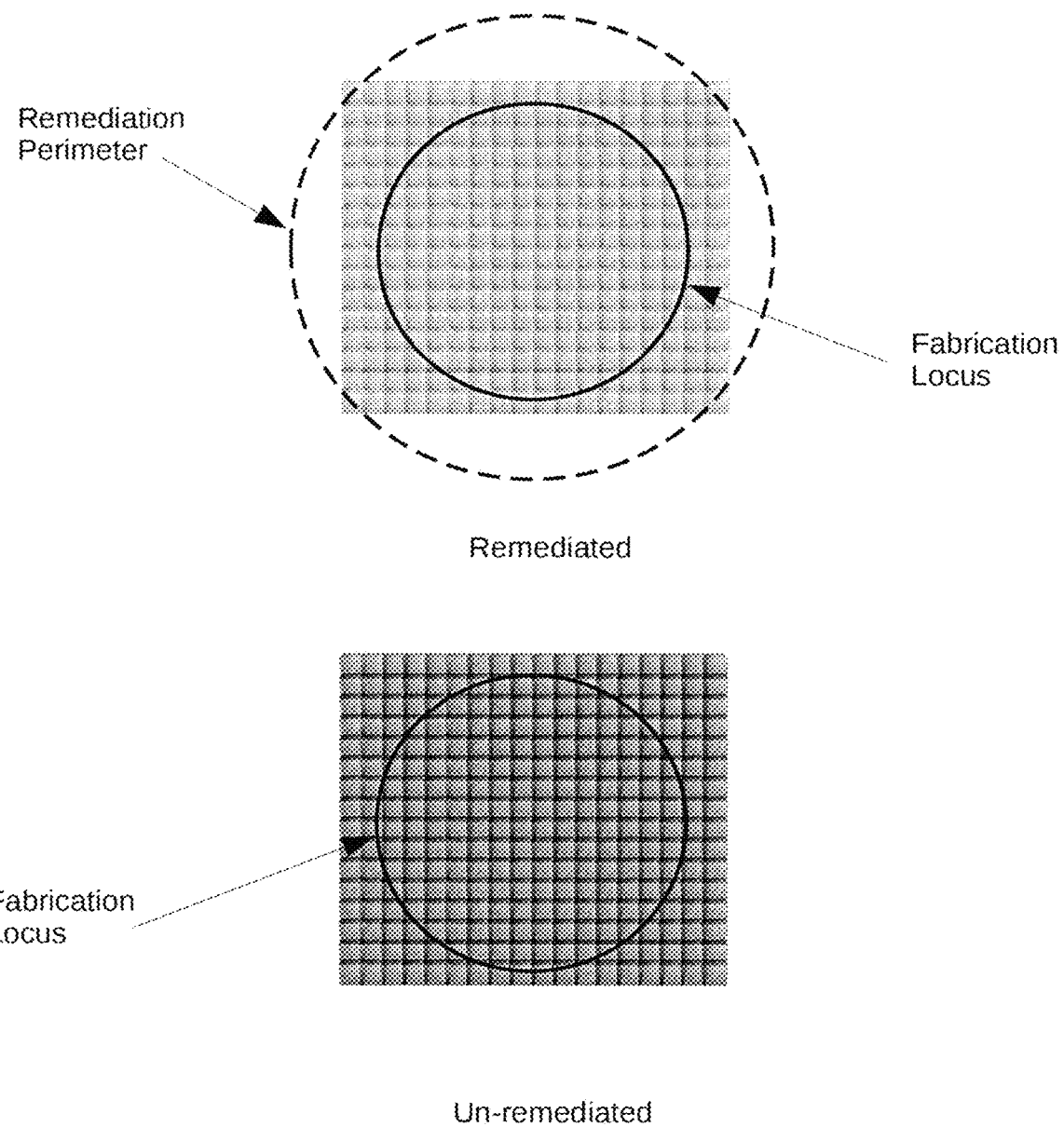
FIG. 4 depicts the remediation profile for a diamond fabrication locus.

For any fabrication event, impurity mass area may exceed that of the fabrication locus. Consequently, the remediation means within the diamond fabrication reactor should provide an area of remediation beyond than that of the fabrication locus area. FIG. 4 depicts a fabrication locus at the diamond cubic unit cell level showing unit cell association (crystallization) before and after remediation.

Heated molecular hydrogen does not corrupt the quality or morphology of diamond which has formed. Surface impurities such as graphite are removed from conventional CVD diamond fabrication products by heated molecular hydrogen provided directly to the deposition substrate effectively, and atomic hydrogen attacks graphitic $sp^2$ carbon bonds, removing graphite that tends to form with the diamond. See, for example, Natl. Inst. Stand. Technol. 1995

January-February 100(1); 43-49 "Deposition of Diamond Films in a Closed Hot Filament CVD System" provided for public access by the N.I.S.T. Journal of Research.

The method of this invention provides hydrogen gas remediation at the fabrication locus for each diamond fabrication event. Unlike the continuous flow of hydrogen gas used in conventional CVD diamond fabrication processes, the present invention provides remediation hydrogen as an event separate from and only after each diamond fabrication event. No form of hydrogen exists to interfere with a diamond fabrication event by reaction with diamond forming $C_1$ hydrocarbon radicals. The only other species present during a diamond fabrication event is the chemically inert carrier gas, helium Hydrogen plasma is frequently used in conventional CVD diamond fabrication processes for surface remediation (see U.S. Pat. No. 10,407,770). The method of the present invention provides remediating hydrogen plasma to the diamond fabrication locus. Hydrogen plasma can be obtained using an electrostatic discharge at ~2 KV. See, for example C. Lo et al., *Dynamics of near-atmospheric-pressure hydrogen plasmas driven by pulsed high voltages*, IEEE Xplore 2010, IEEE Abstracts Jul. 29, 2010, DOI: 10.1109/PLASMA.2010.5534339. Hydrogen plasma can be produced by a microwave discharge of ~1 Kw at 2.45 Ghz. See, for example, U.S. Pat. No. 9,890,457. The method and apparatus of the present invention provide hydrogen plasma to the diamond fabrication by two means, and the means of this hydrogen plasma generation and delivery impacts the design of the diamond fabrication reactor for which there are two types: type 1 and type 2.

Components internal to the type 1 reactor comprise a hydrogen gas manifold having integral high voltage discharge electrodes deployed about the tip of the reactor mass flow conduit. High voltage delivered to these electrodes generates the hydrogen plasma delivered to the diamond fabrication locus.

For the type 2 reactor, hydrogen plasma is generated within the hydrocarbon radical generator and transits within the mass flow conduit through both interface and accelerator and into the reactor. Hydrogen plasma and hydrogen atoms are magnetically susceptible and are kinetically energized by the accelerator thus providing a novel remediating agent.

For both types, hydrogen plasma is provided as a continuous flow during the remediation event which is controlled by spectroscopic monitoring or by effluent monitoring. Spectral "fingerprints" for diamond, graphite, and other non-diamond carbon species are well known such as short chain hydrocarbons and can be stored in a digital library. Main computer sense and control software having a remediation subroutine compares real time spectral data for the fabrication locus and/or the effluent against these "fingerprints" to determine a remediation event end point so that the reactor may be evacuated and readied for and a new diamond fabrication event or an end of run shutdown.

Final diamond product surface remediation proceeds after the product is recovered from the reactor and separated from the seed immobilization material. The seed side (bottom) of the diamond product must be subjected to abrasion to obtain a smooth surface and remove the layer of diamond seed. The diamond product top and sides are then washed. Wash is reported in Diamond and Related Materials, Volume 3, Issue 10, October 1994, Pages 1227-1229, wherein a thin layer (10 nm) of carbon contaminant film found to adhere to CVD diamond films can be removed with a simple wash in isopropanol or other lower alcohol. Spectral examination of the entire dry diamond product is then used to determine what, if any, additional remediation is required: additional wash; hydrogenolysis; abrasion; combination of procedures. Hydrogenolysis is conducted in a separate apparatus such as a vacuum oven if required. Sub-surface impurities can only be removed by abrasion. Abrasive techniques are well known for CVD diamond product polishing. Available freely on-line, "*THE ELEMENT SIX CVD DIAMOND HANDBOOK*" provides extensive information on the mechanical remediation of CVD diamond.

Two types of diamond products can be produced by the present invention: a diamond disk having a fixed diameter using a diamond fabrication reactor having no additive manufacturing components; a shaped diamond product by additive manufacturing techniques within a reactor having additive manufacturing components.

Additive Manufacturing

In one embodiment, diamond fabrication by the method of this invention is inherently an additive manufacturing process. The fluence of kinetically energized diamond forming $C_1$ hydrocarbon radicals transits from the magnetic accelerator into the diamond fabrication reactor through the immobile mass delivery conduit positioned at the radial center of the diamond fabrication reactor. This radial center defines the diamond fabrication locus, the point of impact for the kinetically energized $C_1$ hydrocarbon radicals. The diamond fabrication deposition substrate is supported on a movable heated support block which is fixed upon a movable platform operatively connected to arms extending from X-Y plane positioning apparatus thus enabling repositioning of a fabrication locus at the deposition substrate relative to the location of the mass delivery conduit for each diamond fabrication event. The movable platform is supported by low friction bearings for smooth motion. Ambient conditions within the reactor are those of a vacuum. Fluid lubricants cannot be tolerated due to their potential for providing impurities to the diamond product. Solid lubricants such as graphite powders are impractical because of evacuation and inert gas addition events within the reactor. Magnetic bearings cannot be used in the presence of a magnetically susceptible fluence of kinetically energized paramagnetic hydrocarbon radicals. Extremely low friction diamond film on diamond powder bearings are commercially available but may be impractical due to cost particularly so for bearings which would require customized manufacture. A practical low friction surface is provided by ball bearings having low friction PTFE coatings. They are adequate with respect to friction and can withstand loads transmitted to them by an impact event shockwave without deformation.

Various means for effecting this motion include stepper motors actuators for micro-machined gear and screw drives and piezo electric direct drives. All of which move end effectors attached to the deposition substrate support in various multi-point arrangements. Positioning apparatus capable of vacuum and high temperature environment operation are commercially available having micrometer and even sub-micrometer motional precision as well as sub-millisecond step times. See for example, PI USA of Auburn Mass. and Pfeiffer Vacuum of Nashua N.H. Actuator control systems are commercially available for these types of mechanical positioners which can interface with computers and programmable logic controllers for which both proprietary and public domain control software is available. See, for example, The Stepper Bee Manual from PC Control Ltd (www.pc-control.co.uk).

Complex three dimensional shaped diamond products as well as the most commonly sought after 12.5 cm diameter disk can be fabricated under software control of the positioning apparatus. The fabrication of a shaped diamond product proceeds by a series of "move and deposit" events to form a first layer of a shaped diamond mass upon which a succeeding series of "move and deposit" events form a successive layer of a shaped diamond mass repeating until the ultimate three dimensional shaped diamond product is obtained. This series of events proceeds under computer software control using a least motion strategy computed for the product profile wherein the fabrication locus for a first fabrication event is as close as possible to that of a second fabrication event. Overall production time is as short as is possible, and the resolutional precision is as great as possible owing to very small positional changes by this strategy. Regardless of the material comprising an additive manufacturing product, least motion is the dominant strategy. See, for example, US 2018/0126629.

Dimensional Precision

Dimensional precision of shaped diamond products produced by the method and apparatus of this invention is an artifact of the nature of a mass of diamond forming kinetically energized $C_1$ hydrocarbon radicals within an electromagnet core. Within the electromagnet core, magnetic field strength non-linear as a gradient being strongest at the radial and axial centers of the core. The magnetically susceptible paramagnetic $C_1$ hydrocarbon radicals confined within this core populate the coil volume along the lines of these radial and axial gradients. This phenomenon influences dimensional precision at the deposition locus and, consequently, that of the shaped diamond product overall. The radial profile at the fabrication locus is that of this gradient. Hydrocarbon radical density greatest at the center. Consequently, a fabrication locus and neighboring fabrication loci may have a non-planar topology. A countermeasure should be used to remediate this phenomenon as much as possible depending upon the degree of dimensional precision required.

The most practical countermeasure is a high field strength permanent magnet deployed at the tip of the hydrocarbon radical delivery conduit within the reactor around the outer diameter of this conduit. The best choice of permanent magnet is that of Iron Nitride ($Fe_{16}N_2$, "Niron") having a magnetic field strength of 130 mega gauss oersteds as compared to the next strongest Neodymium magnets having about half that field strength. Magnets comprising Iron Nitride are commercially available in a wide variety of shapes and sizes. See, for example, U.S. Pat. Nos. 10,692,635; and 10,068,689; Niron Magnetics of Minneapolis Minn.

The force of a permanent magnet is not significant as an accelerating force accelerator. Its magnetic field attracts more magnetically susceptible paramagnetic $C_1$ hydrocarbon radicals toward the center of its magnetic field than would the magnetic field of the electromagnet. Transiting through a countermeasure permanent magnet, these magnetically susceptible radicals are strongly attracted to the magnetic field center of this circumferential magnet which is positioned as close as is practical to the fabrication locus. This provides narrower and more uniform radial distribution of $C_1$ hydrocarbon radicals impacting the deposition substrate fabrication locus.

The permanent magnet may also be used to reduce the diameter of the fluence of magnetically susceptible diamond forming kinetically energized $C_1$ hydrocarbon radicals using a conical permanent magnet. The tapered exit diameter may match that of a deposition locus precisely which may be smaller than that of the reactor conduit (the electromagnet coil core) through which the diamond forming $C_1$ hydrocarbon radicals transit from the accelerator into the diamond fabrication reactor. This can also provide a convenient alternative to changing out the accelerator electromagnet for a replacement counterpart having a smaller coil core inner diameter. This decrease in fluence area will result in an increase in the effective instantaneous pressure of an impact event because of the smaller fabrication locus area compared to that provided by the inner diameter of the electromagnet coil core. For such use, the interior of the magnet should be coated with a chemically inert material such as the electromagnet core fluoropolymer.

Figure 5:
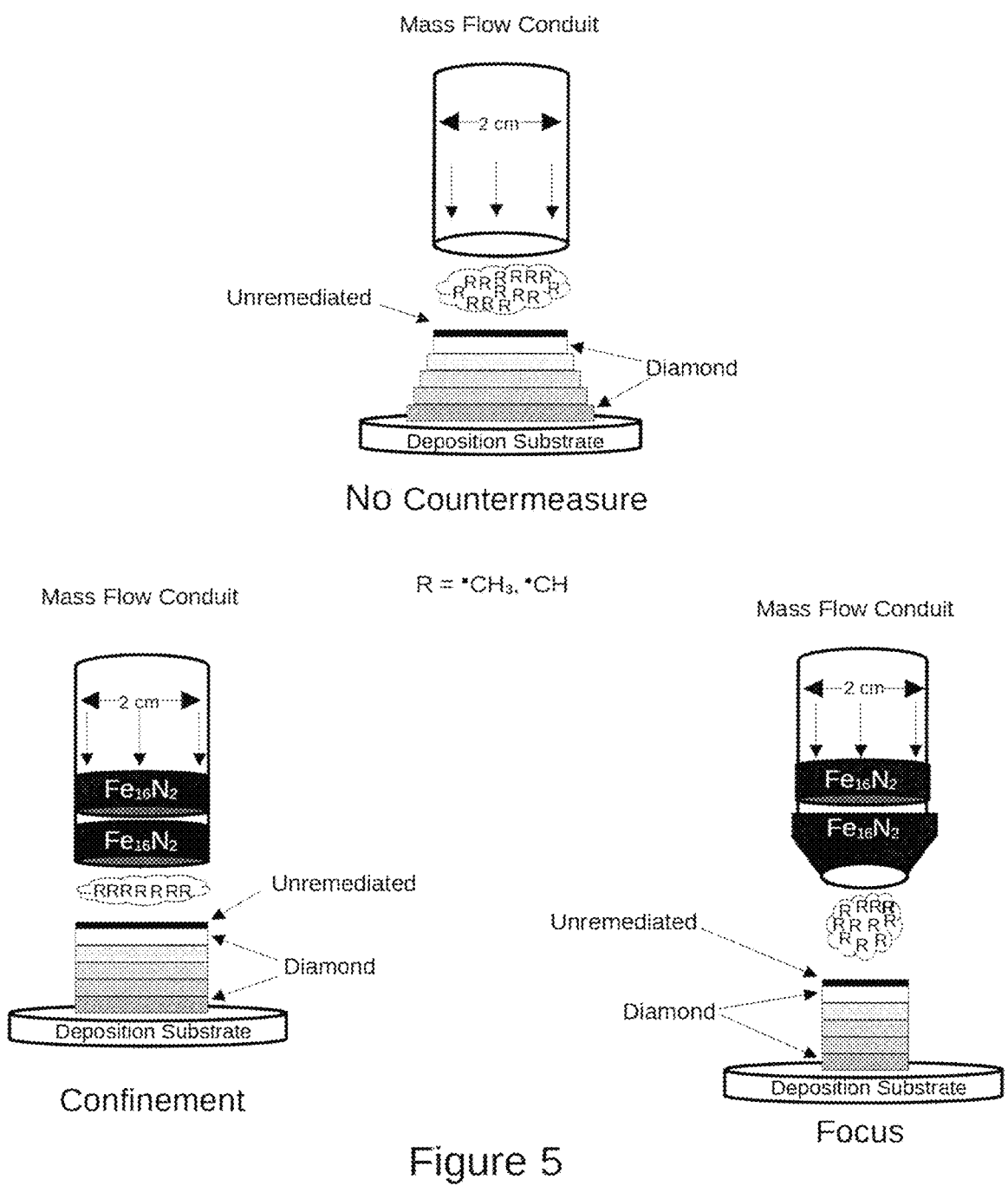
FIG. 5 shows the permanent magnet countermeasure used to 1) reduce the radical radial gradient (confine) and 2) to decrease the diameter of the fabrication locus (focus). This shows the effect of magnetic field with respect to radial distribution (none, confine, focus).

Regardless of whether the permanent magnet is used to remediate the radical particle distribution gradient or to reduce the diameter of the fluence of the diamond forming $C_1$ hydrocarbon radicals impacting the diamond forming deposition substrate, the net effect is to improve the dimensional precision capabilities of a shaped diamond product produced by the method and apparatus of this invention. FIG. 5 graphically depicts the effect of a permanent magnet countermeasure to improve dimensional precision.

Apparatus of the Invention

To understand of how the design, construction, and operation of the apparatus of this invention function to produce high purity diamond in high throughput and short production cycle times using additive manufacturing techniques, some physics is in order. The method and apparatus of this invention exploit two phenomena to achieve these ends: paramagnetism and electromagnetism.

Paramagnetism

The method and apparatus of this invention exploit the phenomenon of paramagnetism which is the magnetic susceptibility of atoms or molecules having unpaired valence electrons. Such molecular species are referred to as radicals. Magnetic susceptibility is defined by the expression as $J/B_o$ where J is the magnitude of internal polarization, $B_o$ is the strength of the external magnetic field. The magnetic susceptibility of paramagnetic species is 1. Paramagnetic species are strongly attracted to magnetic fields. Examples of paramagnetic species are hydrogen atoms, di-oxygen ($O_2$), halogen atoms and chelates of simple salts of Gd, Fe, Mn, and Cu, and organic free radicals. By contrast, atoms and molecules having no unpaired valence electrons are diamagnetic and are weakly repelled by magnetic fields. Examples of diamagnetic species are the noble gases (He, Ar, etc.), alkyl amines, saturated hydrocarbons, and water. Paramagnetic atoms and molecules are charge neutral and are not influenced by electrostatic fields as are electrons and ionic (electrically charged) atoms and molecules The paramagnetic species used for diamond fabrication by the apparatus of this invention are the methyl radical ($CH_3$) and the carbyne radical (·CH or ⫶CH) where "·" and "⫶" represent 1 or 3 unpaired electrons. The number of unpaired electrons for the carbyne radical depends upon its state of electronic or energetic excitation with the singlet state, HC, being the lower energy state and the triplet state, ⫶CH, being the higher energy state. These magnetically susceptible paramagnetic $C_1$ hydrocarbon radicals are used as the source of carbon for the fabrication of diamond by the apparatus of this invention.

Experimental results of investigations into the magnetic susceptibility of hydrocarbon radicals are disclosed in "Magnetic Properties of Free Radicals," Volume 17, H. Fisher et al. Effective magnetic moments of some paramagnetic species are found in "Magnetic Properties of Free Radicals, Landholt-Bernstein, New Series, Group II, Volume 1, Berlin: Springer 1965 and Vols. 9aa-9d2, 1965. An important finding is that the g-factor (isotropic factor) of such radical species is very close to that of the free electron which is extremely susceptible to magnetic fields, $g_e=2.0023193134$. The paramagnetic g-factor is an isotropic measurement or measurement of orderliness of a paramagnetic species within an applied magnetic field. The more highly ordered a magnetically susceptible (paramagnetic) species is within a magnetic field, the greater is the influence upon that species by the magnetic field. Application of a magnetic field to a mass of paramagnetic species results in first order Zeeman splitting or an energy difference, $\Delta E$, between aligned an unaligned magnetic dipoles which is proportional to the strength of the magnetic field. This difference is given by Boltzmann expression, $e^{-\Delta E/kT}$, where $\Delta E$ is much smaller than $kT$, the exponential is expanded as $1-\Delta E/kT$ indicating that paramagnetic susceptibility is inversely proportional to temperatures. See Figgis, B. N.; Lewis, J. (1960) "*The Magnetochemistry of Complex Compounds.*" For this reason, the apparatus of this invention operates at cryogenic temperatures to maximize the magnetic susceptibility of the diamond forming, magnetically susceptible $C_1$ hydrocarbon radicals used by the method of this invention.

The practice of providing radical species to a supported reactant surface to fabricate materials other than diamond is known as in the case of nitrogen radicals. See, for example, "Pure Germanium Nitride Formation by Atomic Nitrogen Radicals for Application to Ge metal-Insulator-Semiconductor Structures" J. Appl. Phys. 100, 01401 (2006) Issue 1. Magnetic acceleration of the nitrogen radical is not used in this process.

Magnetic Acceleration and Electromagnetism

Magnetic acceleration is a commonplace phenomenon. For example, consider the fuel injector deployed in the intake manifold of an internal combustion engine which acts as a valve to admit fuel-air mixture into the intake port of the cylinder upon which it is deployed. The fuel injector comprises an induction coil within which is the valve stem which is biased closed by spring force. The valve stem comprises a ferrous metal and is magnetically susceptible due to the phenomenon of ferromagnetism. Upon command by the engine controller (ECU), electric current is provided to the fuel injector induction coil, and the inductor stores this current as a magnetic field. The magnetic field acts on the magnetically susceptible valve stem to move it against the spring bias force to open the cylinder intake port to inlet the fuel-air mixture. Upon cessation of current flow to the fuel injector induction coil, the magnetic field collapses, and the spring force returns the valve stem to its closed position. An identical device may be deployed at the cylinder exhaust port for the exhaust manifold. Cycle times for fuel injectors can be as fast as 10 ms for non-racing internal combustion engines. In this case, the phenomenon of magnetic susceptibility is that of ferromagnetism and not paramagnetism; however, the principal is the same. A magnetically susceptible species will be moved or accelerated by the force of a magnetic field applied to that magnetically susceptible species. Similar examples are the solenoid switch or valve. Electromagnetic accelerators are known such as those described in U.S. Pat. Nos. 4,710,722 and 8,232,747 which are incorporated herein by reference in their entirety. While features of both references may be incorporated into the design of the apparatus of this invention, the apparatus of this invention accelerates paramagnetic species which are charge neutral and not susceptible to the electrostatic fields used by these two cited exemplary accelerators.

The apparatus of this invention uses an electromagnet to impart kinetic energy to magnetically susceptible paramagnetic $C_1$ hydrocarbon radicals. An electromagnet is an inductor which is a non-linear device opposing changes in current which it stores as a magnetic field. As used in the apparatus of this invention, the inductor is a hollow core coil having magnet wires wound the hollow core, and this core confines the magnetically susceptible paramagnetic $C_1$ hydrocarbon radicals within its inner diameter. At time zero, no current is applied to the inductor, but over time as current is applied, the current is stored within the inductor as a magnetic field. This magnetic field imparts a force to the magnetically susceptible paramagnetic $C_1$ hydrocarbon radicals within its core providing kinetic energy by their acceleration. This creates a fluence of kinetically energized (magnetically accelerated) $C_1$ hydrocarbon radicals which transit from the magnetic accelerator into the diamond fabrication reactor and impact the diamond forming deposition substrate where their kinetic energy is transferred to this substrate to drive the diamond forming process thereon.

The force exerted upon a magnetically susceptible mass by a hollow core electromagnet is known as its "pull strength" which is determined by an expression used by electrical engineers in the design and construction of electromagnets intended to impart motion to a mass as in the case of solenoid devices:

$$F=(n \times i)^2 \times 4\pi \times 10^{-7} \times a/2g^2)$$

F is the force in Newtons; n is the number of coils or turns in the induction coil (the electromagnet); i is the current in amperes applied to the induction coil; a is the cross-sectional area for the magnetic field; g is the magnet gap, the distance from coil to coil center; $4\pi \times 10^{-7}$ is the dimensionless magnetic constant. This expression reduces to: $F=(n \times i)^2 \times 19.7392 \times 10^{-7} \times r^2/g^2$ This expression is useful for single layer coils and multi-layer coils which provide more coils over the same coil length than can a single layer coil and exponentially greater force than does a single layer coil.

Determination of other properties of inductors for design, construction, and operation of the apparatus of this invention is necessary. The magnetic accelerator electromagnet is an inductor. Inductance is given by the formula: $L=\mu \times (N^2 \times A)/l$ where: L is the inductance in Henry's, N is the number of turns, A is the cross-sectional area of the coil (center of outer coil wire to center of opposite coil wire), l is the length of the coil, and $\mu$ is the permeability of the coil, 1 for air or vacuum.

Figure 6:
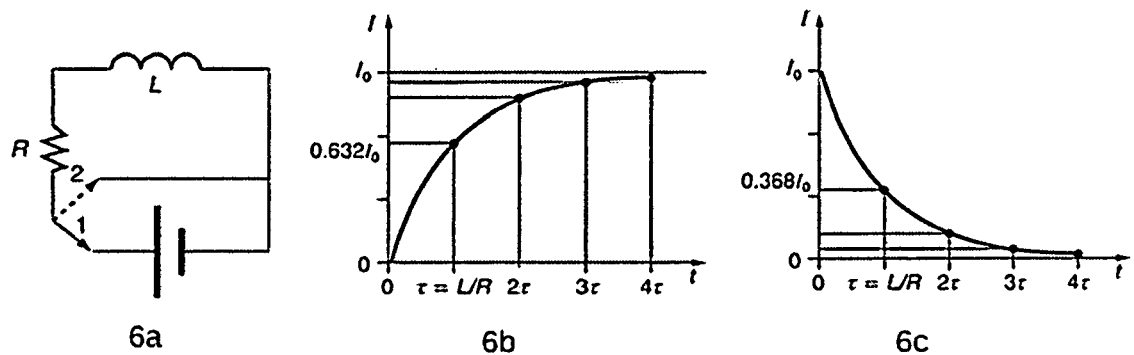
FIG. 6a shows the resistor inductor series circuit R-L circuit.
FIG. 6b shows the time constraints and rise time for charging an inductor to maximum current.
FIG. 6c shows the time constants and drain time for discharging an inductor to zero current. This profiles inductor charge and discharge.

Time constants determine the duration of time needed to charge and/or drain inductor current. Typically, the inductor is in series with a resistor, and this circuit is the well-known R-L circuit. Where R is resistance in ohms ($\Omega$) and L is inductance in Henry's (H), the expression for the time constant is $T=L/R$ where T is in seconds. A time constant is that amount of time required for the inductor to reach 0.632 of the current (I, in Amperes) applied to the inductor. To charge the inductor to ~100% current or to drain the inductor of its current (0%) requires 5 time constants, and this is referred to as "rise time" of the inductor. For example, an inductor having an inductance of 0.001 Henry's in series with a $10^6 \Omega$ resistor will have a charge/drain time $0.005/10^6$ seconds: 5 nanoseconds. This becomes important in design of emergency shut down in the event of cooling failure to prevent damage to an energized electromagnet as well as for initial energization. FIG. 6 provides a graphical representation of an inductor R-L circuit and charge and discharge times and time constants for an inductor in an R-L circuit.

Determination of magnetic field strengths may also be necessary. As Disclosed above, the magnetic field of an inductor (an electromagnet) is greatest at the coil center (R=0) decreasing with increasing radius. Axial magnetic field strength is greatest at the axial center of the coil and decreasing along the coil z-axis. These values are obtained by expressions derived from the Biot-Savat Laws. Radial field strength is given by the expression: $B_r=\mu_o \times I/2R$ where: $B_r$ is the magnetic field strength at a point on the axis, R is the coil radius (from center of diameter of upper coil wire through coil to center of bottom coil wire diameter, in meters), $\mu_o=4\pi \times 10^{-7}$ T×m/A where m is meters, A is area of coil, I is the current in amperes, T is in Tesla. Earth's magnetic field is ~0.5 Gauss or $5 \times 10^{-5}$ Tesla. The expression for axial magnetic field strength is $B_z=(u_o/\pi) \times (R/Z^2=R^2)^{3/2}$ where: $B_z$ is the axial magnetic field strength at a point along the z-axis (length) of the coil from the coil center, Z, is in meters and, $u_o$ and R are as defined above. These expressions apply for the magnetic fields of permanent magnets as well.

Electromagnet

HPHT diamond fabrication pressures range from ~750.00 psi. to ~1.5 million psi. The apparatus of this invention can provide such pressures as the effective instantaneous pressures produced at a $C_1$ hydrocarbon radical impact event, the shock wave, at a diamond fabrication deposition substrate. This pressure is an artifact of the inner diameter of the electromagnet core which is that of the diamond fabrication locus. locus. The expression P=F/A, where P is the pressure, F is the electromagnet force; and A is core area provides this pressure.

Tables 1 and 2 show non-limiting examples for current levels required to produce magnetic force which can provide the effective instantaneous pressures required for diamond fabrication by the method of this invention. The exemplary electromagnets comprise heavily enameled magnet wire wound about a hollow core whose inner diameter is the path of confinement for the magnetically susceptible paramagnetic $C_1$ hydrocarbon radicals resident therein. Force is in Newtons, and pressures (effective instantaneous pressures) are given in $N/m^2$ and psi, 1 psi=6895 $N/m^2$. Both coils comprise 200 turns×200 layers of magnet wire. Coil core walls are 0.5 cm thick. Coil inner diameters and coil gaps are 2 cm and 3.0 cm for coil 1 and 6.25 cm and 6.35 cm for coil 2. Coil 1 comprises 1.0 mm diameter heavily enameled copper magnet wire (MWS Wire Industries, Oxnard Calif.), and coil 2 comprises 1.0 mm diameter superconducting MgB2 magnet wire (Hypter Tech Research, Columbus Ohio). Calculated values are rounded to the nearest integer. Physical dimensions and wire weight and length for these electromagnet coils are show in Table 3. Copper density is 8.96 g/cm³, and $MgB_2$ is 2.56 g/cm³ but taken as 2.6 g/cm³ due to cladding intermingled with the superconducting filaments for the article of commerce.

TABLE 1

| AMPERES | Force (N) | Pressure (N/m2) | Pressure (psi) |
|---|---|---|---|
| 10 | 315,827 | 1,005,30,654 | 145,802 |
| 20 | 1,263,309 | 4,021,237,440 | 583,211 |
| 30 | 2,842,446 | 9,047,786,844 | 1,312,224 |
| 40 | 5,053,237 | 16,084,952,943 | 2,332,843 |

TABLE 2

| AMPERES | Force (N) | Pressure (N/m2) | Pressure (psi) |
|---|---|---|---|
| 100 | 31,582,734 | 2,573,592,695 | 373,255 |
| 125 | 49,348,022 | 4,021,238 596 | 583,210 |

TABLE 2-continued

| AMPERES | Force (N) | Pressure (N/m2) | Pressure (psi) |
|---|---|---|---|
| 150 | 71,061,152 | 5,790,583,605 | 839,824 |
| 200 | 126,330,936 | 10,294,370,580 | 1,493,020 |

Magnetic accelerators comprising the small and large core electromagnets of these examples for the apparatus of this invention can provide paramagnetic $C_1$ hydrocarbon radicals very large kinetic energy. Upon impact upon a diamond fabrication deposition substrate by these kinetically energized radicals, the release or transfer of this kinetic energy is more than sufficient to place the diamond forming process within the domain which favors diamond over graphite.

Table 3 shows the physical dimensions of the two electromagnet coils and the wire length and weight. Figures are rounded up to the nearest integer.

TABLE 3

| Coil | Length cm | Diameter cm | Surface Area* cm² | Volume cm³ | Wire Length m | Wire Weight kg |
|---|---|---|---|---|---|---|
| 1 (Cu) | 20 | 43 | 5606/2702 | 29044 | 28903 | 202 |
| 2 (MgB,) | 20 | 53.5 | 7858/3362 | 44960 | 42097 | 85 |

(*total/axial)

Room temperature operation of these exemplary electromagnets is impractical if not impossible. The large diameter magnet wires capable of carrying such currents at 25° C. due to their size and weight would make these electromagnets massive and heavy. Small gauge magnet wires carrying such currents would be pulverized due to the heat of their electrical resistance at room temperatures. See, for example, NBS Monograph 109, "Investigations of the Exploding Wire Process as a Source for High Temperature Studies." Small gauge copper magnet wires can carry large currents at liquid nitrogen temperatures adequately for the lower current levels detailed for Coil 1 (≤50 Amperes).

The resistivity of copper wire at cryogenic temperatures has been determined experimentally to be about $10^{-6}$ Ω/meter at ~77° K. See, for example NBS Technical Note 365, "Survey of Electrical Resistivity of 16 Pure Metals in the Temperature Range of 0 to 273° K." At the maximum constant current used for fabrication of a graphite free diamond product, 40 amperes, the heat dissipation due to electrical resistance which is ~0.01 ohm will be ~46 watts per second at ~77° K, well within heat dissipation specifications for commercially available closed loop liquid nitrogen refrigerant management systems suitable for low refrigerant inventory cryostats.

Guidelines for superconducting magnets used for magnetic resonance imaging show that it is common practice to use electromagnet coils containing several hundred layers which allows for significant reduction in the overall length of the electromagnet. Such electromagnet cores are large enough to surround a person. The following table shows the critical temperatures (Tc) ° K, critical currents (Jc) in Amperes/mm², and critical magnetic field strengths (Hc) in Tesla for superconducting wires as provided by their manufacturers. Critical currents are as measured for a given magnetic field strength in Tesla.

TABLE 4

Superconducting Wire Properties

| Alloy | $T_c$ | $J_c$ | $H_c$ | Supplier |
|---|---|---|---|---|
| NbTi | 10 | 2300 (9T) | 15 | Supercon |
| Nb$_3$Sn | 18 | 2450 (12T) | 30 | Supercon |
| Nb$_3$Al | 18.7 | 86 × 10$^6$ (12T) | 32.4 | American Elements |
| MgB$_2$ | 39 | 1.3 × 10$^8$ (10T) | 74 | Hyper Tech Research |

See, for example, Parizh et al. Supercond. Sci. Technol. 2017, January; 30(1): 0144007 "Conductors for commercial MRI magnets beyond NbTi: requirements and challenges" (doi: 10.108/0953 2048/30/1/014007). Superconducting magnet wires have no electrical resistance operating below their critical temperatures, critical currents, and critical magnetic field strengths. Their electromagnets are better suited for the large core electromagnet of Table 2 than are their copper magnet wire counterparts at ~77° K for which these large currents are impractical.

Apparatus

The apparatus of the present invention comprises four primary components requiring services by several ancillary systems, all of which are commercially available and can be interfaced with and controlled by a main computer running sense and control software dedicated to the method and apparatus of this invention. The primary components are 1) a $C_1$ hydrocarbon radical generator (generator); 2) an interface component deployed between the generator and a magnetic accelerator (interface); 30 magnetic accelerator (accelerator); 4) a diamond fabrication reactor (reactor).

There are four operational profiles for the primary components: emulation; fabrication; routine shut down; "scram" or emergency shutdown. Emulation is used to start up and prepare the entire apparatus for a fabrication profile. It evacuates and purges the entire apparatus and uses only carrier gas for the series of events comprising fabrication to ensure proper operation of all components and ancillary systems prior to fabrication. The fabrication profile comprises the foreground processes of $C_1$ hydrocarbon radical generation and radiolysis cavity flush by burst gas to drive the transit of the mass of diamond formers within the mass flow conduit path through the interface component and the accelerator into the reactor for the fabrication event, a remediation event, and evacuation of the reactor for a subsequent fabrication event or end of run shutdown. During reactor evacuation, the longest event for the fabrication profile, background tasks are performed such as mass flow path and radiolysis cavity evacuation as well as fabrication substrate repositioning where additive manufacturing is used. The routine shut down profile evacuates the apparatus, drains electromagnet current using a load resistor-capacitor circuit to reduce stress on electromagnet coils, brings all components of the apparatus to near ambient temperatures slowly to prevent seal compromise, purges the entire apparatus with a chemically inert gas other than helium (nitrogen, argon; carbon dioxide), and powers down all power supplies. Emergency shut down ("scram") parallels the routine shut down but uses only a large load resistor for rapid drain of current from accelerator electromagnets. For both routine shut down and scram, refrigerants are cautiously returned to their respective reservoirs from cryostats and heat exchangers.

Hydrocarbon Radical Generator

Generation of $C_1$ hydrocarbon radicals from their respective hydrocarbon sources by a variety of methods are well known. All of these methods involve subjecting a hydrocarbon to a source of high energy sufficient to break carbon-carbon or carbon-hydrogen bonds to provide the $C_1$ hydrocarbon radical.

Experimentally derived bond dissociation energies of hydrocarbons and formation enthalpy of hydrocarbons are found at (https://labs.chem.ucsb.ed, Zakarian and Armen, 11—bonddissociationenergy.pdf); N.I.S.T. Chemistry Web Book SRD 69) which provide the following experimentally derived bond dissociation energies and enthalpy of formation data: C1 hydrocarbon methane C—H bond dissociation energy: ~337.2 Kj/mol (~81 Kcal/mol, 94.2 watt hours); acetylene enthalpy of formation: ~226.73 Kj/mol (~54 Kcal/mol, ~63 watt hours).

Microwave radiolysis is a well-known method for producing hydrocarbon radicals, and microwave radiolysis reactors are well known as chemical process apparatus. An exemplary microwave reactor and its operation with hydrocarbons is well detailed in NASA Technical Paper, 2301, April, 1984, "Homogeneous Reactions of Hydrocarbons, Silane, and Chlorosilanes on Radiofrequency Plasmas at Low Pressures."

Methyl radical generation from methane is well known. See, for example, Mccarthy, R. L., et al., "Chemical Synthesis from Free Radicals Produced in Microwave Fields," J. Chem. Phys. 22(8): 1360-1365 (1954). The methyl radical is the most commonly used form of diamond forming carbon for CVD diamond fabrication processes, and microwave radiolysis of methane is the most commonly used means to obtain the methyl radical for this purpose. See, for example, and U.S. Pat. Nos. 10,707,062, 5,954,882, and 4,767,608. Other methods for obtaining the methyl radical from methane include hot filament, short wave UV photolysis, and electron beam radiation. For the apparatus of this invention, microwave radiolysis of methane is the preferred method for methyl radical generation.

Carbyne (methylidyne) radical generation from acetylene by microwave radiolysis is known. See, for example, K. H. Becker et al., Chem. Phys. Lett. Vol. 71 no. 2 (Apr. 15, 1980) and R. Engeln et al, Chem Phys. Lett. 310 (199) 405-410.

Conventional CVD diamond fabrication methods typically use methane as the hydrocarbon source for producing methyl radicals for their initial source of diamond forming carbon by microwave radiolysis using a magnetron power source at 2.45 Ghz and energy levels of 1-6 Kw and even greater. Methane is typically diluted in a hydrogen carrier gas. Hydrogen plasma is disclosed to form under these conditions and to participate in the mechanism of carbon-hydrogen bond cleavage to form the methyl radical under these conditions. Hydrogen is essential to conventional CVD diamond fabrication processes for remediation of non-diamond carbon species co-products as a plasma or as molecular hydrogen.

The method of this invention uses a mixture of a $C_1$ hydrocarbon diluted in a carrier gas to obtain the paramagnetic $C_1$ hydrocarbon radical (methyl or carbyne) radiolytically using microwave energy at 2.45 Ghz similar to conditions common for conventional CVD diamond fabrication processes. However, the method of this invention uses an inert carrier gas, helium. Helium is disclosed to form a plasma when subjected to microwave energy at 2.45 Ghz, but the energy required is lower, 850 watts. See, for example, Gulec et a., IEEE TRANSACTIONS ON PLASMA SCIENCE, VOL. 43, NO. 3, MARCH 2015.

Exploiting the phenomenon of plasma interaction with methane under microwave radiolysis conditions which produce helium plasma, the present invention may use a lower power level for the radiolysis of methane ranging from 0.800 to 6 Kw of magnetron power at 2.45 Ghz. The present invention subjects acetylene diluted in a helium carrier gas to a microwave discharge at 2.45 Ghz at 0.800-6 Kw of magnetron power.

Above-cited Literature values for stop-flow and continuous flow measurements of radiolysis reactions using helium plasma disclose complete helium plasma formation in single digit microsecond times for a 1 cm diameter radiolysis cavity at atmospheric pressure and 850 watts. Studies of $C_1$ hydrocarbon and $C_2$ hydrocarbon radiolysis in helium and argon disclose radiolysis product formation in dynamic systems at low power (~100 watts) and at ~1.5 torr having radiolysis periods of ~10 ms and 100% dissociation with increasing pressures. Extrapolating from these literature values, a radiolysis period of ~50 ms is used for the present invention. See, for example, Bull. Inst. Chem. Res., Kyoto Univ. Vol 49, No. 4, 1971.

At the end of this radiolysis period, helium "burst" gas is provided to the radiolysis cavity to flush the radiolysis product from the radiolysis cavity into a heat exchanger immediately downstream of the radiolysis reaction chamber. Radiolysis power continues during this reactor flush event (~10-40 ms). Thus, a mixture of $C_1$ hydrocarbon radical radiolysis product, some helium plasma, and atomic helium is present within the heat exchanger for every radiolysis reaction event.

Radiolysis Reactor

Figure 7:
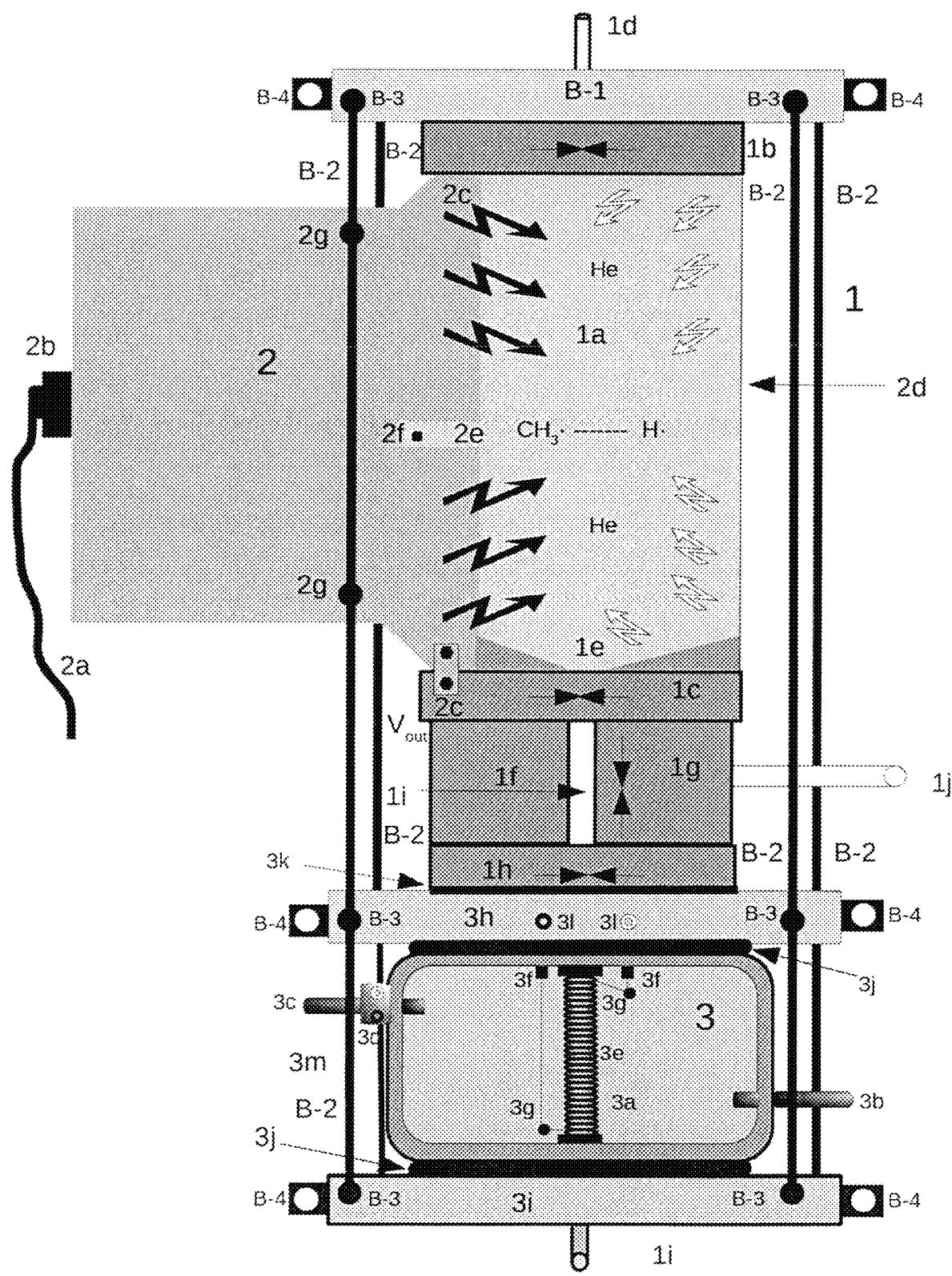
FIG. 7 depicts a non-limiting example of the radiolysis generator of the present invention.

FIG. 7 shows the radiolysis reactor itself exclusive of the other components. The radiolysis reactor comprises radiolysis reaction chamber 1, high power microwave wave guide 2, and heat exchanger 3 as well as means for mechanical attachment of these components and means to connect the assembled to a support (not shown).

Referring to FIG. 7, radiolysis reactor 1 comprises a radiolysis reaction chamber, microwave power delivery wave guide 2, and output heat exchanger 3. The radiolysis reaction chamber or radiolysis cavity component of reactor 1 comprises cylinder 1a having input and output valves 1b and 1c deployed at it axial ends. Input valve 1b receives hydrocarbon source gases, methane and acetylene, and helium carrier gas from a gas management system (not shown) through conduit 1d at the input of valve 1b. The output side of cavity 1a tapers at 1e to provide low-to-no drag and turbulence to the flow radiolysis products formed within and transiting from cavity 1a and through output valve 1c. Support block 1f and dump valve 1g deployed between isolation valve 1h and output valve 1c define a conduit 1i through which the mass of radiolysis products formed within 1a transit from 1a through 1h into output heat exchanger 3. Valves 1b, 1c, 1g and 1h are normally closed gate valves receiving actuation power from a valve controller (not shown). The gates valves 1b, 1c, and 1h are transverse the their mass flows, and the gate of valve 1g is parallel to these mass-flows and does not "throttle" these flows being used for evacuation of some components of the apparatus as well as the entire apparatus during shut down procedures. Conduit 1j of dump valve 1g is connected to a vacuum line and a dump tank also used for shut down procedures.

Wave guide 2 provides microwave energy to radiolysis reaction chamber 1a from a magnetron amplifier (not shown) through coaxial power cable 2a connected to wave guide 2 at connection point 2b. The mouth of waveguide 2 conforms to the curvature of the radiolysis reaction chamber cylinder as shown at 2c. Deployed around radiolysis reaction chamber 1a is microwave reflecting metal foil 2d (Al, Cu, Au, Ni) which is secured to 1a and to high power microwave wave guide 2 by a foil tab 2e extending from microwave reflector 2d to attachment nub 2f.

Output heat exchanger 3 comprises, an evacuated dual wall chamber, a Dewar, 3a has through wall sealed refrigerant conduits 3b, input, and integrated temperature and flow sensing output conduit 3c (seals not shown) for circulation of a refrigerant such as R-14 ($CF_4$ –50-0° K) provided by a refrigerant management system (not shown). Terminals 3d of conduit 3a provide means for data line connection to this system. Electromagnet 3e is connected to power posts 3f by leads 3g extending to these posts from first and last coil windings of 3e. Heat exchanger 3 is deployed between support input side support block 3h and output side support block 3i having fluid and vacuum tight seals 3j deployed between 3 and blocks 3g and 3h. A fluid and vacuum tight seal 3k extends between 3h valve 1h. Channels within block 3h accommodate leads extending from power posts 3f to power terminals 3l deployed for receiving power from an electromagnet power supply (not shown). Mass flow conduit 1i extends from valve 1h through seals 3k, 3j, block 3h, electromagnet 3e core, seal 3j of 3i, and 3i for delivery of radiolysis products of 1a to downstream components of the present apparatus.

A frame comprising top block B-1, bars B-2, and provides means to assemble components 1, 2, and, 3h and 3i provides means for assembling components 1-3 and for attaching this assembly to a support frame (not shown). Wave guide 2 is attached to and supported by B-1 at attachment points 2g. Bars B-2 connect to B-1, 3h, and 3i at points B-3 The entire assembly can be attached to a support frame (not shown) at bolt points B-4

The radiolysis cavity is comprised of chemically and thermally stable materials transparent to microwave radiation. Some chemically and thermally stable materials which are transparent to microwave radiation are boron nitride, alumina, fused quartz and fluorocarbon polymers, for example. Microwave radiolysis reactions can reach temperatures of 400° C. or even higher. Fluorocarbon polymers may be used with efficient cooling means (m.p. ~350° C.), but quartz is preferred because it is readily fabricated by glass blowers using a hydrogen flame torch heat source allowing for inexpensive reactor fabrication. Quartz can withstand high pressures at elevated temperatures. Heavy wall quartz cylinders are commercially available in a large variety of diameters. See, for example Glass Dynamics, Millville N.J.

This cylinder is sealed by an axially opposed pair of normally closed reciprocating gate valves for inlet of the source hydrocarbon diluted in He carrier gas and outlet of the radiolysis product paramagnetic $C_1$ hydrocarbon radicals diluted in He carrier gas. All valves must have rapid actuation times. Gate elements and valve bodies for such valves must comprise chemically and thermally stable materials, and the gate elements themselves must retract completely when open to provide no drag or turbulence to the mass flow through these valves. Solenoid valves having these properties as well as high reliability and repeatability having actuation speeds of ~10 ms are commercially available. See, for example, Clippard of Cincincatti Ohio or iPolymer of Irvine Calif.

In a non-limiting example of the radiolysis cavity of the present invention, microwave power is supplied to the radiolysis cavity from a magnetron amplifier by a waveguide antenna connected to the output of the magnetron amplifier through a high power, low loss coaxial cable. The wavelength of a 2.45 Ghz microwave is 12.24 cm. The dimensions of the wave guide determine its operating frequency range: high, low, and cut-off (the frequency limits for efficient microwave propagation). From the antenna art, the expressions for determining low frequency fl high frequency fh and cutoff frequency fc are given by the expressions: fc=C/2w and fh=1.89 fc; fl=1.25 fc in where w is the width of the rectangle in meters and C is the speed of light in a vacuum. Accordingly, a rectangular dimension of 10 cm for the microwave power wave guide used with the radiolysis cavity of the apparatus of this invention provides an operating range of 1.9-2.8 Ghz with a cutoff frequency of 1.5 Ghz. The frequency band defined by fl and fh provides the most efficient microwave power propagation. Accordingly, the interior dimensions of this cylinder should be ~10 cm in length with a practical interior diameter of ~5 cm to provide a working volume of the radiolysis cavity of ~785 cm$^3$ which is defined by valves input and output valves 1$b$ and 1$c$.

Within the wave guide passband (fl→fh) microwave energy propagates with highest efficiency, but some loss inevitably occurs. Typical commercially available wave guide and wave guide components are rated at 80-85% propagation efficiency. Because the microwave power delivered to the radiolysis cavity will be less than the output rating of the magnetron amplifier, it is necessary to operate the amplifier at a power level adjusted for the efficiency of the wave guide used. Microwave power meters suitable for such measurements are available from the same commercial suppliers for wave guides and amplifiers.

The preferred attachment of the wave guide to the radiolysis cavity is by a wave guide whose mouth conforms to the curvature of the radiolysis reactor cylinder. Alternatively, the quartz cylinder may be flattened on one side of the axial length at the time of manufacture such that the width of this flattened area corresponds to a linear wave guide antenna mouth. A microwave reflecting metal foil (Cu, Al, Au, Ag, Ni) extends around the radiolysis cavity from the wave guide-radiolys cavity junction. It is also possible to extend the microwave reflecting metal foil encircling the radiolysis reactor beyond the juncture of the waveguide mouth at the radiolysis reactor for the highest radiolysis efficiency. Forced air cooling of the radiolysis reactor, its valves, and the wave guide, should be used. The diameter of the radiolysis cavity provides a safe measure of mechanical strength and an adequate area for forced air cooling heat exchange. A smaller diameter would provide a smaller heat exchange surface area and a less practical working volume for the radiolysis cavity. At ~400° C., a 1% by volume mixture of 0.001 mol of a source hydrocarbon (methane or acetylene) diluted in helium gas provides an internal pressure to the radiolysis cavity of ~50 psi over atmospheric pressure.

The output end of the radiolysis cavity should taper to the diameter of mass flow conduit 1$i$ through which the $C_1$ hydrocarbon radicals (radiolysis product) blended with helium carrier gas exit into the heat exchanger and transit through the interface component into the magnetic accelerator. A taper provides the least drag and turbulence to the mass of C1 hydrocarbon radicals and helium carrier gas transiting from the radiolysis reactor into the heat exchanger.

Radiolysis Reactor Output Heat Exchanger

The product of the radiolysis reactor is very hot, but the ultimate destination of that product operates at 77° K in one embodiment or at superconducting temperatures below 39° K in another embodiment. The overall temperature differential of the apparatus of this invention exceeds that which any one type of O-ring seal material can tolerate. Seal compromise due to an excessive temperature differential will result in refrigerant leaks which can have catastrophic consequences. This heat exchanger provides the greatest amount of heat dissipation for the present invention using PTFE O-ring seals which can withstand the large temperature differential between that of the radiolysis reactor and the refrigerant range of about −50° C. to 0° C. for this radiolysis reactor product heat exchanger. PTFE O-ring seals have safe seal specifications ranging from 60 to 535° K, but these are operating temperatures NOT temperature differential ranges. The heat of the diamond forming mass of the radiolysis cavity must be dissipated incrementally for this reason. The inner diameter of the surrounding refrigerant chamber is ~12 cm providing about 1 liter of circulating heat exchange refrigerant for about 1250 watts/second of heat dissipation using closed loop circulating liquid R-14 refrigerant at 0 to −50° C. Other refrigerants may be used provided they are not electrically conductive. This heat exchanger can reduce the temperature of the C1 hydrocarbon radical mass transiting through it to −10 to 0° C.

Paramagnetic $C_1$ hydrocarbon radicals transiting from the radiolysis cavity are in an electronically excited state not conducive to chemical bond formation. The helium burst gas flush of the radiolysis cavity occurs with continuing microwave power thus providing additional helium plasma which can maintain this excited state for these $C_1$ hydrocarbon radicals by plasma-radical energy transfer. This mass of helium plasma will be several orders of magnitude greater than that of the paramagnetic $C_1$ hydrocarbon radicals. Both helium plasma and the magnetic field ensure, as much as possible, that little, if any, radical recoupling occurs within the transit volume between the radiolysis cavity the heat exchanger. However, this excited state relaxes rapidly, particularly with cooling provided by the output heat exchanger.

Deployed within this heat exchanger is an electromagnet comprising heavily enameled copper magnet wire wound about a core which is the conduit through which radiolysis reactor product paramagnetic $C_1$ hydrocarbon radicals diluted in helium carrier gas transit. A non-limiting exemplary electromagnet for this purpose may comprise 100 layers of 100 turns of 1 mm enameled copper magnet wire wound about the core providing electromagnet internal dimensions of 10 cm width×22 cm length. Small gauge magnet wires can accommodate currents of 5-10 amperes at the refrigerant temperatures of this heat exchanger safely.

The magnetic field produced by this electromagnet provides some degree of countermeasure to radical recoupling. Unpaired valence electrons of the paramagnetic $C_1$ hydrocarbon radicals will couple to and align with the magnetic field of this electromagnet making these valence electrons unavailable for chemical bonding which recoupling products would otherwise condense at the cryogenic temperatures of downstream components thus hindering mass flow in all components of the apparatus of this invention, preventing diamond formation, and causing damage to the apparatus. $C_1$ hydrocarbon radical coupling to a magnetic field provides a countermeasure to these reactions.

The range of current provided to this electromagnet generates between ~5000 and ~19700 Newtons of magnetic force functioning as a secondary magnetic accelerator resulting in transit times into the primary magnetic accelerator within the low nanosecond range for a mass of $C_1$ hydrocarbon radicals of ~1 millimole. Unlike the diffusive propagation of the $C_1$ hydrocarbon radicals to the site of diamond formation in conventional CVD diamond fabrication processes, the propagation of $C_1$ hydrocarbon radicals of the present invention to the site of diamond formation is driven by magnetic force.

Some radical recombination is inevitable despite the countermeasures take. This secondary magnetic accelerator provides the paramagnetic $C_1$ hydrocarbon radicals a high velocity which "outruns" the kinetics of radical recombination and separate these paramagnetic species from the diamagnetic recoupling products which are weakly repelled by magnetic fields and force. Thus, it is possible to separate diamond forming $C_1$ hydrocarbon radicals from diamagnetic side product hydrocarbons due to their un-accelerated slower transit times and fast actuation times of an isolation valve deployed at the input of the diamond fabrication reactor. The result is that diamagnetic side products provide little, if any interference, to the diamond fabrication event and can be removed from the apparatus by evacuation.

Microwave Power Source and Delivery

The microwave power source and delivery system comprises a power amplifier such as a magnetron amplifier capable of delivering 0.50-6 Kw of microwave power at 2.45 Ghz, power levels and frequencies which are typical of conventional diamond fabrication processes using methyl radicals as the source of diamond forming carbon produced by microwave radiolysis at methane at the input of a diamond fabrication reactor. Magnetron amplifiers capable of such power and frequencies are commercially available as "off the shelf" products which can be interfaced with and managed by computers and programmable logic devices. Its power output is delivered to the radiolysis cavity through the wave guide as shown in FIG. 7.

The power amplifier preferred for the apparatus of this invention does not provide microwave radiolysis power to the microwave radiolysis reactor continuously. Rather, the microwave power amplifier has a duty cycle. Microwave power is provided on demand. Continuous power operation would produce excessive heat for the radiolysis reactor. Within this duty cycle, the microwave power may be provided as a continuous wave or as a series of pulses of width and delay optimized by the user.

This duty cycle places requirements on the type of microwave power amplifier used by the method and apparatus of this invention. The amplifier must have a rapid rise time (time from zero to 100% power). In pulsed mode operation, the delay between pulses should be as short as possible and be very small compared to the width of the pulse. Commercially available microwave power amplifiers which can be remotely controlled having <50 nanoseconds rise times, pulse widths up to 400 microseconds, and pulse delays of about 80 nanoseconds are commercially available. See, for example, IFI (Instruments for Industry; Ametek; Edison N.J.) PT-42 capable of up to 8 Kw at 4 Ghz. Such amplifiers are readily interfaced with programmable logic controllers and computers having RS-422, USB, and ethernet communications capabilities. The preferred microwave power source configuration for the apparatus of this invention is a "slave" power amplifier and a separate pre-amplifier controller commanded by main computer sense using control software to operate the amplifier according to a pre-set profile uploaded into the amplifier controller firmware. For this controller there are three profiles: $C_1$ hydrocarbon generation and emulation for start-up. This component can also generate hydrogen plasma for fabrication locus remediation by radiolysis of neat molecular hydrogen as an event separate from $C_1$ hydrocarbon generation where a fabrication reactor which is designed for such service is used.

If a shut down or scram occurs, no command is sent to the amplifier controller from main computer sense and control software. Without a power demand command from main computer sense and control software, power delivery to the radiolysis reaction chamber does not occur. An end of run shut down instruction by main computer sense and control software causes complete shut down of the microwave power amplifier for safety sake.

As previously disclosed, microwave energy is delivered to the radiolysis cavity by a high power capable rectangular wave guide which provides efficient microwave energy propagation with an interior dimension of 10 mm for a practical band pass of 1.9-2.8 Ghz and a cutoff frequency of 1.5 Ghz 1. Low loss, flexible coaxial cables suitable for delivery of microwave energy from the microwave power amplifier through the wave guide to the apparatus of this invention are commercially available from the same suppliers of microwave power system components with which they are used.

The hydrocarbon generator requires ancillary systems over and above its microwave power supply system. These systems required for the hydrocarbon radical generator provide service to the other components of the apparatus of this invention. They include a gas management system, a valve control system, a refrigerant managements system, a forced air cooling system for the radiolysis reactor, and a bi-directional communication means between the main sense and control computer and these components.

Forced Air Cooling

Microwave radiolysis of $C_1$ hydrocarbon s produces significant heat requiring external cooling of the radiolysis cavity and its valves along with cooling of the wave guide for safe and reliable operation. For this purpose a high capacity variable speed fan controlled by a temperature sensing motor controller is used. An infrared temperature sensor is preferred, and programmable logic controllers capable of computer control and network connection for this service are commercially available which can have programmable firmware for semi-independent operation. The critical cooling service is that of the radiolysis cavity gate valves. Quartz softens at ~1300° C. far beyond any temperatures reached during fabrication service. Metal and ceramic wave guides carrying several KW of microwave energy are thermally robust but require some forced air cooling for safety sake. PTFE gate valves are specified for operation at maximum temperatures of ~250° C. While ceramic gates themselves can withstand very high temperatures, their actuators are rated for about 300° C.

Interface Component

A component must be deployed between the output of the radiolysis reactor heat exchanger and the magnetic accelerator inputs for three purposes: temperature differential reduction, radical recombination countermeasure, and means for provision of additional cooled carrier gas to the magnetic accelerator input.

Temperature Differential

The temperature of the mass of paramagnetic $C_1$ hydrocarbon radicals transiting from the radiolysis reaction chamber heat exchanger is taken as 273° K as a practical matter, but the magnetic accelerator into which this mass will transit operates at about 77° K in one embodiment and below 39° K in another embodiment. The temperature differential between that of the $C_1$ hydrocarbon mass within the carrier gas exiting the radiolysis reactor heat exchanger (~273° K) and these magnetic accelerator inputs, ~1.96° K in one embodiment and ~234° K or more in another embodiment, poses a risk of refrigerant seal compromise for the magnetic accelerator despite their small masses and electromagnet core contact times.

Indium seals are used for the very low temperatures of superconductivity, and PTFE O-ring seals are adequate for operation at temperatures below those of liquid nitrogen refrigerants. Both indium and PTFE O-ring seals can be cycled between cryogenic and ambient temperatures numerous times without performance degradation. This cycling is performed incrementally before these seals are returned to their customary operating temperatures. Reliable seal performance at cryogenic temperatures is not an issue as long as the temperature differential at these cryogenic operational temperatures is within a tolerable range. The task of the interface component of the present invention is to reduce this temperature differential to safe and tolerable temperature differential range for magnetic accelerator refrigerant seals.

The interface component of the present apparatus provides a single stage of heat exchange cooling for mass delivery to a magnetic accelerator operating at about 77° K. F. or a superconducting magnetic accelerator at ~5-38° K, the interface component of the present apparatus provides two stages of heat exchange cooling. The single stage or first of two stages of cooling is provided by a circulating liquid nitrogen refrigerant provided by the refrigerant management system. Where 2 stages of cooling are required, a single component comprising two cooling stages in tandem is used with the second stage cooling provided by the refrigerant management system being helium gas at about 5 to 38° K. Refrigerant management systems which are capable of such performance are commercially available and can be interfaced with programmable logic controllers and computers for management of this equipment by main computer sense and control software.

Radical Recombination

As previously disclosed, the radiolysis reaction chamber output heat exchanger provides both heat dissipation and the two-fold function of the magnetic field and force produced by the electromagnet deployed within this heat exchanger: acceleration and a countermeasure against radical recombination. The magnetic acceleration provided by this electromagnet to the mass of paramagnetic $C_1$ hydrocarbon radicals diluted in helium gas results in a rapid transit time for this mass from this heat exchanger through the interface component and into the magnetic accelerator input. Helium, however, is diamagnetic and not accelerated by a magnetic field. A benefit of the dilution of the mass of paramagnetic $C_1$ radicals in an inert carrier gas such as helium is that the probability of collisions between any two C1 hydrocarbon radicals decreases due to the greater particle distribution of the reactive radical species. Accordingly, the interface component of the present apparatus provides additional helium carrier gas at the input of the interface component of the present apparatus.

The kinetics of radical recombination of the methyl radical have been experimentally determined. See, for example, Cody et al. J. Phys. Chem. A, 2002, June 27; 206. (25) 6060-6067. Similarly, experimentally derived rates for various CH radical coupling reactions are available. See, for example, Ribiero, J. Florida State University Nov. 7, 2016 "Kinetics and Reaction Mechanisms for Methylidyne Radical Reactions with Small Hydrocarbons." The conditions under which these observations were made differ from those of the method and apparatus of the present invention in pressures, temperatures, and reactor volumes designed to simulate astrophysical conditions. Unlike the dynamic operation of the present method and apparatus, the experimental conditions described in these studies are essentially static. What this data reveals that is pertinent to the present invention is that this phenomenon happens very fast. Accordingly, reliance upon the rapid transit times and increased dilution of $C_1$ hydrocarbon radicals by additional helium within the interface component flow volume are insufficient countermeasures against radical recombination. These measures can only reduce the occurrence of radical recombination.

Radical recombination can result in the formation of methane and ethane where the $C_1$ hydrocarbon radical species is the methyl radical, and acetylene where the $C_1$ hydrocarbon radical species is the carbyne radical. Radical chain extension reactions are discussed in organic chemistry and polymer textbooks. The freezing points of methane, ethane and acetylene are about 90, 91 and 188° K, respectively, well above the refrigerant temperature used for the single or first stage of cooling to reduce temperature differentials by the interface component of the present apparatus. The presence of any of these condensed phase diamagnetic hydrocarbons within the mass flow volume or the magnetic accelerator electromagnet core will provide drag, turbulence or even flow obstruction to the mass of paramagnetic C1 hydrocarbon radicals resident therein. Collisions of any $C_1$ hydrocarbon radical with any of these hydrocarbons can result in some molecule-radical bond formation which could consume the entire mass of diamond forming paramagnetic $C_1$ hydrocarbon radicals before reaching the magnetic accelerator. Hence, radical recombination must be reduced as much as possible, and this requires that a magnetic field be deployed within the interface component of the present apparatus as a strong magnetic field which surrounds the conduit through which the mass of C1 hydrocarbon radicals transit within the interface component.

The most practical means for providing a magnetic field within the interface component is a permanent magnet having a powerful magnetic field deployed about the flow volume localized within the interface component. The high velocity at which the $C_1$ hydrocarbon radicals transit from the heat exchanger through the interface component and into the magnetic accelerator input is adequate and does not require magnetic acceleration in addition to that provided by the radiolysis reactor output heat exchanger electromagnet. A magnetic field provided by permanent magnet to which valence electrons of $C_1$ hydrocarbon radicals align and couple is adequate. The strongest magnetic field known for a permanent magnet is that of iron nitride, Niron, $Fe_{16}N_2$ having a magnetic field strength of 130 mega gauss oersteds, more than twice as great as neodymium magnets. Such permanent magnets are commercially available from, for example, Niron Magnetics of Minneapolis, Minn.

Interface Components Structure

Figure 9:
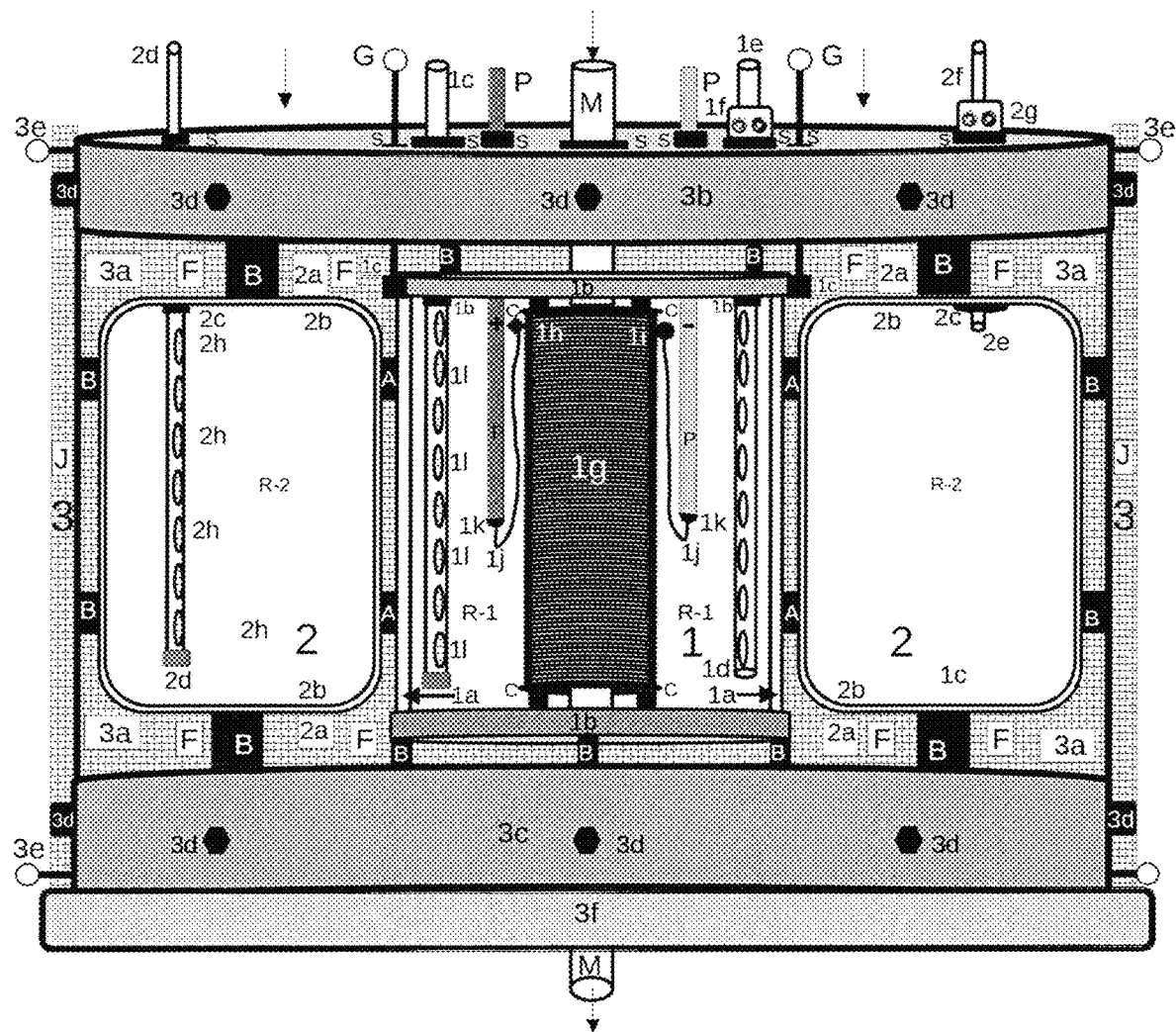
FIG. 9 depicts a non-limiting example of a magnetic accelerator.

A dedicated interface component is required for each of the two types of magnetic accelerators of the present apparatus. The interface component for a 77° K magnetic accelerator provides a single stage of heat exchange using recirculating liquid nitrogen as the refrigerant. The interface component for a superconducting magnetic accelerator provides two stages of heat exchange using recirculating liquid nitrogen for the first stage refrigerant and recirculating helium gas (<38° K) for the second stage refrigerant in tandem with the first heat exchange stage. Both types of interface components have means to supply cooled secondary helium gas at their input side and at the junction of the output side of the interface with the magnetic accelerator input. Both interface components are Dewars within which are deployed the flow path of the C1 hydrocarbon radicals transiting through them. This flow path is surrounded by permanent magnets which may be deployed as an alternating series of magnets and PTFE spacers. A refrigerant provided by the refrigerant management system circulates through the Dewar to reduce temperature differentials. FIG. 9 shows both types of interface components: 9a for the single stage interface component used with a magnetic accelerator operating at ~77° K; 9b for the two-stage interface component used with a superconducting magnetic accelerator.

77° K Magnetic Accelerator Interface Component

Figure 8A:
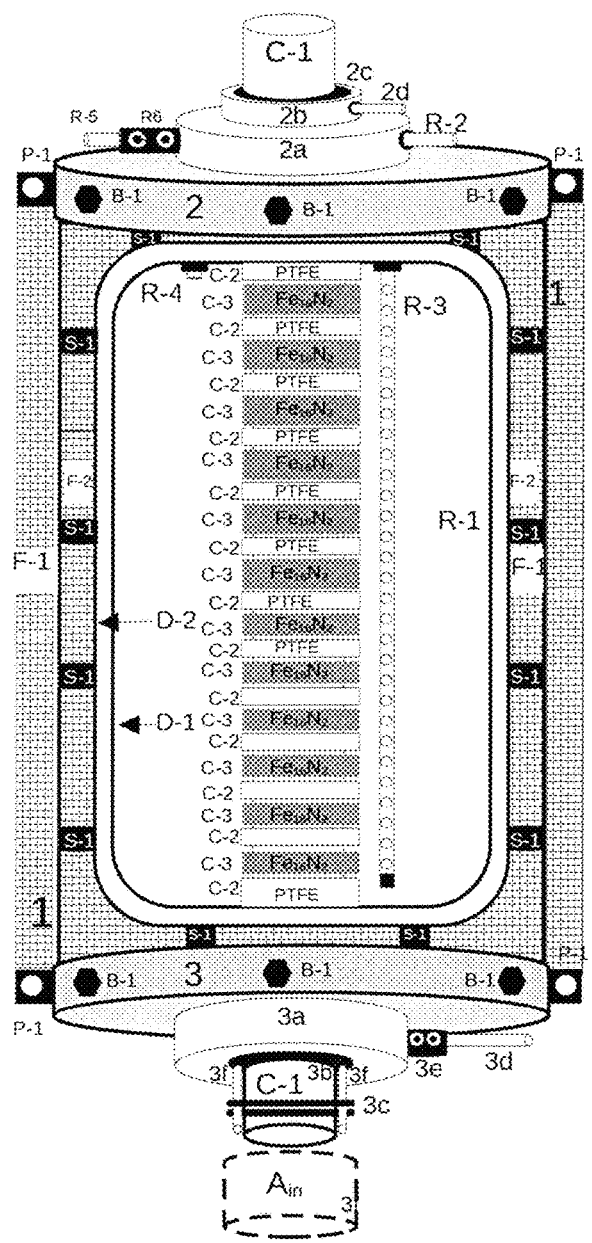
FIG. 8a depicts a non-limiting example of an interface component containing a single stage refrigerant chamber.

FIG. 8a depicts a non-limiting example of an interface component containing a single stage refrigerant chamber R-1, a Dewar, having the volume between the inner and outer walls D-1 and D-2 evacuated. This evacuated volume encloses the entire refrigerant chamber axially and radially. Spacers S-1 extend from cylinder 1 and end caps 2 and 3 to outer Dewar wall D-2 to support and immobilize R-1. Internal foam jacket F-2 is deployed between D-2 and cylinder 1 extending into both end caps.

Liquid nitrogen refrigerant provided by an external refrigerant management system (not shown) enters sealed input port R-2 mounted within top end cap 2 extension 2a. R-2 is connected to nozzle R-3 within extension 2a (connection not shown) to provide maximum cross-flow heat exchange. The refrigerant exits through nozzle R-4 connected to sealed integrated flow and temperature sensing output port R-5 having terminals R-6 for data line connection to the external refrigerant management system (not shown). Nozzles R-3 and R-4 extend through a fluid and vacuum tight through wall seals (not shown) deployed between Dewar walls D-1 and D-2.

Mass flow conduit C-1 extends from the hydrocarbon radical generator output heat exchanger (not shown) into this interface component through secondary carrier gas manifold 2b port extending from top end cap 2a through seal 2c having input port 2d. Cooled helium carrier gas provided by an external gas management system (not shown) through manifold 2b is delivered into the mass flow within C-1 in a low-to-no drag and turbulence profile.

Conduit C-1 extends through this interface component from top end cap 2 through bottom end cap 3 seal 3b connecting to the input of the magnetic accelerator at seal and connection point 3c. An alternating series of PTFE spacers C-2 and high coercivity permanent magnets C-3, such as iron nitride permanent magnets, surround C-1 within refrigerant chamber R-1 t provide a countermeasure to radical recoupling.

Conduit C-1 extends from this interface component through bottom end cap 3 manifold extension 3a and seal 3b into the magnetic accelerator input represented by $A_{in}$ at seal and connection point 3c. Manifold extension 3a receives additional secondary cooled helium carrier gas at sealed integrated temperature and flow sensing input port 3d having terminals 3e for data line connection to the external gas management system (not shown). Port 3d is connected to nozzles 3f within 3a (connection not shown) providing a low-to-no drag and turbulence gas injection profile.

Superconducting Magnetic Accelerator Interface Component

Figure 8B:
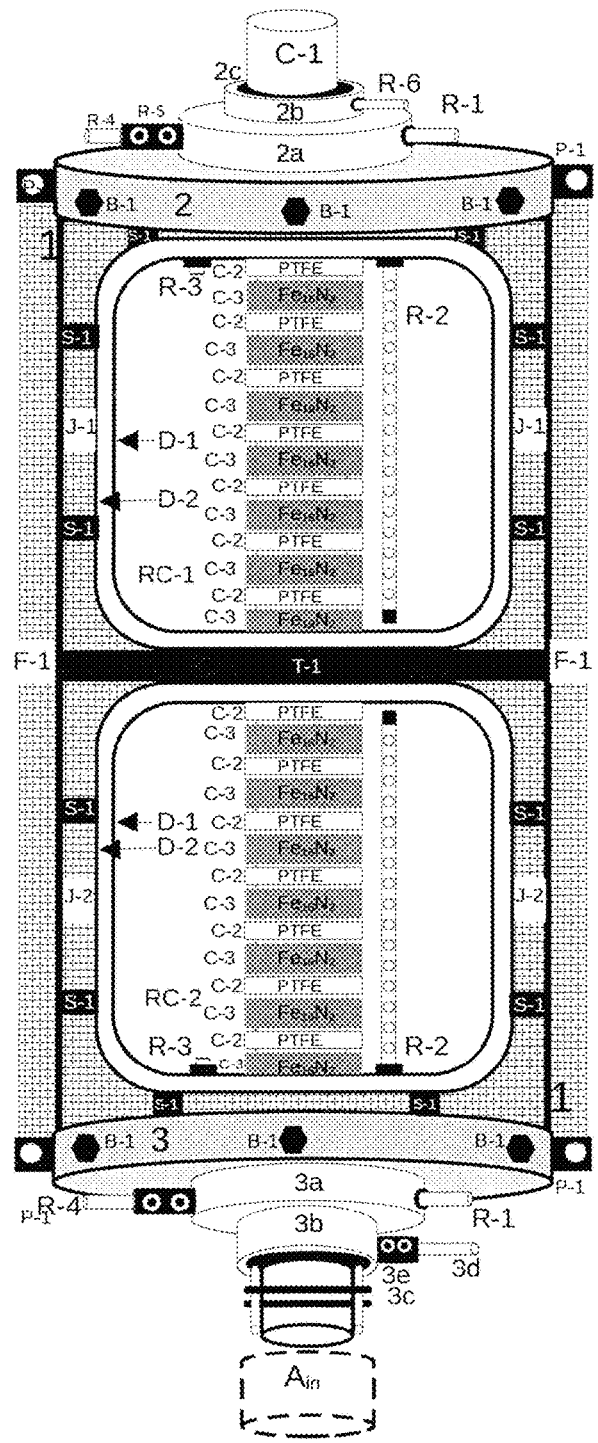
FIG. 8b depicts a non-limiting example of a two-stage interface component used with a superconducting magnetic accelerator.

FIG. 8b depicts a non-limiting example of an two stage interface component used with a superconducting magnetic accelerator operating a 5-39° K, This interface component contains two axially aligned refrigerant chambers RC-1 and RC-2, both being Dewars, having the volume between the inner wall D-1 and outer wall D-2 of each chamber evacuated. The evacuated volume of each chamber encloses the entire refrigerant chamber axially and radially. Internal insulating polyurethane foam jackets J-1 and J-2 are deployed within cylinder 1 to receive refrigerant chambers RC-1 and RC-2, respectively, and extend into end caps 2 and 3. Jackets J-1 and J-2 are separated and secured by a transverse rigid insulating polyurethane foam block T-1. Spacers S-1 extend from cylinder 1 and end caps 2 and 3 to outer Dewar walls D-2 to support and immobilize RC-1 and RC-2 which are further stabilized axially by transverse block T-1. The mass flow conduit through which $C_1$ hydrocarbon radicals diluted in helium gas transit from the hydrocarbon radical generator into the magnetic accelerator input extends through the entire length of this interface component: top end cap 2 components and seals. Fluid and vacuum tight seals deployed within RC-1, T-1 and RC-2 through which C-1 extends are not shown. Mass flow conduit C-1 is surrounded by an alternating series of PTFE spacers C-2 and high coercivity permanent magnets C-3, such as iron nitride permanent magnets, to provide a countermeasure to radical recoupling in both RC-1 and RC-2.

For refrigerant chamber RC-1, liquid nitrogen refrigerant provided by an external refrigerant management system (not shown) enters sealed input port R-1 mounted within top end cap 2 extension 2a. R-1 is connected to nozzle R-2 within extension 2a (connection not shown) to provide maximum cross-flow heat exchange. The refrigerant exits through nozzle R-3 connected to sealed integrated flow and temperature sensing output port R-4 having terminals R-5 for data line connection to the external refrigerant management system (not shown). Nozzles R-2 and R-3 extend through a fluid and vacuum tight through wall seals (not shown) deployed between Dewar walls D-1 and D-2. Cooled secondary helium carrier gas provided by an external gas management system (not shown) is delivered into the mass flow within C-1 through input port R-6 to provide a low-to-no drag and turbulence gas injection profile.

Referring to refrigerant chamber RC-2, helium gas refrigerant provided by an external refrigerant management system (not shown) enters sealed input port R-1 mounted within bottom end cap 3. R-1 is connected to nozzle R-2 within extension 3a (connection not shown) to provide maximum cross-flow heat exchange. The refrigerant exits through nozzle R-3 connected to sealed integrated flow and temperature sensing output port R-4 having terminals R-5 for data line connection to the external refrigerant management system (not shown). Nozzles R-2 and R-3 extend through a fluid and vacuum tight through wall seals (not shown) deployed between Dewar walls D-1 and D-2. Cooled secondary helium carrier gas provided by an external gas management system (not shown) is delivered into the mass flow within C-1 through input port R-6 to provide a low-to-no drag and turbulence gas injection profile.

Conduit C-1 extends from this interface component through bottom end cap 3 extension 3a seal 3c into the magnetic accelerator input represented by $A_{in}$ at seal and connection point 3d. Manifold 3b extension of 3a received additional secondary cooled helium carrier gas at sealed integrated temperature and flow sensing input port 3d having terminals 3e for data line connection to the external gas management system (not shown). Port 3d is connected to nozzles 3f within 3b (connections not shown) which nozzles provide a low-to-no drag and turbulence gas injection system.

Stage 1

Evacuated double walled cylinder 1a (a Dewar) surrounds and defines refrigerant circulation chamber 1b. The refrigerant management system (not shown) provides liquid nitrogen into heat exchanger 1b through input port conduit 1c extending through disk 3a to nozzle 1d and exiting through nozzle 1e extending through input side end cap 1g to integrated flow and temperature sensing port 1f having terminals 1h for data line connection to the refrigerant management system (not shown). Conduit 4 extending from radiolysis output heat exchanger (not shown) into input side end cap 4 through the entire interface component is the flow path of C1 hydrocarbon radicals transiting through this interface component from the radiolysis reactor into the magnetic accelerator (both not shown). Additional cooled helium carrier gas is received from the gas management system into heat exchanger stage 1 at integrated flow and sensing input port 1k having terminals 1l for data line connection to the gas management system (not shown). Input side end cap 1g extension 1i connects to the output of the radiolysis reactor heat exchanger output by fluid and vacuum tight seal 1j. Surrounding conduit 4 is an alternating series of permanent magnets 1m (white) and PTFE spacers 1l (black).

Stage 2

Evacuated double walled cylinder 2a (a Dewar) surrounds inner double walled evacuated cylinder 2b (s Dewar) which surrounds and defines refrigerant chamber 2c. Helium gas refrigerant exiting from the magnetic accelerator cryostat (not shown) enters integrated flow and temperature sensing input port d having terminals 2e for data line connection to the refrigerant management system (not shown) extends through output side end cap 2f to nozzle 2e exiting through nozzle 2g connected to output port 2h through insulating block 3a. Surrounding conduit 4 is an alternating series of permanent magnets 21i and PTFE spacers 2j. Secondary cooled helium carrier gas is provided to the magnetic accelerator with low or no drag and turbulence through nozzles 2r extending from output side end cap 2m deployed on either side of conduit 4 receiving helium gas from the refrigerant management system (not shown) through integrated flow and temperature sensing input port 2p having terminals 2q 4 data line connection to the refrigerant management system. Connection point 2n extending from end cap 2m bears seal 2o for connection to the input of the superconducting magnetic accelerator (not shown).

Insulating polyurethane foam jacket 5 surrounds the Dewar structures of both stages of this interface component. Cylinder 6 encloses the entire interface component comprising an impact resistant material such as graphite fiber embedded epoxy. Mount points 6a extending from enclosure 6 provide means for attachment of the interface component to a support frame (not shown).

Isolation structure 3a comprises exterior connecting and insulating band 3a which encloses an axially spaced pair of evacuated chambers, i.e., Dewars, 3b and 3c having a polyurethane foam layer 3d surrounding and axially separating these two Dewars and filling the interior of band 3a. Seals 3e deployed within Dewars 3b and 3c accommodate conduit 4 which extends axially through the entirety of heat exchangers 1 and 2 of this interface which is used with a superconducting electromagnet (not shown).

Magnetic Accelerator

The magnetic accelerator of the apparatus of this invention comprises an electromagnet deployed within a cryostat for maintaining cryogenic operating conditions. Several support components are required for its operation: refrigerant management system; electromagnet power supply; gas management system. Cryostat design and construction mandates means to facilitate installation or removal of the electromagnet coil itself along with and connection-disconnection of refrigerant conduits, electrical power connections, and refrigerant flow rate and temperature sensors. Connection and disconnection of components to input and output sides of the accelerator (interface component; diamond fabrication reactor) must also be reasonably easy to effect.

Electromagnet

The electromagnet, a solenoid, comprises multiple layers of multiple windings (coils or "turns") of heavily enameled magnet wire wound about a hollow core. Rectangular copper magnet wire is used and the electromagnet operating at 77° K. Of the superconducting magnet wires shown in Table 4, $MgB_2$ is preferred due to its relatively high critical temperature, ~39° K, its commercial availability, relatively low weight, and ductility. Commercial suppliers of this wire can provide large finished $MgB_2$ wire coils such as those used in MRI devices as products of custom manufacture. The exemplary electromagnet of the present invention is well within the capabilities of these suppliers as a custom fabricated article of commerce. Copper magnet wire electromagnet coils can be wound by one of normal skill in the arts using commercially available computer controlled coil winding machines which can accommodate the dimensions and weight of such coils having the high precision required for winding the multi-layered coils necessary for the electromagnets of the present invention.

Subsequent to winding, electromagnet coils are infiltrated with a resin such as polyester or epoxy resins which are cryogenically stable even below 4° K and commercially available. Because magnetic fields produced within an electromagnet coil can induce mechanical stress forces upon the coil itself, embedding resins are used to fortify the coil against such stress. This force is primarily radial which is significant for superconducting electromagnets as these forces tend to deform and/or compress the electromagnet itself. For example, magnetic field strengths ranging from 6-10 T can provide radial stresses of ~140 to 400 atmospheres pressure. Constant current operation and "ramping" of current to the electromagnet of the present invention at start-up eliminates oscillatory stress and prevents magnetic "shock" to the electromagnet coil. Experimental data regarding this phenomenon is available: M.I.T. Publication 22.68J/264J, Feb. 27, 2003, (Lecture 4) "Superconducting Electromagnets—Magnetic Forces and Stresses"; available freely on-line, a joint publication by Lawrence Berkeley National Laboratory (LBNL), European Organization for Nuclear Research (CERN), and the Large Hadron Collider (LHC), "Unit 10—Electromagnetic forces and stresses in superconducting accelerator magnets".

Axial forces are far lower and less problematic for the electromagnet. Axial stresses for electromagnets used by the Large Hadron Collider having magnetic fields >15 T are reported to be about $12.5 \times 10^4$ N. By contrast, the axial coil stress produced by the magnetic field strength of an exemplary electromagnet of the present invention does not exceed about $2 \times 10^4$ N at 200 amperes. Axial recoil stress (Newton's third law of motion) will be very low due to the small mass resident within the electromagnet core and the extremely short transit times resulting from the acceleration of this small mass which is insignificant relative to the mass of the vertically oriented electromagnet.

Infiltration of electromagnet devices with embedding agents is not limited to cryogenic electromagnets. It is a common industry practice. Coils such as those used in electric power distribution can undergo great mechanical stress as disclosed in U.S. Pat. No. 4,540,536 directed to transformer coil fabrication.

Coil layers are even numbered so that first layer coil and last layer coil power leads are located at the same axial end simplifying power supply conductor connections to the electromagnet coil. A winding bobbin is used for coil fabrication which is removed from the wound coil so that it may be infiltrated by an embedding resin. The infiltrated coil is transferred to and supported on a stand or jig which provides stable and reliable support for the weight of the infiltrated coil and which provides no obstruction to insertion of the coil core which is the path of confinement for the mass of the $C_1$ hydrocarbon radicals in helium carrier gas which will be resident within and magnetically accelerated by the electromagnet into the diamond fabrication reactor. The material comprising this coil core must be cryogenically stable and chemically inert to the harsh environment within it. Fluoropolymers (PTFE, FEP, and FPA) are commonly used in such frigid and corrosive environments. Such polymers are melt-processable allowing for fabrication of complex shapes and high dimensional precision of such shapes. The choice of which of the many types of teflons can best be determined from data for the physical and chemical properties of these materials in cold, corrosive environments such as low earth orbit. See, for example, NASA Technical Memorandum 113153 "Investigations of Teflon Embrittlement on Spacecraft in Low Earth Orbit" June, 1997. PFA and FEP polymers are stable down to ~3.0° K and are preferred.

The electromagnet coil must be deployed within the cryostat using a reliable means for support, and this makes an axially vertical orientation of the electromagnet preferred over horizontal orientation placing no undue stress upon the electromagnet coil due to unsprung weight.

Cryostat

The cryostat for the present magnetic accelerator comprises multiple concentric cylindrical structures which maintain the magnetic accelerator electromagnet within a safe and constant cryogenic operational temperature range using means to dissipate internally generated heat and means to shield against environmental heat.

The fluoropolymers disclosed above for use as the core of the magnetic accelerator electromagnet are well suited for use as cryostat structural components. In addition to their favorable properties of strength and stability at cryogenic temperatures, these polymers have very low thermal conductivities: 0.046-0.192 W/m ° K over 4.0-77° K.

Many of the components which comprise the electromagnet cryostat are commercially available. In one embodiment, the practitioner can assemble an electromagnet cryostat of the present apparatus useful for a non-superconducting magnetic accelerator. Where the complexity of the magnetic accelerator cryostat is beyond that of one of the ordinary artisan, cryostats for superconducting operation are commercially available or custom made. See, for example, Cryomagnetics of Oak Ridge Tenn.

The primary component of the cryostat is the electromagnet refrigerant chamber wherein a refrigerant fluid circulates in direct contact with the electromagnet and power post surfaces to dissipate heat. By themselves, the electrical resistance of the electromagnet and the power posts is very low at their cryogenic operational temperatures contributing very little to the overall heat load of the electromagnet refrigerant chamber. Transiting from several stages of heat exchange, the mass of $C_1$ hydrocarbon radicals entering the magnetic accelerator likewise contribute very little to this heat load. The heat generated by the electrical resistance of power cables propagates to the power posts constituting the majority heat load dissipated by the refrigerant. Extensive empirical data for the design, construction, implementation, and operation of electromagnet cryostats are available freely and online from CERN (Large Hadron Collider) in "The CERN ACCELERATOR SCHOOL" publication "Cryostat Design", Vittorio Parma, CERN, Technology Department, Magnets, Superconductors and Cryostats Group, <<Superconductivity for Accelerators>>, Ettore Majorana Foundation and Centre for Scientific Culture, Erice, Italy, 24 Apr.-4 May 2013 and European Spallation Source, Lecture 7, "Thermal Insulation & Cryostat Basics", J. G. Wisend II.

As articles of commerce as well as custom fabricated research devices, cryostats are used for laboratory instrumentation, magnetic resonance imaging instruments (MRI), superconducting wind turbine generators, and electric motors used in some ships of the line. With the exception of open bore MRI instruments, these devices are closed bore, and the masses within these devices are static. Heat dissipation demands for these devices are smaller than are those of the present invention which is an open bore electromagnet, a solenoid, confining a dynamic mass transiting through the entire apparatus.

Research accelerators confining dynamic masses (Brookhaven, CERN, Fermilab, etc.) study properties of continuous flow masses. The scale of this mass flow is on the order of $10^{-9}$ g. Their enormous electromagnets provide both acceleration and confinement of masses having the large angular velocities provided by electrostatic and magnetic acceleration. Heat load management demands for their cryostats is similar to that of the present invention but on a far larger scale. The Large Hadron Collider consumes about 12,500 amperes while the maximum current of the superconducting magnetic accelerator of the present invention is 200 amperes. The mass flow scale of the present invention ranges from $10^{-6}$ to $10^{-2}$ g for each of a series of individual diamond fabrication events.

Fluoropolymers (PTFE, FEP, FFPA) are known to be cryogenically stable even at liquid helium temperatures and can be melt processed which simplifies the formation of complex shapes. Their stability and low thermal conductivities at cryogenic temperatures, 0.046-0.192 W/m ° K over 4.0-77° K make them the best for the present cryostats.

The design, fabrication, implementation and operation of the magnetic accelerator cryostat and electromagnet deployed within this cryostat requires that this device be simple, reliable, and convenient to access for assembly and for disassembly repair; maintenance; replacement and upgrade. Access to all refrigerant chamber components is from one side, the input side, simplifying repair, routine maintenance, modification or upgrade, and replacement. The entire cryostat should be easily removed from its mechanical enclosure which comprises a surround and input side and output side covers secured to the mechanical surround. To enable this access, a host-guest design strategy is used. The central cylindrical structure, the electromagnet refrigerant chamber, can be removed from its surrounding concentric cylinders, the heat shield deployed within the mechanical enclosure.

FIG. 9 is a non-limiting exemplary magnetic accelerator of the present invention as an axial slice view. The magnetic accelerator is an electromagnet deployed within a cryostat comprising the central electromagnet deployed within refrigerant chamber 1 which is surrounded by environmental heat shield refrigerant chamber 2. These concentric chambers are deployed within a mechanical enclosure 3 using a host-guest design strategy to facilitate access for modifications and/or repair of the electromagnet. Chamber 1, the "guest" is removably deployed from within chamber 2, the "host". The design of the magnetic accelerators of both embodiments, non-superconducting (1) and superconducting (2) is the same, but their execution will differ owing to the differences in current and electromagnet refrigerants. The heat shield refrigerant chamber is a torroidal Dewar which may be manufactured by glass blowers from quartz or borosilicate glass. Through wall bushing seals are fabricated into the torroidal Dewar during manufacture.

Referring to FIG. 9, mechanical enclosure 3 is an open cylinder 3a enclosed by top (input side) end cap 3b and bottom (output side) end cap 3c. End caps 3b and 3c are secured to 3a by fasteners 3d screwed into threaded expansion bushings (not shown) within 3a. Mount points 3e extending from end caps 3b and 3c provide means for bolting the magnetic accelerator to a support frame (not shown). Bushings B connected to and extending from 3a and end caps 3b and 3c support and immobilize heat shield chamber 2 and magnetic accelerator 1. Bushings A affixed to chamber 2 fix chamber 1 in place. Insulating polyurethane foam packing F surrounds chambers 1 and 2 on all sides extending axially and radially throughout the entire volume within enclosure 3. External polyurethane foam jacket J surrounds the exterior of enclosure 3 and endcaps 3a and 3b providing additional thermal insulation and impact shock protection. End cap 3c flange 3f provides means for connecting the magnetic accelerator to the diamond fabrication reactor (not shown).

Seals S deployed within end cap 3b provides fluid and vacuum tight seals for mass flow conduit M, refrigerant input and output conduits for chambers 1 (1c and 1e) and 2 (2d and 2f), magnetic accelerator grasp points G, and power posts P. Seal S deployed within end cap 3c (not shown) provides fluid and vacuum tight seal for mass flow conduit M.

Torroidal Dewar environmental heat shield refrigerant chamber 2 has the volume between its outer wall 2a and inner wall 2b evacuated. Through wall bushing seals 2c provide fluid and vacuum tight seal for liquid nitrogen refrigerant input conduit 2d and exit nozzle 2e extending from integrated flow and temperature sensing output conduit 2f having terminals 2g for data line connection to a refrigerant management system (not shown). Output orifices 2h of conduit 2d direct refrigerant cross flow throughout chamber 2 to exit nozzle 2e.

Magnetic accelerator refrigerant chamber 1 is an axial Dewar, 1a, having the volume between its inner and out walls, 1a, evacuated. End caps 1b close off axial ends of Dewar 1a attached to 1b by fluid and vacuum tight indium O-ring seals (not shown). Through wall bushings 1b provide fluid and vacuum tight seal for refrigerant input conduit 1c and exit nozzle 1d extending from integrated flow and temperature sensing output conduit 1e having terminals if for data line connection to a refrigerant management system (not shown). Electromagnet 1g has first and last coil terminations 1h and 1i for connection to conductors 1j which connect to attachment points 1k on power posts P. Electromagnet 1g is supported by input side and output coil stops C extending from end caps 1b. Refrigerant heat dissipation for electromagnet and power post is optimized by transverse flow directed by output orifices 1l on input conduit 1c. Mass flow conduit M is the electromagnet core about which coil 1g is wound. Conduit M extends from the input side interface component (not shown) through the electromagnet and into the output side diamond fabrication reactor (not shown). Grasp points G are screwed into threads within blocks 1c attached to end caps 1b.

Prior to assembly of the magnetic accelerator, the two refrigerant chambers are leak tested, and power posts are certified for electrical continuity. The output side flange is mated to bottom side end cap 3c which is then connected to cylinder 3 by fasteners 3d. Bushings B are fixed to both end caps 3b and 3c. A first pre-cut and shaped foam piece is inserted into 3c having slits for accommodating bushings B. Insertion is effected with minimal compression of the foam. The environmental heat shield refrigerant chamber 2 is place into this assembly and bushings A are fixed to the inner diameter of 2. A second pre-cut and shaped foam piece is placed around 2 having slits for accommodating bushings A. Insertion is effected with minimal compression of the foam. The "host" is now ready to receive its "guest, magnetic accelerator refrigerant chamber. Using grasp points G, 1 is carefully inserted into its "host". A pre-cut and shaped foam piece having slits for accommodating refrigerant ports, power posts, grasp points, and mass flow conduits is placed over this assembly (not shown), and end cap 3b is seated onto this assembly and connected to cylinder 3 using fasteners 3d. Foam jacket J is placed around the assembly of cylinder 3 and endcaps 3b and 3c. The grasp points may be unscrewed and removed that this point. Assembly is complete and ready for testing prior to being put connection to the interface component and the diamond fabrication reactor. Disassembly proceeds in the reverse order of the disclosed assembly sequence.

Resilient polyurethane foams deployed internally have very low thermal conductivity particularly when applied with no or as little stress as possible. Rigid polyurethane foams used for the external foam layer of the mechanical enclosure provide good insulation and high mechanical strength against impact. See, for example, Demharter, A., Cryogenics, Vol, 38, issue 1, January 1988, pp. 113-117.

The environmental heat shield refrigerant, R-2, is liquid nitrogen for both the first embodiment non-superconducting magnetic accelerator operating at ~77° K and the second embodiment superconducting magnetic accelerator operating at 5-39° K. Electromagnet refrigerant R-1 is liquid nitrogen for the first embodiment non-superconducting magnetic accelerator. Electromagnet refrigerant R-1 for the second embodiment superconducting magnetic accelerator is helium gas. Cryogenic refrigerant R-1 circulates through chamber 1 to dissipate heat generated by the electromagnet and/or its power posts. Cryogenic refrigerant R-2, liquid nitrogen, dissipates environmental heat, i.e., a heat shield.

Cryostats provided by commercial suppliers as "off the shelf" and custom fabricated for cryogenically cooled electromagnets are typically sealed bore devices (closed at one end) unlike that of the present invention. While cryostat manufacturers are able to provide an open bore article of commerce, such a device such a device would be custom fabricated. The following non-limiting example provides a practical and inexpensive method for constructing a cryostat useful for the present invention particularly well suited for a non-superconducting device.

Example of Cryostat Construction

One of normal skill in the arts can construct the non-superconducting magnetic accelerator of the first embodiment of the present invention from commercially available cryogenic grade closed end PTFE tubing, and commercially available cryogenic service rated indium metal alloy as wires, tapes or ingots and common hand tools. The selection of grasp points are left to the practitioner. Suitable hardware pieces for this service are commercially available. Other than the customary hand tools, the only other tools needed are a tile saw or table saw having a narrow, fine toothed blade, a drill, a rotary tool, a heat gun or jewelers' torch, a thermometer, and a vacuum line with a manometer. The electromagnet would be fabricated as previously described. The same methods detailed herein for constructing the electromagnet refrigerant chamber may be used to construct the heat shield refrigerant chamber. Both are Dewars, dual walled concentric cylinders having their intervening volume evacuated.

Heavy walled cryogenic rated PTFE tubing is commercially available, but large diameter tubing required for such use may have limited sizes available, and the closed end pieces as used for the refrigerant chamber may not be available in larger sizes and may require expensive custom manufacture. Typically, commercially available PTFE tubing comprises 5 mm wall thickness in increments of 25 mm inner diameters which must be taken into account in design and construction of the electromagnet refrigerant chamber and the heat shield refrigerant chamber. Dewars constructed by the method disclosed herein have both radial and axial evacuated volumes. Four pieces of stock, cryogenic rated closed end PTFE tubing are required as two pairs. Both pairs of tubing comprise a smaller diameter tube to mate with a larger diameter tube. The inner diameter of the larger tube is very close to or the same as that of the smaller tube outer diameter. The smaller diameter tubes of both pairs comprise the chamber body, and the larger diameter tubes are cut to length to provide sealing end caps at the open end of these tubes. It is necessary to form an O-ring channel at the open end of both smaller diameter tubes. This is done using a saw having its blade raised above the platen only enough to cut a channel for an indium wire O-ring while the tube is immobilized on the platen and rotated by hand carefully. Indium metal is used for sealing and joining in this method because it is low melting (about 156-157° C.) and well known for its excellent wetting properties for PTFE surfaces. It can be melt formed into pins, plugs and various geometric shapes easily using a heat gun or jeweler's torch. All surfaces in contact with indium must be roughened using a rotary tool having an abrading head. The fabrication steps detailed below require no more skills than those required for one of ordinary skill in a chemistry, physics, or engineering laboratory. Prior to actual assembly, melting of indium should be practiced and visually observed to be familiar with its melt flow characteristics. Melt sealing should be done using a thermometer, and heating should not exceed 160° C. At ambient or near ambient temperatures, the seal should be inspected visually and tested manually for a secure bond. Practice is also recommended for cutting O-ring channels.

Fabrication of the Electromagnet Refrigerant Chamber

Figure 10:
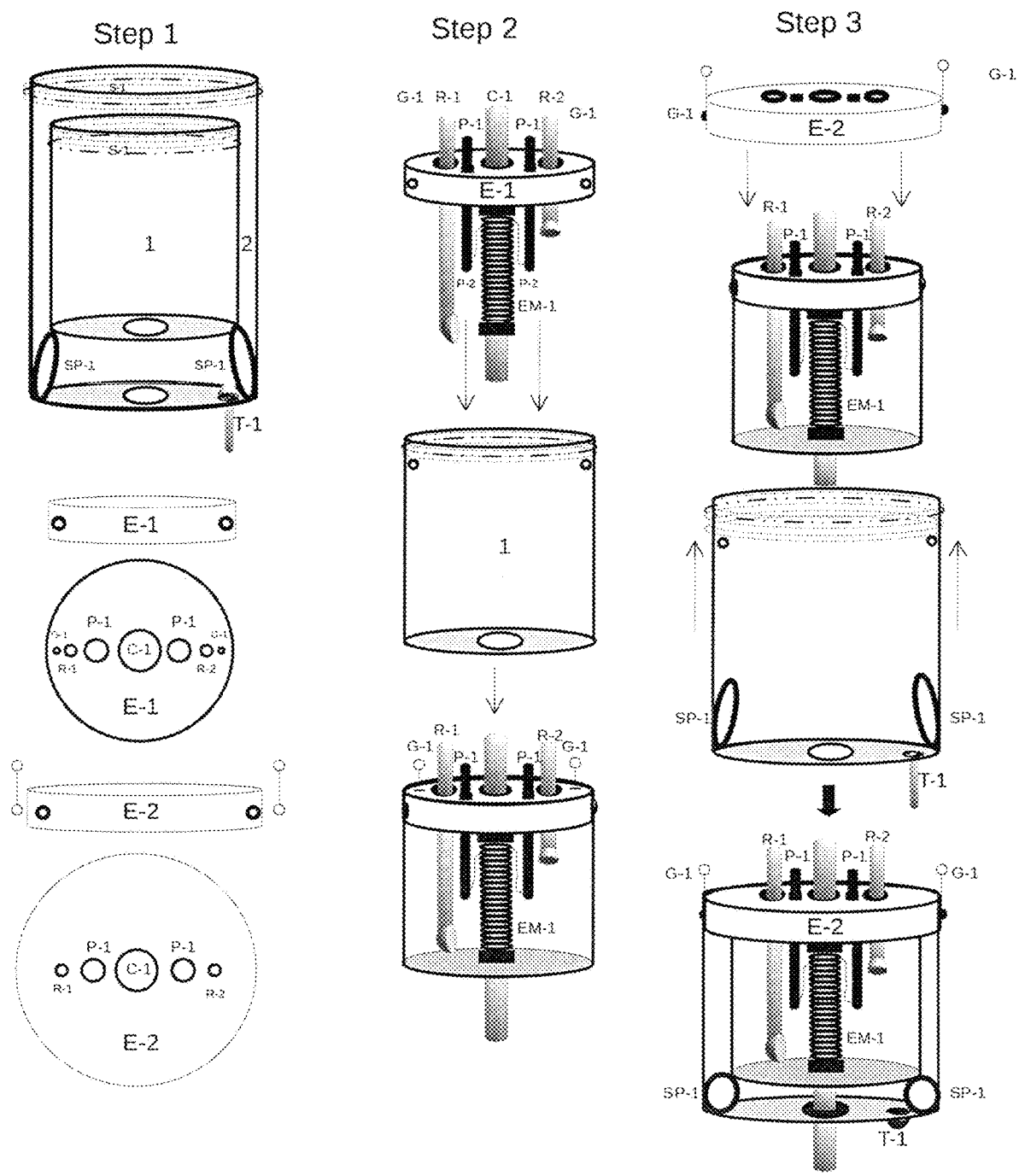
FIG. 10 depicts a non-limiting example for building a component of the apparatus of the present invention.

Fabrication of the electromagnet refrigerant chamber proceeds in three steps as shown in FIG. 10. These procedures are a general guide. The practitioner may alter or improve any or all of these steps as needed.

Step 1—Prepare Concentric Cylinders and End Caps.

Cut outer closed cylinder 2 and inner closed end cylinder 1 to appropriate length based upon electromagnet dimensions to provide a volume adequate for a Dewar when these concentric cylinders are sealed and evacuated for the electromagnet refrigerant chamber. Reduce the outer diameter of the open ends of these cylinders ~0.5-1 mm with a rotary tool to accommodate their respective end caps whose inner diameter will be slightly greater to allow for mating of end caps with open cylinder ends. Score O-ring channels S-1 and S-2 in the open ends of these cylinders using a tile saw blade at minimal height above the saw platen. Form indium O-rings within these channels for fluid and vacuum tight seal.

Drill a hole in outer cylinder 2 near its wall. Press some indium foil into this hole and insert indium metal tube T-1 within this hole, and insert T-1. Spread a minimal amount of wax around this point but not in the tube itself and melt this wax to form a temporary seal. Using PTFE elastomer spacers SP-1 to align cylinders 1 and 2 concentrically, secure them in place and drill center holes for O-ring seals for the electromagnet core C-1. Separate cylinders 1 and 2. Fit end caps E-1 and E-2 onto cylinders 1 and 2 and drill diametrically opposed holes through the end caps and their mated cylinders. Separate these end caps from their cylinders and press indium foil into these holes in both cylinders and end caps. Align each end cap with its respective cylinder at the closed end and secure this mating with tape or an adhesive ensuring that the end cap and cylinder are centered. Drill a pilot hole at the center of both end caps followed by a complete hole. Using a short piece of PTFE tubing used for C-1, ensure that the holes are properly aligned. Insert indium foil into these holes. Separate the end caps from their cylinders. Align E-1 and E-2 so that they are precisely centered. Secure this mating with tape or an adhesive and drill pilot holes through both end caps for refrigerant input and output ports R-1 and R-2 and power posts P-1. Separate this mating. Enlarge the pilot holes to their appropriate diameters for power posts, grasp points, and refrigerant ports. Insert indium foil into these holes. Fabricate the electromagnet.

Step 2—Prepare Electromagnet Refrigerant Chamber

Enlarge pilot holes in both end caps for power posts. Insert refrigerant ports and power posts and C-1 into E-1. Carefully melt seal the indium foil for these inserted components using an electric heat gun or torch. Mate E-1 with cylinder 1. Connect leads from the electromagnet coils to the power posts. Check for electrical continuity of these connection with a voltmeter. Using a heat gun, carefully melt seal the indium O-ring. Allow this mating to cool and gently test for secure seal manually. Repeat melt sealing as needed to obtain a secure seal. Make and insert short pieces of indium wire pins into holes drilled in E-1 sides. Position this mating horizontally and melt seal the end cap pins with a heat gun allowing for gravity flow of the melt to form a good seal. Plug one refrigerant port and attach a vacuum line to the open port. Evacuate using a vacuum gauge to ensure that all seals are secure by cessation of active pumping and observation of vacuum for about 5 minutes. If no leak is detected, the refrigerant chamber is complete.

Step 3—Complete Refrigerant Chamber Assembly

Apply indium foil into side holes of E-2. Orient E-2 horizontally and inset a short indium wire pin into this first hole. Fit grasp point G-1 over this pin. Secure temporarily with a small strip of cellophane tape away from the hole. Melt seal this foil and pin securing G-1 to E-2. Repeat these steps to secure G-1 to the opposite side of E-2. Shape a piece of polyurethane foam insulation to fit within E-2 cutting slits or holes to accommodate C-1, P-1, and R-1 and R-2. Press and adhesive bond this insulating foam piece into E-1. Insert and position spacers SP-1 tipped with a cyanoacrylate or silicone adhesive. Optionally at this point, enough perlite granules sufficient to fill the volume between S-1 and the refrigerant chamber may be applied to S-2. Perlite is one of the most highly insulating materials and even more so when evacuated. An open top mesh shaped textile cylinder is adhered to the refrigerant chamber having axial and radial dimensions close to that of the volume between S-1 and the refrigerant chamber. Perlite is dispensed into this mesh (not shown in FIG. 11). Thereupon, refrigerant chamber (S-1) is inserted into S-2 carefully aligning C-1. Using a heat gun, melt seal the indium O-rings on S-2 as done in Step to confirm a good seal. Perform a vacuum leak test of this mating as done in Step 2 using T-1 as the vacuum line attachment point. If test fails, disassemble and replace S-1 for re-assembly and repeat vacuum test. Otherwise, melt seal T-1 under vacuum in a manner similar to that used by glass blowers to vacuum seal silvered glass Dewars. Once the seal has cooled, perform a vacuum test for leak under both dynamic and static vacuum. If passed, the magnetic accelerator refrigerant chamber is complete.

While the above example is directed to the fabrication of the electromagnet refrigerant chamber, these same procedures may be used for the fabrication of the heat shield refrigerant chamber to produce a complete magnetic accelerator cryostat which can be mounted within a mechanical enclosure suitable for non-superconducting service.

Cryostat Design, Construction, and Operation

Useful data for magnetic accelerator cryostat design and construction is available publicly (online) from the Large Hadron Collider (CERN) and "Practical Cryogenics", N. H. Bradshaw, Oxford Instruments Superconductivity LTD, Witney, Oxon, England. While this data is directed to superconducting electromagnetic apparatus, it provides useful information and guidelines for the design, construction, and operation of electromagnets and cryostats of the present invention. A magnetic accelerator cryostat must dissipate internally generated heat and environmental heat. The two chamber cryostat shown in FIG. 10 is suitable for such service for both a magnetic accelerator operating at 77° K and for a superconducting magnetic accelerator operating below 39° K. The arrangement of concentric Dewars, and insulating foam is consistent with the design of most cryogenic refrigerant cryostats for electromagnets.

Internally Generated Heat

Internally generated heat due to electrical resistance of the power posts and cables which deliver electric current to the electromagnet provides the greatest measure of heat dissipated by the cryostat. Heat generated by the electrical resistance of a superconducting electromagnet itself is zero and nearly insignificant for copper magnet wires at liquid nitrogen temperatures, <0.01 Ohm. Heat generated by the electrical resistance of power cables propagates to the power posts and must be dissipated by the refrigerant. Critical to the design and operation of the electromagnet refrigerant chamber is a safe operating temperature range. Over temperature operation can result in an excessive refrigerant seal temperature differential or internally generated pressure due to refrigerant vaporization, either of which can compromise refrigerant seals leading to electromagnet damage such as melting or pulverization of magnet wires. Kinetic energy imparted to pulverized magnet wires can crack or fracture refrigerant chamber walls and components. Such an event has occurred at the Large Hadron Collider with disastrous results.

Electromagnet refrigerant chamber design requires electromagnet coil dimensions (Table 3), the maximum electromagnet operational current for the electromagnet (Table 5), and refrigerant physical properties (Table 6).

Table 5 shows heat loads for maximum currents used for electromagnets of Table 3 (40 and 200 amperes) from the expression $P=I^2 \times R$ where P=power in Watts/second, I=current in Amperes, and R is electrical resistance in Ohms. Wire gauge is based on rated power transmission amperage by American Wire Gauge specifications (25° C.). Cable length is 3 meters.

TABLE 5

Heat Load Determination for Electromagnet Power Posts and Cables

| Current Amperes | Gauge # | Diameter mm | Resistance Ω/km | Resistance Ω | Heat Load* Watts/sec. |
|---|---|---|---|---|---|
| 40 | 5 | 4.6 | 1.027624 | −0.0031 | −51.2 |
| 200 | 000 | 10.4 | 0.202704 | −0.0006 | −24.32 |

(*includes electromagnet magnet wire electrical resistance)

Experimentally derived data for refrigerant molar heat capacity, $c_m$, (measure of heat raising the temperature of 1 mol of refrigerant 1° K) are shown in Table 5 as Watts/second/mol/° K for liquid nitrogen and helium gas refrigerants.

TABLE 6

Physical Properties of Liquid Nitrogen and Helium Gas Refrigerants*

| Refrigerant | Range °K | Density g/ml | Molar Heat Capacity W/sec/mol/°K |
|---|---|---|---|
| Nitrogen | 66-77 | 0.806 | ~33.26 -31.24 |
| Helium | >4.2°K | 0.0164 | 12.5 |

(* Brookhaven National Laboratories Cryogenic Data Handbook, BNL 10200-R, Revised Aug., 1980, J.E. Jensen et al.)

The data from these 3 tables is used for electromagnet refrigerant chamber design for which two strategies may be used: dynamic and static. The dynamic strategy uses a small volume of refrigerant resident within the chamber and a robust refrigerant flow rate whose heat dissipation closely matches that of the internally generated heat load ("low inventory"). The static strategy uses a large volume of refrigerant resident within the chamber and an adequate heat dissipating refrigerant flow rate ("high inventory"). A dynamic strategy provides for a smaller electromagnet refrigerant chamber than that of its static counterpart. The high refrigerant inventory provides a large heat dissipation safety margin compared to that of its dynamic counterpart using only low refrigerant inventory. Both strategies assume a safe operational temperature range. That is, how high can the temperatures of refrigerant, its seals, and the electromagnet itself rise and still provide safe and reliable operation. For the non-limiting examples shown below, these temperature ranges are 71-76° K for the copper magnet wire electromagnet and 8-36° K based upon critical temperature data for superconducting $MgB_2$ magnet wire, 39° K.

Nitrogen is a liquid from ~63-77.2° K, and helium is a gas above 4.2° K. Manufacturers of liquid nitrogen and helium liquid and gas plants specify delivery temperatures of 70-72° K for liquid nitrogen and 8° K for helium gas when conduits, connections, and thermal isolation components certified for such service are used. Cryogenic refrigerant delivery at lower temperatures is possible but impractical for the present invention. Accordingly, 71° K is used for liquid nitrogen and 8° K is used for helium gas as minimum refrigerant temperatures. The median molar heat capacity of liquid nitrogen, 32.25 W/mol/sec/° K is used for a static strategy chamber, and its minimum molar heat capacity, 31.24 W/mol/sec/° K, is used for the dynamic design strategy chamber. The molar heat capacity of helium is 12.5 Watts/mol/sec/° K over a very wide temperature range The electromagnet refrigerant chamber length must exceed that of the electromagnet itself for maximum heat exchange surface area. For both examples, 2 cm (1 cm for each axial side) is used. This requires that spacers which fix the electromagnet within its refrigerant chamber have the smallest practical footprint.

The following non-limiting examples show non-superconducting and superconducting electromagnet refrigerant chambers of both design strategies. R is the safe operational temperature range for the electromagnet in ° K. V is an exemplary volume of refrigerant resident with the electromagnet refrigerant chamber over and above that of the electromagnet itself. Refrigerant chamber inner diameter, D, and length, L, are given in cm. The safety margin, M, is the time period, in minutes, within which the electromagnet can remain with R provided by resident refrigerant volume V.

TABLE 7

Electromagnet Refrigerant Chambers

Cu electromagnet: R = 71-76°K; L = 22 cm;
Heat Load = 51.2 W/sec Watts/second.

| Type | V | D | M |
|---|---|---|---|
| Dynamic | 1000 | ~41.7 | ~1.44 |
| Static | 5000 | ~44.4 | ~7.6 |

$MgB_2$ electromagnet: R = 8-36°K; L = 22 cm;
Heat Load = ~24.32 Watts/second

| Dynamic | 1000 | 52 | ~1.46 |
| Static | 5000 | 54 | ~7.5 |

Environmental Heat

Environmental heat is dissipated by the heat shield refrigerant chamber. Publicly available data from the Large Hadron Collider ("LHC") directed to the heat shield infers that "leak" of environmental heat from the heat shield to the electromagnet refrigerant chamber is insignificant where adequate heat shield refrigerant is used along with appropriate insulation measures. At the LHC, environmental heat load is taken at 0.05 mWatt/sec/m² A massive air handling system maintains uniform and low ambient temperatures about their superconducting electromagnet cryostats.

As shown in FIG. 9, both refrigerant chambers are Dewars about which are insulating polyurethane foam jackets. The additional radial distances of these radial Dewars and insulating jacket are factored into determining the heat shield refrigerant chamber interior width. Its length is that of the electromagnet refrigerant chamber. Dewar walls and evacuated volume are taken as 15 mm, and the insulating foam jacket between the two chambers is 10 mm, unstressed. For the present invention, a volume of 1 liter of liquid nitrogen is contained within the heat shield refrigerant chamber. R is taken as 71-77° K and $c_m$=31.24 which provides ~895 W/second of heat dissipation. A heat shield chamber having an interior width of ~1 cm is more than adequate for this volume of refrigerant regardless of electromagnet refrigerant chamber dimensions.

LHC data directed to mechanical enclosures for superconducting electromagnets disclose the preferred mechanical enclosure material is a graphite fiber-epoxy composite having a thermal conductivity of about 153 watts/m²/second at 25° C. compared to that of aluminum 2024 (~22900 W/m²/sec.) or stainless steel 304 (~3060 W/m²/sec.). Graphite-epoxy composite enclosures are more difficult to fabricate than those made from these metals, whose thermal conductivity is 15-20 times greater that that of the composite material.

Experimentally derived data for the thermal conductivity of 96 kg/m³. polyurethane foam discloses a thermal conductivity of ~26 mW/m²/second. Jacketing and lining an enclosure with this foam significantly reduces the heat shield environmental heat load and allows for fabrication of the enclosure using aluminum or steel. See National Bureau of Standards Publication NBSIR 84-3011, 4/1984, "Thermal and Mechanical Properties of Polyurethane Foams and Survey of Insulating Concretes at Cryogenic Temperatures"). Non-rigid polyurethane foam used for enclosure jacket and lining and between the cryostat end covers should not be compressed as this material provides maximum thermal isolation unstressed. Infrared reflecting metal film such as 200A aluminum on mylar should line the mechanical enclosure. Thermal isolation characteristics for Dewars are improved by filling their volumes with perlite granules prior to evacuation.

For magnetic accelerator cryostats of the present invention, the concentric refrigerant chambers surrounded by a layer of polyurethane foam are deployed within a cylindrical mechanical enclosure having wall and end cap thicknesses of 1.0 cm, a 2.5 cm thick layer of insulating polyurethane foam lining the interior of the enclosure, and a 5 cm thick exterior layer of insulating and impact shock absorbing polyurethane foam. Deployed within the interior of both axial end caps is a 2.5 cm thick conforming foam pad with slits for accommodating refrigerant conduits, grasp points, power supply posts and cables, sensor data lines, and the $C_1$ hydrocarbon radical-helium carrier gas mass flow conduit. An infrared reflecting aluminized mylar film is deployed between the mechanical enclosure exterior surfaces and the exterior foam layer.

The magnetic accelerators of both embodiments and both of their respective heat dissipation strategies of the present invention differ only in dimensions, refrigerants, and operational temperatures and electromagnet currents. While not shown in FIG. 9, connection points for power posts, refrigerant conduits, and refrigerant sensors to their respective cables and conduits must extend beyond the exterior foam layer of the input side end cap of the cryostat. Copper power posts of gauges adequate for carrying their respective electromagnet currents must have secure quick connect—quick disconnect type effectors rated for the high current service of the electromagnet. The refrigerant input and output conduits and lines must have secure low temperature rated quick connect—quick disconnect connectors. Quick connect terminals and cables for refrigerant flow and temperature sensing conduits must also have secure low temperature rated quick connect—quick disconnect connectors. Strain reliefs extending from the magnetic accelerator supports are required for power cables and refrigerant conduits and sensor lines. Means to connect the mechanical enclosure to a support frame must also extend beyond the foam surround of the mechanical enclosure.

The following tables show non-limiting examples of the dimensions of both non-superconducting and superconducting magnetic accelerators of both electromagnet refrigerant chamber design strategies and their respective heat loads. Linear dimensions are in cm, and surface area is in meter². Environmental and total heat loads ($H_E$, $H_T$) are in Watts/second. Thermal conductivity of the assembled magnetic accelerators is taken conservatively as 10 watts/m².

TABLE 8

Non-Superconducting Magnetic Accelerator Dimensions and Heat Load

| Strategy | Diameter cm | Length cm | Surface Area m² | $H_E$ W/sec | $H_T$ W/sec |
|---|---|---|---|---|---|
| Dynamic | 63.2 | ~40 | ~1.4 | 140 | 191.2 |
| Static | ~70 | ~40 | ~4.8 | 480 | 481.2 |

TABLE 9

Superconducting Magnetic Accelerator Dimensions

| Strategy | Diameter cm | Length cm | Surface Area m² | $H_E$ W/sec | $H_T$ W/sec |
|---|---|---|---|---|---|
| Dynamic | 73.5 | ~40 | ~1.8 | ~180 | ~204.5 |
| Static | 75.5 | ~40 | ~1.85 | ~185 | ~209.5 |

Magnetic Accelerator Assembly and Connection

The following is a non-limiting example for assembling and testing of the magnetic accelerator of this invention.

Leak tested electromagnet refrigerant and heat shield refrigerant chambers are mated to form the cryostat interior. The mechanical enclosure and end caps are lined with aluminized mylar film followed by insulating polyurethane foam as previously described. This cryostat is then deployed within the mechanical enclosure, and the output side end cap is secured to the mechanical enclosure. The input side end cap is positioned close to the enclosure and held in place on a stand but out of the way for access and test manipulations.

Data line leads are connected to terminals on the refrigerant output conduits extending through the input side end cap. Refrigerant conduits are connected to their input and output ports also extending through the input side end cap. Thermal isolation jackets comprising polyurethane foam are deployed about these refrigerant conduits.

The refrigerant management system is placed in test mode to evacuate the volumes of the two chambers and to fill these evacuated volumes with refrigerant which proceeds slowly into both chambers to prevent thermal shock to the refrigerant seals and the materials of the chambers themselves until the volumes of both chambers are completely filled with their respective refrigerants. Refrigerant seal integrity is tested at operational temperature and full volume for 30 minutes to an hour. If no irregularity in flow or temperature is reported by main computer sense and control software in communication with the refrigerant management system, and visual observation shows no evidence of leak, then the electromagnet is ready for power testing.

Power delivery conduits extending through the input side end cap are connected to the power posts. Means to circulate refrigerant helium gas cooled to about 10° K greater than that of the electromagnet refrigerant temperature through this test core are attached to this test core. This is intended to simulate the additional mass flow heat load which would exist during a diamond fabrication run. Refrigerants are circulated through the cryostat during this test at a flow rate consistent with maximum current operation (maximum heat load). The power delivery system is placed in test mode to provide current to the electromagnet which is ramped slowly (about 1 hour) from about 5 amperes up to the maximum operational current of the electromagnet. Once maximum current is reached, the electromagnet is held at full current for another hour. If no irregularity is observed, and no failure is detected for the electromagnet itself or for the refrigeration chambers, electromagnet power delivery is discontinued, the helium gas fitting is removed from the electromagnet core, and the input side end cap is secured to the cryostat. This test process is repeated several times with the magnetic accelerator completely assembled.

Diamond Fabrication Reactor

There are two embodiments for diamond fabrication reactors of the present invention. As previously disclosed, there are two types of reactors for each embodiment differing only in the means by which remediation hydrogen plasma is generated and provided to the reactor. The Type 1 reactor receives molecular hydrogen from the gas management system delivering hydrogen plasma to the fabrication locus through nozzles deployed around the mass flow conduit, aimed at the fabrication locus, and fitted with high voltage discharge electrodes which receive high voltage current (~2 KV) from an external high voltage power supply to produce the remediating hydrogen plasma directed toward the fabrication locus. The Type 2 reactor receives remediating hydrogen plasma generated within the microwave radiolysis reactor which is delivered to the fabrication locus by the reactor mass flow conduit.

The design and construction of this component are a consequence of the type of diamond product to be produced by the reactor. In a first embodiment, the diamond product is shaped and dimensionally precise being produced by additive manufacturing techniques using components deployed within the reactor for manufacturing such a diamond product. Ina second embodiment, the diamond product is a disk such as, but not limited to, the most sought after 5 inch wafer common to semiconductor manufacturing particularly as a heat spreader where diamond is used. This reactor has no additive manufacturing components.

For both embodiments, the reactor mass flow conduit inner diameter is the same as the magnetic accelerator electromagnet core inner diameter. The first embodiment reactor uses a small inner diameter mass flow conduit such as that of the non-limiting exemplary 2 cm inner diameter electromagnet core disclosed for a non-superconducting magnetic accelerator. The second embodiment reactor would use a large inner diameter mass flow conduit (12.5 cm) which would require a superconducting magnetic accelerator electromagnet core of having the same inner diameter.

The reactors of both embodiments are capable of producing this same 12.5 cm diameter diamond disk product. The first embodiment reactor using additive manufacturing components (substrate positioners) would require at least 70 fabrication events to produce 1 layer of diamond. The second embodiment reactor would require only 1 fabrication event to produce 1 layer of diamond.

Common to both embodiments of diamond fabrication reactors are:
1) a cylindrical enclosure having top and bottom vacuum and fluid tight sealed end caps having means for easy assembly and disassembly of the cylindrical structure and the end caps;
2) means integral with the top end cap for securing the reactor to a magnetic accelerator connection flange and means to secure the diamond reactor to a support frame;
3) a mass flow conduit which is an extension of the magnetic accelerator electromagnet core having the same inner diameter as said core extending through the top end cover and connection flange interposed between the magnetic accelerator and the diamond fabrication reactor through a fluid and vacuum tight seal terminating in a normally closed gate valve at the reactor input and extending from the output side of the gate valve near the center of a diamond fabrication substrate centered within the reactor for delivery of the fluence of kinetically energized $C_1$ hydrocarbon radicals transiting from the magnetic accelerator into the diamond fabrication reactor;
4) a diamond fabrication deposition substrate secured atop a resistively heated deposition substrate support block;
5) a manometric sensor and a dual service manifold for evacuation of the reactor and for inlet of inert gases into the reactor;

6) means for real time spectroscopic monitoring of the diamond forming process, such as reflectance Fourier transform infrared spectroscopy (FTIR);
7) one or more permanent magnets deployed around the mass flow conduit;
8) power, data, and mass flow components having external connections extending through the reactor walls using fluid and by fluid and vacuum tight seals;
9) an infra red photo detector providing deposition substrate temperature data to an external power controller for the resistive heater power controller.

The temperature controlled deposition substrate support may comprise any sturdy material stable beyond the maximum operating temperature of the diamond fabrication process. Because of the force of the diamond fabrication shock wave, a sturdy material such as carbon steel or stainless steel provides temperature stability to ~1500° C. and sufficient mechanical strength. High temperature ceramics may be used if they are metal fiber embedded composites of nitrides or oxides of tungsten, silicon or aluminum which are stronger and far less brittle than their counterparts having no embedded metal fibers.

An electrical resistance heater such as a ceramic fiber band heater having same side terminals capable of temperatures as high as 1400° C. using 240 VAC current can provide elevated temperatures well beyond those required by the method of this invention. Electric current is provided to the block heater by leads extending between terminals on the block heater to a means for connecting these leads to a block heater power controller.

Seals for conduits extending through the reactor walls are fluid and vacuum tight. Terminal "blocks" extending through the reactor walls area also provide fluid and vacuum tight seals, and these blocks have spring loaded connect-disconnect terminals connected to internal contacts for electrical power conductor and data line leads providing means to mount sensors as well as conduits in these blocks. These seals and terminal blocks are commercially available components.

The reactor of the first embodiment requires positioning apparatus for the additive manufacturing process which can provide shaped diamond products as well as the exemplary 12.5 cm diamond disk. This requires a diameter greater than 25 cm to accommodate movement of the deposition substrate one radial distance from center in both directions for X and Y planes along with whatever contribution to these dimensions is made by the positioners themselves, of which four are required to provide 4 degrees of motional freedom within the X-Y plane.

Embodiment 1—Additive Manufacturing Reactor

Non-Superconducting (64-77° K Magnetic Accelerator)

Figure 11:
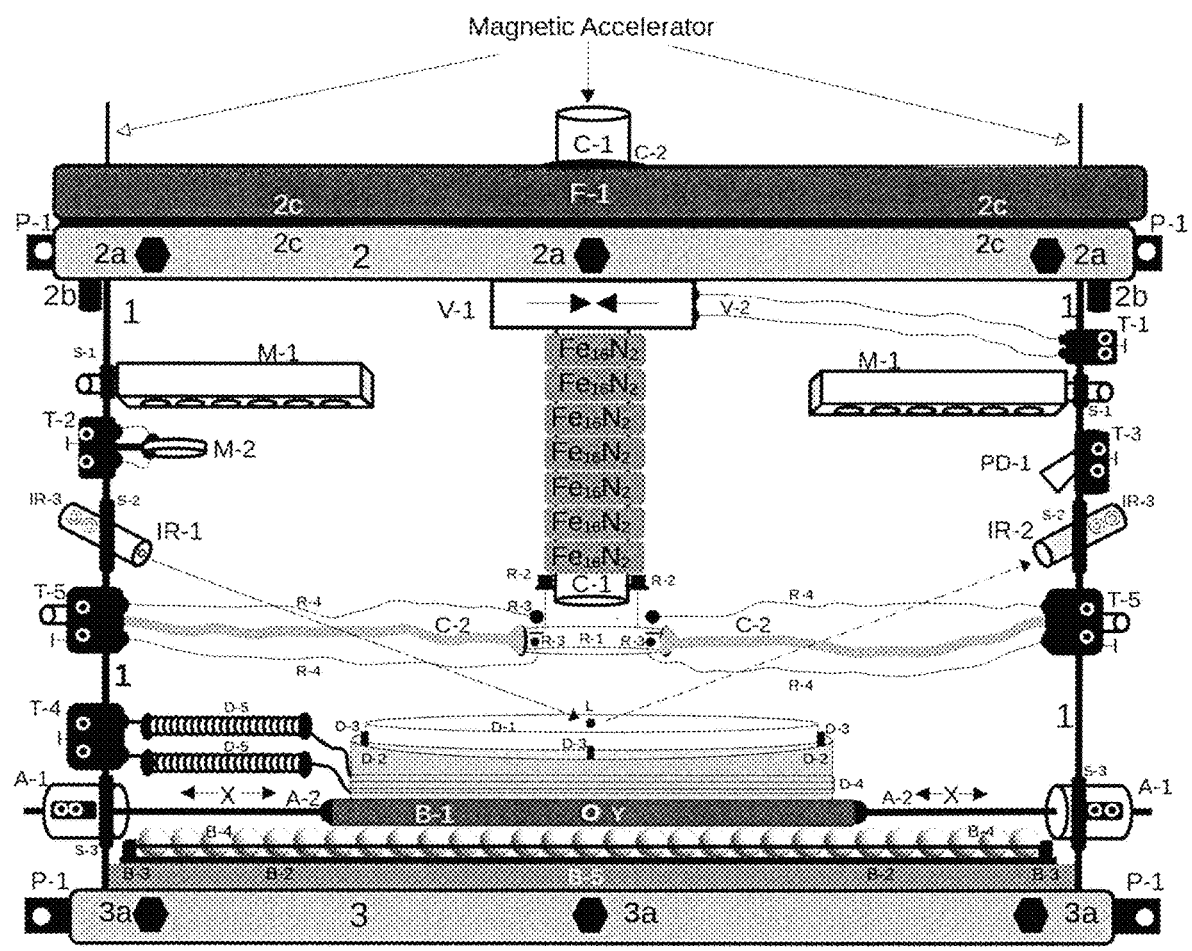
FIG. 11 depicts a non-limiting example of a first embodiment of a fabricated reactor type 1 of the present invention.
Figure 12:
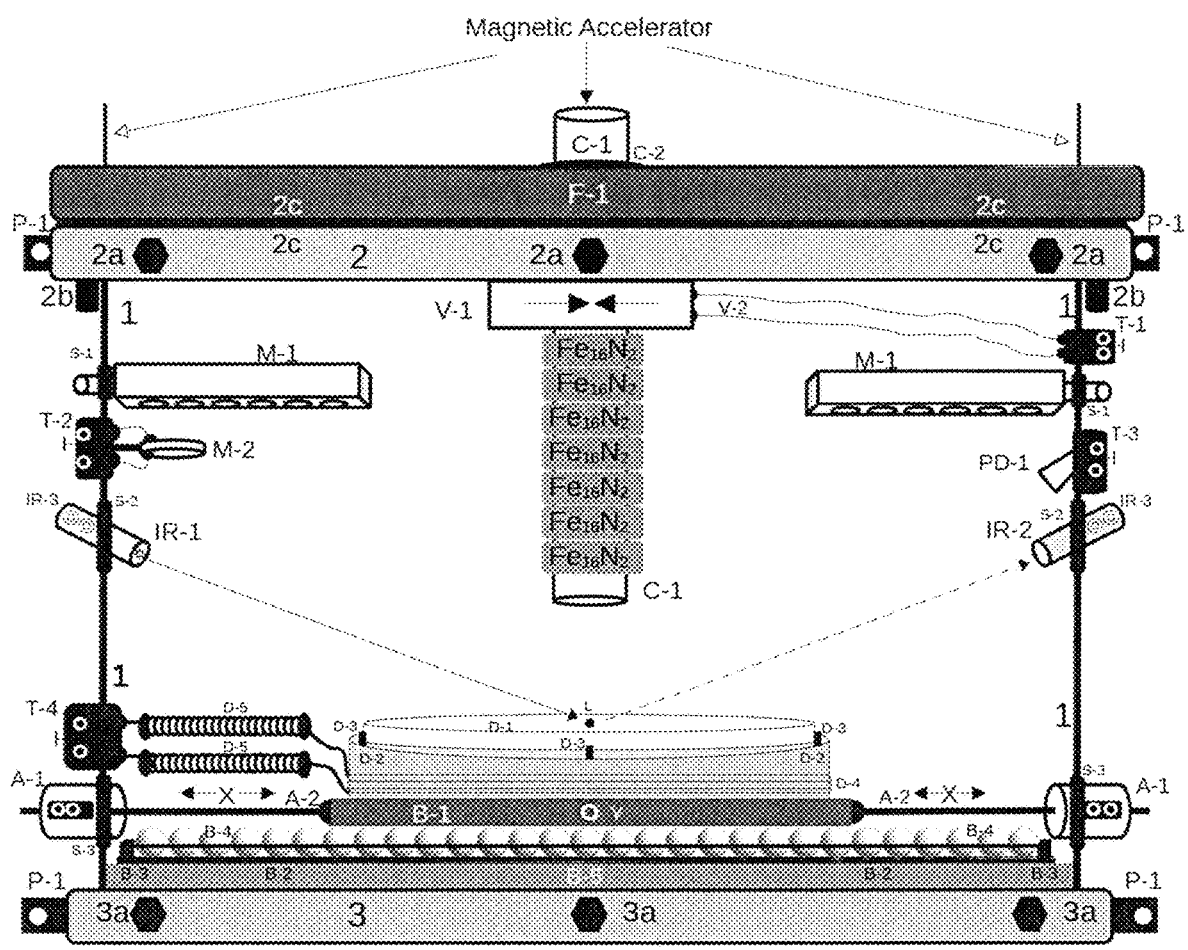
FIG. 12 depicts a non-limiting example of a second embodiment of fabrication reactor type 2.

FIGS. 11 and 12 depict non-limiting examples of the diamond fabrication reactor of the first embodiment of the present invention differing in their means for providing remediating hydrogen plasma to a diamond fabrication locus. These diamond fabrication reactors can produce a shaped and dimensionally precise diamond product using well-known and widely used additive manufacturing techniques (e.g., 3-D printing).

Referring to FIGS. 11 and 12, the diamond fabrication reactor comprises open cylinder 1, top (input side) end cap 2, and bottom end cap 3. End caps 2 and 3 have internally deployed O-ring seals (not shown) which fit around cylinder 1 as fluid and vacuum seals. Threaded expansion bushings at both axial ends of cylinder 1 (not shown) receive bolts 2a and 3a through matching holes drilled through end caps 2 and 3 to secure fluid and vacuum tight seal and connection of these end caps to this cylinder. Mount points P-1 extend from end caps 2 and 3 providing means for bolting the reactor to a support frame (not shown). End cap 2 connects to threads within flange F-1 extending from the magnetic accelerator (not shown) by bolts 2b extending through holes drilled into end cap 2 to secure the reactor to the magnetic accelerator having a fluid and vacuum tight seal 2c deployed between flange F-1 and end cap 2. Mass flow conduit C-1 is the extension of the magnetic accelerator electromagnet core (not shown) into the reactor through apertures formed within end cap 2 and flange F-1 sealed by O-ring seal C-2 deployed within and extending from F-1 around C-1.

Mass flow conduit C-1 extends into isolation valve V-1 deployed within and extending from end cap 2. Mass flow conduit C-1 continues from V-1 into the reactor. Isolation valve V-1 is actuated by current supplied by an external valve controller (not shown) at through wall sealed terminal block T-1 to receive actuation power through leads V-2. A series of iron nitride ($Fe_{16}N_2$) permanent magnets surround C-1 to provide a radical recombination countermeasure magnetic field.

Dual service manifolds M-1 extend through seals S-1 for input of inert gas into and for evacuation of the reactor, both services provided by the gas management system (not shown). Manometric sensor M-2 mounted in terminal block T-2 provides vacuum and pressure data to the gas management system (not shown) Infrared photodetector PD-1 mounted in terminal block T-3 provides temperature data for fabrication substrate D-1 to a heater power controller (not shown). Spectroscopic monitoring of diamond fabrication events is provided by infrared emitter IR-1 and receiver which are mounted in seals S-2. Terminals IR-3 provide means for data line connection to an external spectroscopic monitoring system such as a Reflectance Fourier Transform Infrared Spectrometer (not shown).

Diamond fabrication deposition substrate D-1 is fixed in place upon heated deposition substrate support block D-2 by nubs D-3. Electrical resistance heater band D-4 surrounds D-2 having axially extensible leads D-5 connected to terminal block T-4 for connection to an external heater power control system (not shown). Block D-2 is supported by movable positioning platform B-1 deployed upon a low friction ball bearing assembly comprising ball bearing platform B-2 and retention blocks and bars B-3 for ball bearings B-4. Platform B-2 is supported by heat stable, shock-absorbing silicone cushion B-5 deployed within and extending from end cap 3. Actuators A-1 mount into cylinder 1 by through wall seals S-3 and receive power from an external positioning system (not shown) for reciprocating motion of bars A-2 fitted onto and separable from movable platform B-1. Only X-axis positioners are shown. Contact point Y on B-1 represents the forward and rear contact points for bars A-3 (not shown) at B-1 for reciprocating motion along the Y-axis by a separate pair of actuators (not shown).

Recovery of the diamond product from the reactor proceeds after the fabrication substrate is at ambient temperature and the reactor is at ambient pressure. Bars A-2 are grasped and twisted for detachment and retraction from B-1. Bolts 3a are then loosed so that end cap 3 may be pulled down enough so that power leads from D-2 may be detached from their contact points at D-5 to allow complete separation of end cap 3 and all components thereon so that end cap 3 can be dropped down enough for pulling D-1 free from nubs D-3 for separation from D-2 and post processing. The reverse process is used for installing a new deposition substrate (D-1) onto D-2 and returning D-2 to the reactor on end cap 3 and re-attaching bars A-2 to B-1.

For the reactor of FIG. 12, fabrication event remediation by hydrogen plasma is generated at and provided by the radiolysis reactor (not shown) through conduit C-1.

Referring ONLY to FIG. 11, hydrogen gas is provided to the reactor from the gas management system (not shown) through conduits C-2 extending through terminal blocks T-5 to manifold R-1 deployed around the exit of C-1 supported by posts R-2 connected to C-1. High voltage discharge electrodes R-3 fabricated into R-1 receive high voltage current (~2 KV) from and external high voltage power supply (not shown) through leads R-4 extending from terminal blocks T-5 to produce hydrogen plasma for remediation of fabrication locus L.

Embodiment 2—Superconducting (10-38° K) Magnetic Accelerator Reactor

Figure 13:
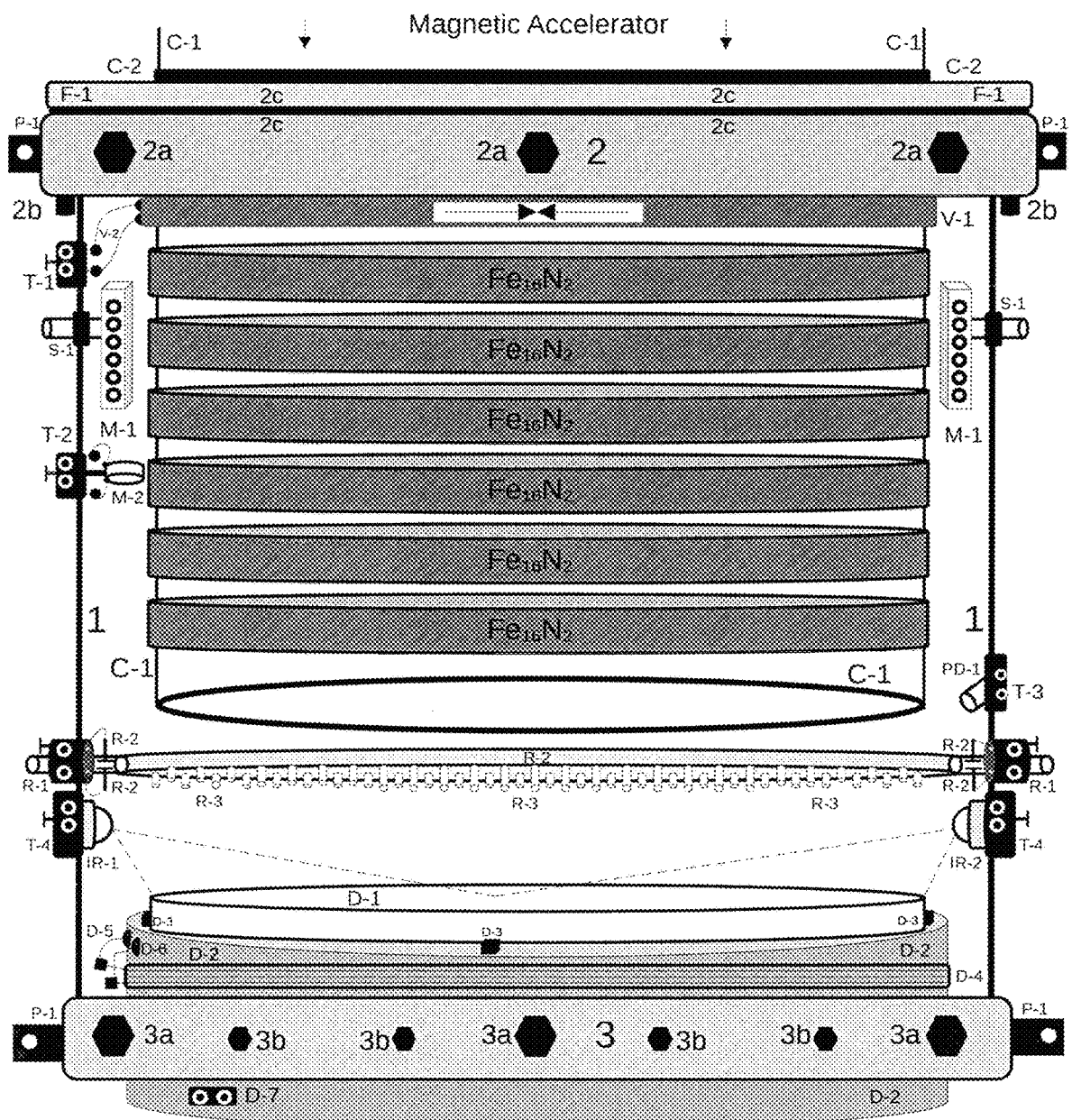
FIG. 13 depicts a non-limiting example of the diamond fabrication reactor of a second embodiment of fabrication reactor type 1 of the present invention.
Figure 14:
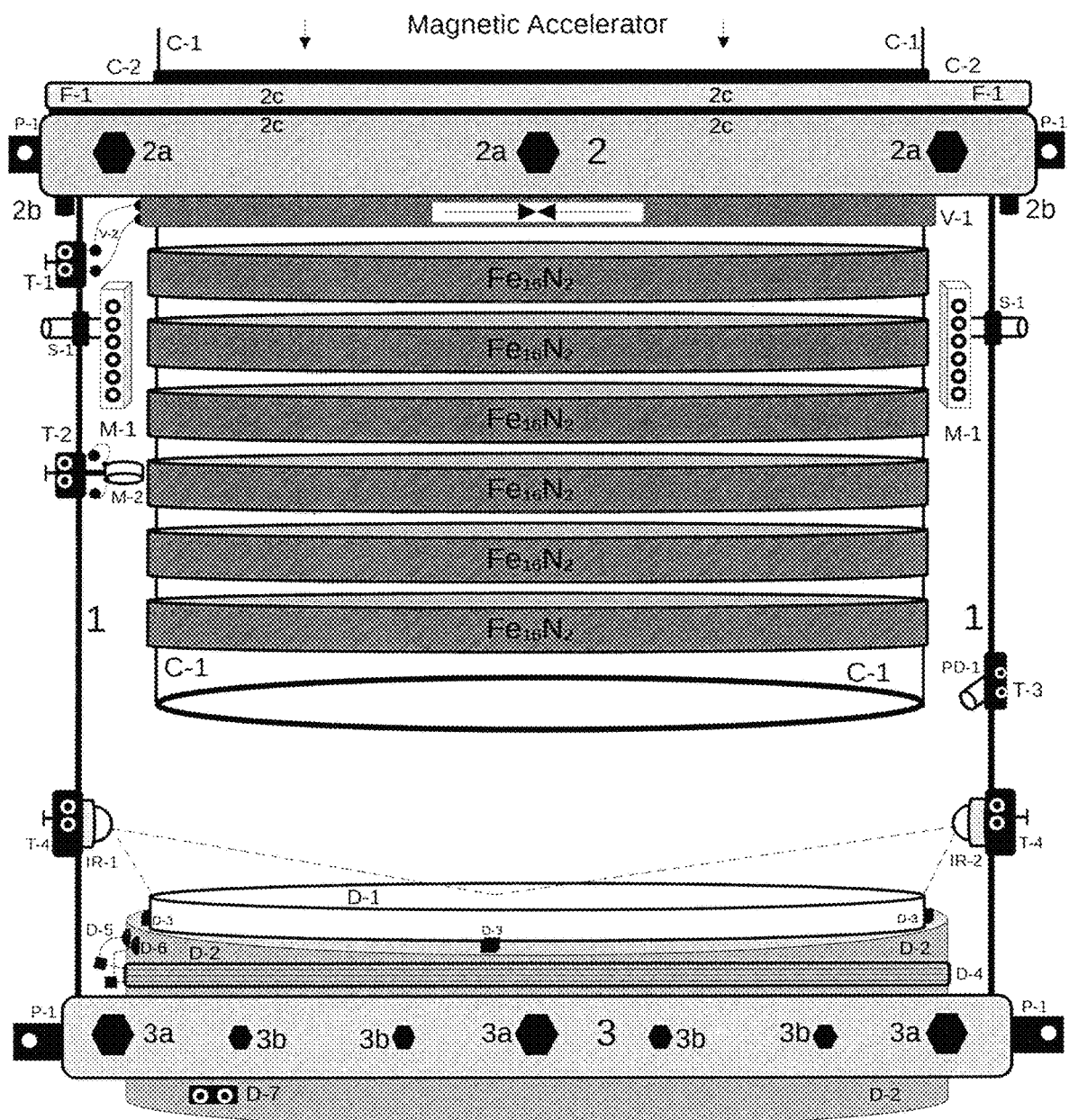
FIG. 14 depicts a non-limiting example of the diamond fabrication reactor of a second embodiment of fabrication reactor type 2 of the present invention.

FIGS. 13 and 14 depict non-limiting examples of the diamond fabrication reactor of the second embodiment of the present invention differing in their means for providing remediating hydrogen plasma to a diamond fabrication locus. These diamond fabrication reactors produce a simple disk shaped diamond product such as, but limited to, a 5 inch wafer used in semiconductor manufacturing.

Referring to FIGS. 13 and 14, the diamond fabrication reactor comprises open cylinder 1, top (input side) end cap 2, and bottom end cap 3. End caps 2 and 3 have internally deployed O-ring seals (not shown) which fit around cylinder 1 as fluid and vacuum seals. Threaded expansion bushings at both axial ends of cylinder 1 (not shown) receive bolts 2a and 3a through matching holes drilled through end caps 2 and 3 to secure fluid and vacuum tight seal and connection of these end caps to this cylinder. Mount points P-1 extend from end caps 2 and 3 providing means for bolting the reactor to a support frame (not shown). End cap 2 connects to threads within flange F-1 extending from the magnetic accelerator (not shown) by bolts 2b extending through holes drilled into end cap 2 to secure the reactor to the magnetic accelerator having a fluid and vacuum tight seal 2c deployed between flange F-1 and end cap 2. Mass flow conduit C-1 is the extension of the magnetic accelerator electromagnet core (not shown) into the reactor through apertures formed within end cap 2 and flange F-1 sealed by O-ring seal C-2 deployed within and extending from F-1 around C-1.

Mass flow conduit C-1 extends into isolation valve V-1 deployed within and extending from end cap 2. Mass flow conduit C-1 continues from V-1 into the reactor. Isolation valve V-1 is actuated by current supplied by an external valve controller (not shown) at terminal block T-1 to receive actuation power through leads V-2. A series of iron nitride ($Fe_{16}N_2$) permanent magnets surround C-1 to provide a radical recombination countermeasure magnetic field.

Dual service manifolds M-1 extend through seals S-1 for input of inert gas into and for evacuation of the reactor, both services provided by the gas management system (not shown). Manometric sensor M-2 mounted in terminal block T-2 provides vacuum and pressure data to the gas management system (not shown) Infrared photodetector PD-1 mounted in terminal block T-3 provides temperature data for fabrication substrate D-1 to a heater power controller (not shown). Spectroscopic monitoring of diamond fabrication events is provided by infrared emitter IR-1 and receiver mounted in terminal blocks T-4 for data line connection to an external spectroscopic monitoring system such as a Reflectance Fourier Transform Infrared Spectrometer (not shown).

Diamond fabrication deposition substrate D-1 is fixed in place upon heated deposition substrate support block D-2 by nubs D-3. Block D-2 extends through a sealed aperture (not shown) within end cap 3. Bolts 3b secure D-2 to end cap 3. Resistance band heater band D-4 surrounds D-2 having leads D-5 connected to terminals D-6 deployed in D2 having internal leads extending through a channel (not shown) within D-2 to external terminals D-7 at the bottom of D-2 for connection to an external heater power controller (not shown).

Recovery of the diamond product from the reactor proceeds after the fabrication substrate is at ambient temperature and the reactor is at ambient pressure. Bolts 3b are loosened and removed from bottom end cap 2 to drop D-2 down through 3. D-1 is then pulled free from nubs D-3 for removal from D-2 and post processing. The reverse process is used for installing a new deposition substrate (D-1) onto D-2 and returning D-2 to the reactor and securing it within end cap 3.

For the reactor of FIG. 14, fabrication event remediation by hydrogen plasma is generated at and provided by the radiolysis reactor (not shown) through conduit C-1.

Referring ONLY to FIG. 13, hydrogen gas is provided to the reactor from the gas management system (not shown) to manifold R-1 deployed at the exit of C-1 through conduits extending from manifold R-1 through terminal blocks T-5. High voltage discharge electrodes R-2 fabricated into R-1 receive high voltage current (~2 KV) from and external high voltage power supply (not shown) through leads extending from these electrodes to terminal blocks T-5 to produce hydrogen plasma for remediation to diamond fabrication deposition substrate D-1 through nozzles R-3 extending from manifold R-1.

Ancillary Systems

The apparatus of the present invention requires several ancillary systems providing service to the its four main components. All of these systems are commercially available and can be interfaced with and controlled by a main computer running sense and control software as well as programmable logic controllers using wired and wireless networks.

Gas Management System

The gas management system provides the hydrocarbon source gases methane and acetylene, helium carrier gas, hydrogen for remediation, and system purge gases such as nitrogen, argon, and carbon dioxide. Working in concert with the valve control system, it provides hydrocarbon source gases mixed with helium carrier gas to the generator as a pre-mixed blend stored in a blend and delivery tank or as individual gases combined in real time for each fabrication event. Helium alone is provided as a burst gas for flushing the radiolysis cavity. Helium is provided to the interface and magnetic accelerator for secondary carrier gas injection. This system performs all evacuation services for the apparatus. Its operation may be managed by main computer sense and control software or by service profile firmware uploaded into the logic controllers integral with this system. This system works in concert with the refrigerant management system for cold trap and heat exchanger refrigerants used in purifying and cooling helium. Remediating hydrogen gas provided to the radiolysis cavity or to manifold within the reactor depending upon the reactor type used.

Complete "turn key" systems and sub-systems are commercially available as are all individual components required to assemble and operate this system (tanks, valves, compressors, conduits, regulators, manifolds, flow and temperature controllers and sensors, vacuum pumps, in-line purification cartridges, etc.). Such equipment is used routinely in CVD diamond fabrication systems. Membrane type gas separators can be provided with these systems and subsystems for separation of hydrogen from helium for helium recycling. Gases for this system are available in research and ultra-high purities from the same suppliers of these systems, subsystems, and individual components.

Refrigerant Management System

This system provides circulating refrigerants to accelerator cryostats, interface components, and heat exchangers used by the gas management system. It supplies R-14 ($CF_4$) to the radiolysis reactor output heat exchanger. For both embodiments of magnetic accelerators, it provides liquid nitrogen to the interface component and to the magnetic accelerator heat shield refrigerant chamber. It provides liquid nitrogen to the first embodiment magnetic accelerator electromagnet refrigerant chamber. For the second embodiment magnetic accelerator, it provides helium gas (10-39° K) to the electromagnet refrigerant chamber and to the second stage of the interface.

Complete "turnkey" refrigerant plants capable of supply and management of liquid nitrogen or liquid nitrogen and helium gas refrigerants are commercially available routinely capable of interfacing with computers and programmable logic controllers as are "turnkey" systems for fluorocarbon (R-14) refrigerants. Controllers for integrating multiple refrigerant sub-systems such as the combination of R-14, liquid nitrogen, and helium gas (from a liquid helium reservoir) as used by the present invention can be acquired from commercial supplies as customized products. Suppliers of these plants and management systems can provide the integrated flow and temperature sensing conduits disclosed for components of the apparatus of the present invention as well as all components needed for assembling a cryogenic refrigerant management. A benefit of these "turnkey" systems is that failure and failure approach profiles for external alert or for internal countermeasure procedures are embedded within their firmware.

Valve Management System

Valve management is effected by programmable logic controllers designed specifically for gate valve actuation. These controllers should be acquired from the manufacturer of the gate valves used. Solenoid type gate valves having NO on-board logic devices are preferred due to the elevated temperature environment of the hydrocarbon radical generator radiolysis cavity. Such valves have "normal" states (open or closed) controlled by how their solenoids are spring loaded. The controller comprises fast solid state switches, one for each valve, and a valve actuation power power supply. Each valve is connected to a power terminal unique to each valve and a common ground for valves and controller. Actuation and restoration times on the order of 10 ms are typical of such gate valves. The apparatus of the present invention requires no more than 8 valves requiring direct management by such controllers. Valves integral to individual ancillary systems are not controlled this system but by controllers integral to those systems.

Microwave Power Amplifier

Magnetron microwave power amplifiers and control preamplifier systems having bi-directional communications capability for external control and for receiving service profile firmware are commercially available. These amplifiers and control preamplifiers can provide the variable power, continuous or pulsed operation, variable pulse widths, and variable delays between power pulses required for the hydrocarbon radical generator. Microwave power amplifiers based on solid state output components are also commercially available where microwave frequencies beyond the customary 2.45 GHz of magnetron amplifiers may be required. Both types of microwave power amplifiers and control preamplifiers are routinely used by CVD diamond fabricators. Such apparatus are routinely "off-the-shelf" products.

Forced Air Cooling

Considerable heat is generated by radiolysis reactor components wave guide and radiolysis cavity. Two fans are used to dissipate this heat. The readiolysis cavity input and output gate valves are the most sensitive of these components whose temperatures should be kept below 250° C. The wave guide generates considerable heat but is less sensitive to heat than are the gate valves. Cooling fans are adequate for this purpose and are capable of maintaining wave guides at safe operating temperatures and gate valves well below 250° C. using temperature controlled motor controllers having non-contact infra-red temperature sensors. Pulse Width Modulation motor speed controllers integrated with infrared sensing LED's having bidirectional network capability and programmable firmware are available from a wide variety of commercial sources. The apparatus of this invention uses two fans, one for the radiolysis cavity, and one for the wave guide, each having a dedicated controller and infrared temperature sensor.

Electromagnet Power Supplies

High Current DC power supplies can be acquired commerically from numerous sources. These power supplies are routinely provided with network communications capability and can be operated remotely or with programmable firmware. Specialized electromagnet power supplies can be obtained from manufacturers of superconducting magnet equipment which have integral high wattage dump resistors and very fast high current solid state switches for electromagnet protection. These power supplies are designed to handle the difficult loads presented by electromagnets and can "ramp" current for powering up and powering down (discharging) electromagnets for routine start-up and shutdown operation to minimize internally produced mechanical stress common to powerful electromagnets. A single connection between electromagnet power posts and the power supply provides both supply of power and current drain. While designed for use with superconducting electromagnets, these power supplies can be used with copper magnet wire wound electromagnets which are far less demanding than are superconducting electromagnets.

High Voltage DC Power Supply

Where fabrication locus remediation is provided by components integral with the reactor, a DC power supply capable of voltages in the 1-5 KV range is required to energize discharge electrodes which produce hydrogen plasma from molecular hydrogen gas. Fast rise-time power-on-demand amplifiers having bi-directional network communications control capability are commercially available as new and as surplus equipment.

Spectroscopic Monitoring

The most practical spectroscopic monitoring of the diamond fabrication substrate is provided by Reflectance Fourier Transform Infrared Spectrometry (R-FTIR) for which small footprint industrial instruments are commercially available. Small emitters and receivers remote from the instrument itself using data over power interfaces are common to such commercial products. Digital libraries of spectra for a vast collection of chemical species are frequently with these commercial products or as options, and many are freely available in public domain (academia, NASA, NIST, EPA, etc.). Spectra of diamond, graphite, and non-stoichiometric impurities associated with diamond fabrication are common to such libraries.

Effluent Monitoring

Small footprint gas chromatograph-mass spectrometer instruments (GC-MS) are commercially available for this service. Digital libraries of the small molecule chemical species used for and produced by the method and apparatus of the present invention are routine features of such commercial products, and such libraries are available in public domain. Effluent monitoring provides useful data for optimizing and monitoring remediation. It may be used with or in place of spectroscopic monitoring where an established and optimized fabrication method is used. Effluent monitoring is useful in emulation and routine shut down and can pinpoint causes for "scram" events. Some GC-MS are small enough and light enough for transport in a suitcase.

Communications Hub

Wifi capable ethernet switches and hubs are commercially available. A programmable switch is the most reliable where significant traffic exists on the network of devices used. Every component and system of the apparatus of the present invention must have bidirectional communications capability with the main computer as well as other systems. Ethernet and wifi are the most practical, least complex, and least expensive means for such component networking. Wired communications is preferred for security sake. Where connection to an external network is required (Internet), a firewall is mandated with a subscription to an anti-virus and anti-malware service.

Main Computer

Being the "heart" and "brains" of the apparatus of the present invention, a computer comprising a multi-processor motherboard hosting 4 multi-core processors and at least 32 GB of memory is recommended. The motherboard and operating system should be able to support multiple ethernet ports, multiple displays, 6-8 USB ports, and a wireless network (WIFI) interface. Where instruments and apparatus use older communication standards of RS-422, RS-232, and GPIB, slot cards or external adapters for these standards should be included. For security sake, backup power supplies for the computer and for operation of the various ancillary systems are recommended. Where used for power supplies and amplifiers, these power backups are for operation not power itself due to their large power demands which would require a large battery bank and robust inverters.

This computer and its associated "smart" components form a Supervisory Control and Data Acquisition (SCADA) system for which sophisticated user-programmable commercial software and freeware is available. A preferred operating system for this purpose is UNIX, but its LINUX implementations are adequate. SCADA software which can be user customized having extensive application specific code libraries are widely available within the Linux "community" which can be used for all aspects of the operation of the apparatus of the present invention. Many SCADA programs and code libraries for use with chemical applications are digital spectra "friendly" and can be downloaded freely.

Sense and control software of the main computer works synchronously with programmable logic controllers (PLCs) used by every active component of the present apparatus using programming languages standardized by the International Electrotechnical Commission, Section 61131.3. Main sense and control software need only command the PLC of a give system component of which task it is to perform within its on-board firmware. The PLC carries out the firmware profile for the task and reports back to sense and control software that tasks completion of an event or correction of an error. Main computer sense and control software proceeds to the next task event (event process) or deals with an error situation such as a shutdown or rest to total apparatus status at the beginning of a fabrication event. Such master control PLC strategy is used commonly in industrial processes being reliable, small is program size, easily debugged and modified as needed.

Assembled Apparatus

Figure 15:
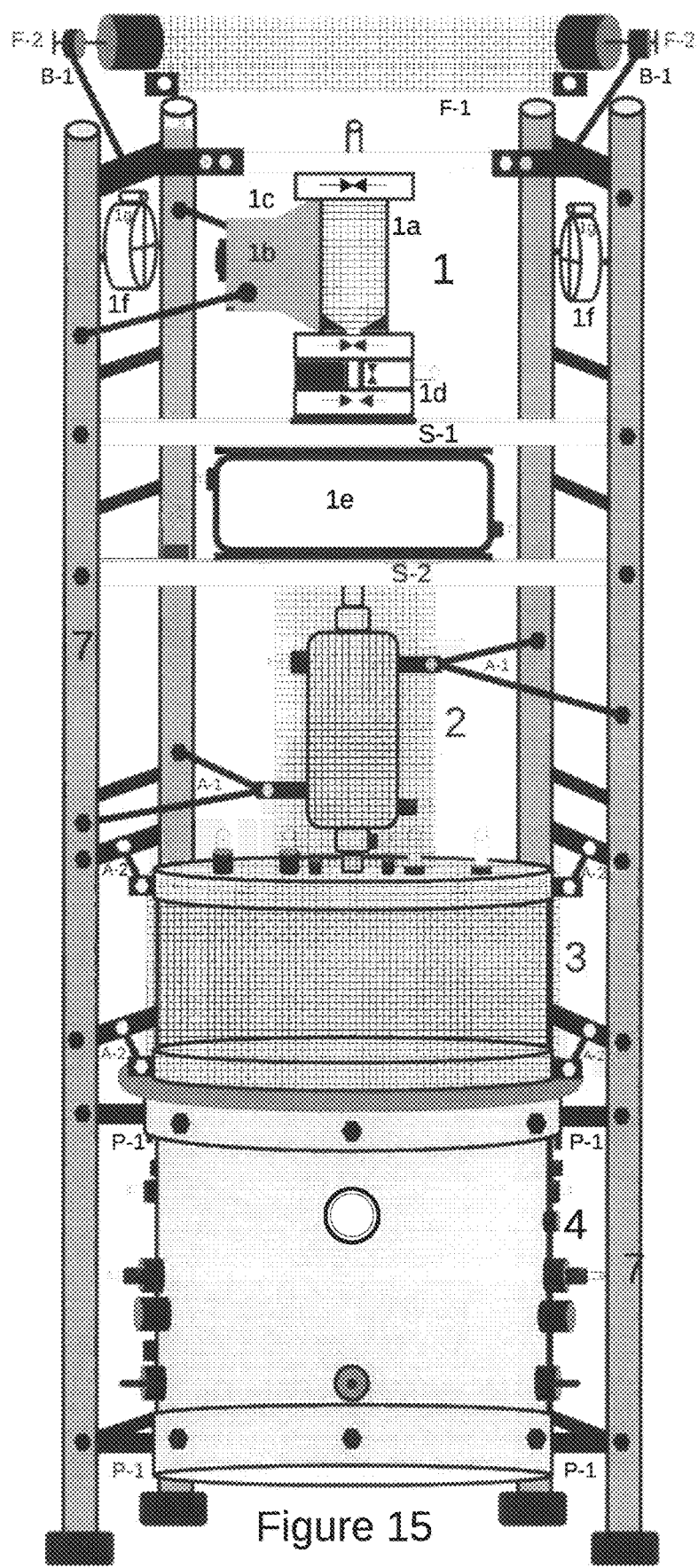
FIG. 15 depicts a non-limiting example of a complete apparatus of the present invention mounted on a rack, exterior view.

FIG. 15 depicts a non-limiting example of the complete apparatus of the present invention as an exterior view of all main components mounted upon a support rack. Ancillary systems required for operation of the apparatus are not shown. Such systems would be located to the rear and sides of the assembled apparatus; nor are connections such as power and data cables, gas and refrigerant conduits shown. Referring to FIG. 15, radiolysis reactor 1 is supported by shelves S-1 and S-2 connected to rack 7 which hold support primary components radiolysis cavity 1a, wave guide 1b, input valve 1c, output valve block 1d, output heat exchanger 1e, cooling fans 1f and infrared temperature sensors 1g. Interface component 2 is connected to rack 7 by bars A-1. Magnetic accelerator 3 is supported by bars extending from rack 7 crossbars A-2. Diamond fabrication reactor 4 is bolted to rack 7 at connection points P-1 of its top and bottom end caps. Bars B-1 extending from rack 7 top cross bars support wire mesh fabric Faraday screen F-1 at rollers F-2

Operation and Throughput

Unlike conventional CVD diamond fabrication processes which are continuous flow processes, the method of the present invention and the novel apparatus required for this method fabricate diamond as a series of events which proceed as foreground events and background events. The foreground events comprise: 1) $C_1$ hydrocarbon radical generation and transit to the site of diamond formation for a fabrication impact event; 2) reactor evacuation; 3) remediation; 4) reactor evacuation. The total time for a fabrication event is the time required for these foreground event valve actuations and times for processes occurring during the event. Reactor evacuation times themselves (exclusive of valve actuation sequence times) are the longest of these foreground process times. Background event times comprise evacuation of the mass flow conduit and radiolysis cavity and radiolysis cavity valve sequences during remediation because reactor evacuation after an impact event provides evacuation of the mass flow conduit of the entire apparatus and the radiolysis cavity. Thus, background events and valve actuation sequences occur only during remediation and post remediation evacuation of the reactor.

The total time for foreground events, the mass of $C_1$ hydrocarbon radicals used for a fabrication impact event, and the conversion efficiency of that mass of $C_1$ hydrocarbon radicals to diamond for a fabrication impact event determines the throughput of the method and apparatus of the present invention. The longest foreground time periods are those required for reactor evacuation. Background events occur during these evacuations and during a remediation event such that background event and valve actuation times do not contribute to the total time for a fabrication event. Background events are only evacuations. Foreground event time periods are the product of valve actuation times and the time required for event processes: reactor evacuation after a fabrication impact event; remediation; reactor evacuation after a remediation event. Reactor evacuations are the longest events.

Figure 16:
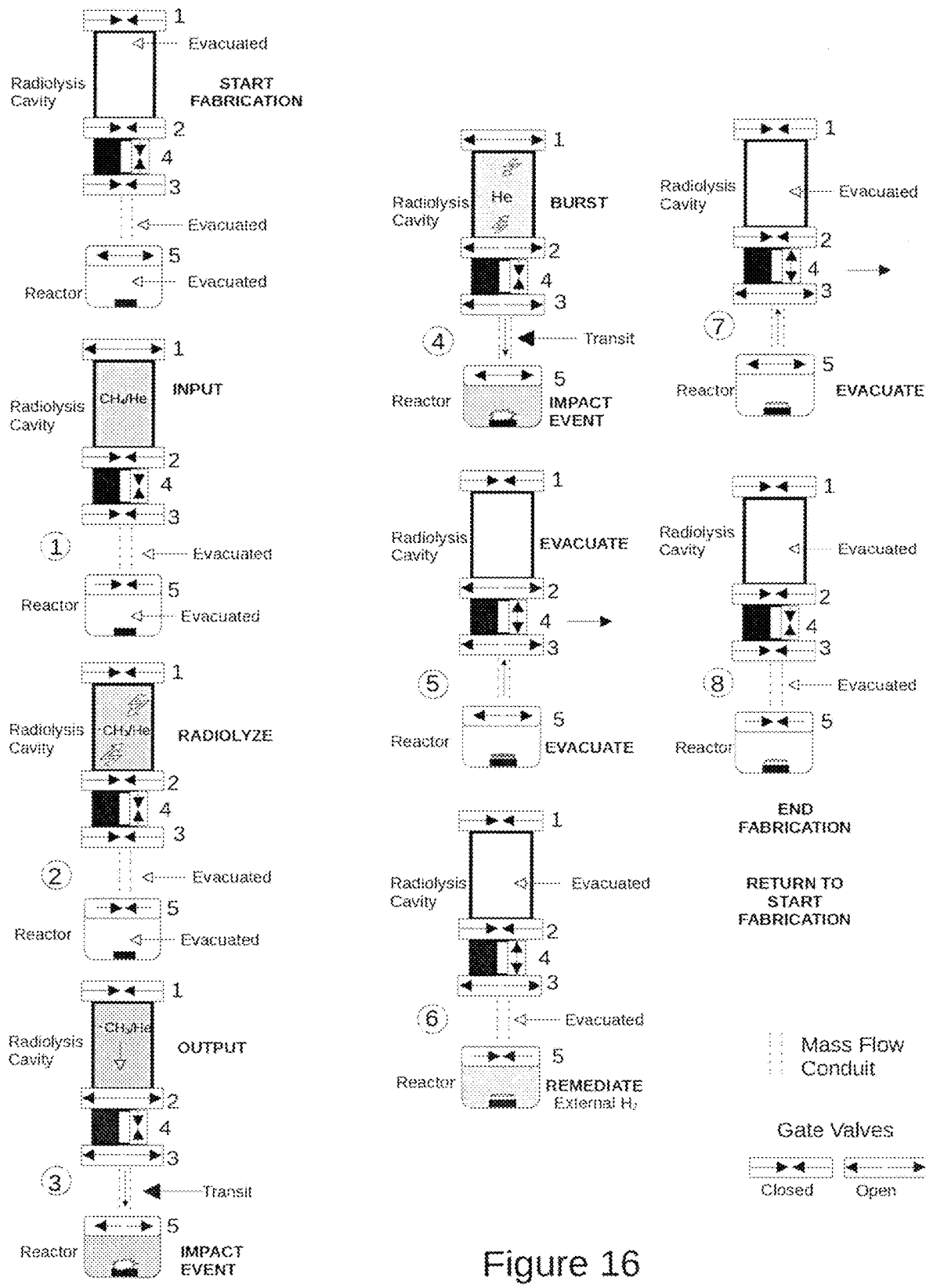
FIG. 16 depicts a valve and event process sequence diagram for type 1 reactor of the present invention.

FIG. 16 depicts a non-limiting example of the individual event processes and valve actuations which comprise a complete fabrication event using a Type 1 diamond fabrication which requires an external hydrogen source of remediating hydrogen having valve actuations (open and close) separate from the 5 valves depicted which contribute to the total time of the fabrication event.

Figure 17:
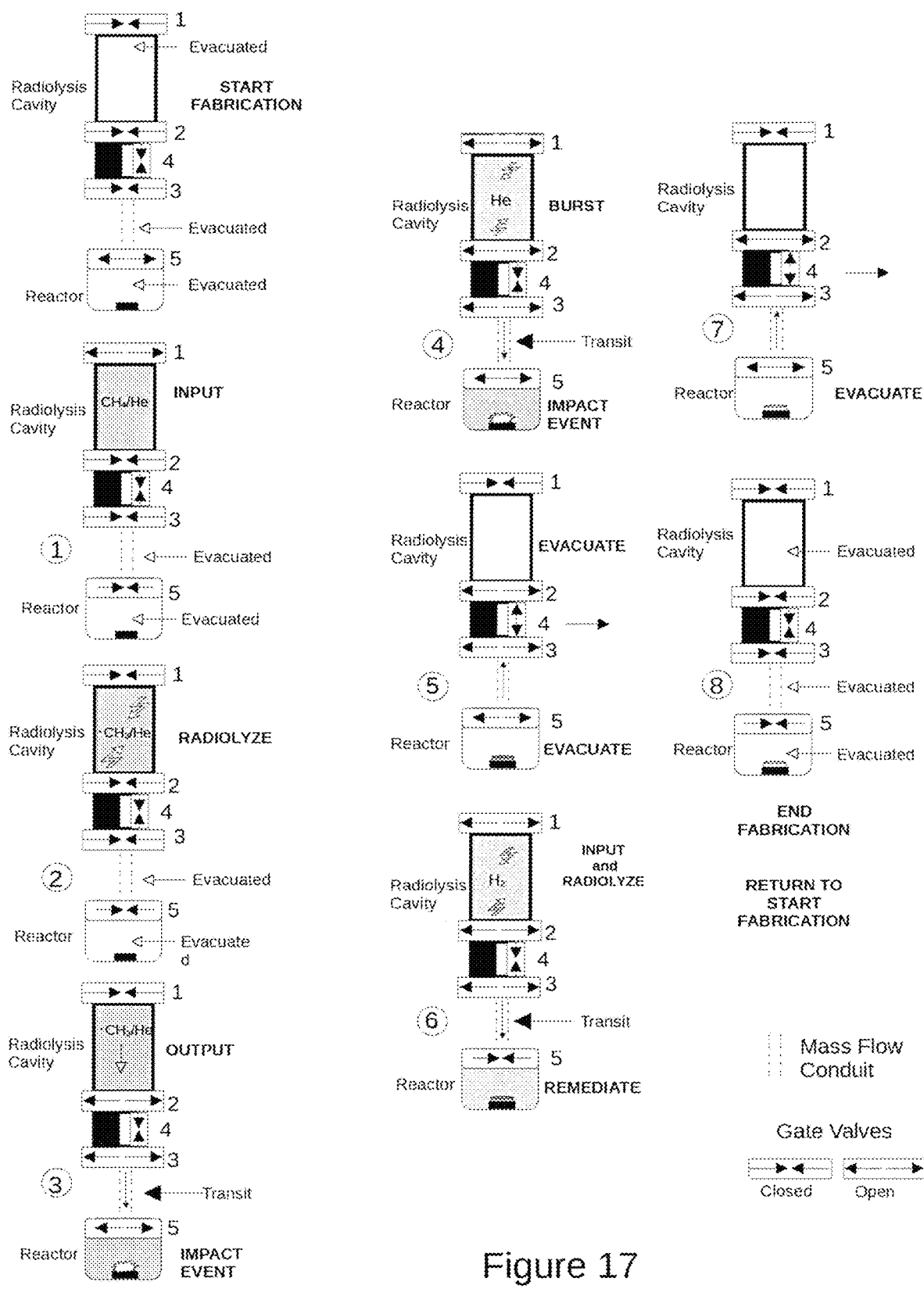
FIG. 17 depicts a valve and event process sequence diagram for type 2 reactor of the present invention.

FIG. 17 depicts a non-limiting example of events and their valve actuation sequences used with a Type 2 diamond fabrication where remediating hydrogen plasma is provided by the radiolysis reactor whose valve actuation sequence time and radiolysis even time contributes to the fabrication event total time For both figures valve numbers 1, 2, 3, 4, and 5 refer to 1) radiolysis cavity input valve; 2) radiolysis cavity output valve; 3) radiolysis cavity isolation valve; 4) radiolysis cavity dump valve; 5) reactor isolation valve. Valve states are depicted using conventional engineering symbols for gate valves and their states. The graphic figure labelled as "Mass Flow Conduit" represents the volume of mass flow conduit extending from the radiolysis cavity output valve (2) into the reactor including the total volume of the reactor. Each event is numbered, the state of apparatus components for that event is labelled, and the sub-process occurring during that event is labelled as Input, Output, Radiolyze, Fabrication Event, Evacuate, and Remediate. The Label "Start Fabrication Event" depicts the state the entire apparatus at the outset of a fabrication event and is not numbered as an event.

Referring to FIG. 16, Events 1-4 comprise the valve actuations and event processes for an impact event (generate and transit). Events 5 and 6 comprise valve actuation sequences and event processes for remediating the fabrication impact event (evacuation and hydrogenolysis). Events 7 and 8 comprise valve actuations and event processes used to re-set the apparatus for a new fabrication event or for an end of run shut down (evacuate).

Referring to FIG. 17, Events 1-4 comprise the valve actuations and event processes for an impact event (generate and transit). Events 5 and 6 comprise valve actuation sequences and event processes for remediating the fabrication impact event (evacuation and hydrogenolysis). Events 7 and 8 comprise valve actuations and event processes used to re-set the apparatus for a new fabrication event or for an end of run shut down (evacuate).

Throughput is an artifact of the total time of fabrication event, the mass of source hydrocarbon used to produce diamond forming $C_1$ hydrocarbon radicals for the fabrication event, and the efficiency of diamond formation at the impact event. A conservative approach is used for determining non-limiting exemplary diamond fabrication throughput by the method and apparatus of the present invention.

All radiolysis cavity and fabrication reactor gate valves have the same specifications and are routinely rated by manufacturers of high speed chemically resistant gates valves for actuation times of about ~10 ms. For the purposes of throughput determinations, a conservative figure of 20 ms is used, and a mass of 1 mmol of source hydrocarbon per fabrication event is used. The radiolysis of hydrocarbon source gases for $C_1$ hydrocarbon radical generation is conducted for 50 ms, but 100 ms is used for this determination for $C_1$ hydrocarbon radical generation, for radiolyzed helium burst gas, and for Type 2 reactor hydrogen plasma formation. Because, as previously stated, hydrogenolytic remediation of non-diamond carbon species may be slow compared to other processes which may occur during conventional CVD fabrication processes, the remediation period used for this determination will be 200 ms for the Type 1 reactor and 100 ms for the Type 2 reactor because hydrogen atoms and plasma generated within the radiolysis cavity are magnetically susceptible and transit to the fabrication locus through magnetic accelerators providing these magnetically susceptible species kinetic energy. The slowest event process is evacuation for which there are several occurrences. Evacuation time periods depend upon vacuum pump capacity and the volume of the entire apparatus. Based upon the first embodiment reactor, a 4 liters is used for this volume. The most practical vacuum pump is the diaphragm pump which requires no pump oil but is slow (21 cfm) compared rotary vane (oil) pumps, 400 ms vs. 150 ms (r liters). The diaphragm pump poses no contamination hazard and its used for this determination. The following table lists the number of foreground valve actuations, number of each type of foreground event processes occurring for diamond fabrication using Type 1 and a Type 2 reactors which can be determined by inspection of FIGS. 16 and 17.

| Type | Valve Actuation | Radiolysis | Remediation | Evacuation |
|---|---|---|---|---|
| 1 | 7 | 2 | 1 | 2 |
| 2 | 7 | 3 | 1 | 2 |

From the above table, the both reactors types require 7 valve actuations: 140 ms. Radiolysis events for the Type 1 reactor require 100 ms for both reactor types. Remediation for the type 1 reactor requires 200 ms and 100 ms for the Type 2 reactor which is a radiolysis event but listed as a remediation event process. Both reactor types require 800 ms for evacuation processes resulting in total fabrication event times of 1.24 ms for both Type 1 and Type 2 reactors. While there is no throughput advantage for either reactor type, the Type 2 reactor requires no additional external components for generating remediating hydrogen plasma, and construction of the Type 2 reactor is less complex requiring no plasma delivery manifold. Thus, the Type 2 reactor is preferred.

Using 1 mmol of hydrocarbon source gas to produce the diamond forming $C_1$ hydrocarbon radicals, 16.04 g/mol for $CH_4$; 26.04 g/mol for $C_2H_2$ and 12.0107 as the atomic mass of carbon, the method and apparatus of the present invention can produce ~34.59 g of carbon as diamond per minute from methane and 69.18 g of carbon as diamond per minute using acetylene at 100% conversion efficiency. A better determination is made using 10%, 25%, and no more than 50% conversion efficiency resulting in throughputs of ~3.5, 8.6, and ~17.3 g of carbon as diamond per minute using methane and ~6.9, ~17.3, ~67.2 g of carbon as diamond per minutes using acetylene.

Strategy of the Invention

Regardless of how diamond is fabricated, diamond is an extremely low entropy material. Regardless of the mechanism of any diamond forming system, energy is required to produce this low entropy species. The physical process of carbon atom assembly is a classic example of a high entropy system producing a low entropy product. A mass of unassembled carbon atoms such as is amorphous carbon is more disordered than is graphite which is a mass of carbon atoms having a defined structure. HPHT diamond fabrications processes typically use graphite because transforming graphite to diamond is essentially transforming one ordered system to another more ordered system. Less energy is required for this transformation than would be required for transforming amorphous carbon to diamond. CVD diamond fabrication processes transform gaseous forms of carbon to diamond, and gases are far higher in entropy than are solids. It is the second law of thermodynamics which controls ANY diamond fabrication process. HPHT diamond fabrication processes have a higher degree of confinement for their carbon atom sources than do CVD diamond fabrication processes. The solid carbon species to be transformed to diamond is static unlike the gaseous carbon which is to be transformed to diamond by CVD diamond fabrication processes. HPHT diamond fabrication processes have access to far larger energies than do CVD diamond fabrication processes in that HPHT processes can provide the energy to transform disordered carbon to highly ordered carbon with both heat and pressure. CVD diamond fabrication processes are constrained to heat energy, and there are practical limits to the amount of energy CVD diamond fabrication processes can provide to drive carbon atoms to assemble to diamond overcoming the limits of entropy and the second law of thermodynamics.

CVD diamond fabrication processes cannot provide a single type of diamond forming carbon to their site of diamond formation as can HPHT processes which use only solid carbon of one form, typically graphite. The diamond forming carbon species used by CVD diamond fabrication processes cannot arrive at the site of diamond formation entirely as a single species of diamond former. Rather, they arrive, to some degree, as a mixture of radicals, and recombined radicals of multiple types for which heat energy at the site of diamond formation is tasked with converting this mixture of species into a single effective diamond former. Further, the presence of a chemically reactive non-carbon species can interfere with or cause competition to carbon atom assembly to diamond. This, too, is a condition of very high entropy. Nevertheless, appreciable quantities of diamond can be obtained from what is best described as a chaotic situation because there exists at the site of diamond formation a guide or template for carbon atom assembly, diamond seeds.

The method of the present invention is without question a CVD diamond fabrication process, but it occurs with a much lower overall entropy than do its conventional counterparts. First, it provides far more energy to its diamond forming system than can its conventional counterparts which can only provide energy to their systems as heat, and there are practical limits to the amount of energy provided to these diamond forming limits as heat. By contrast, the method of the present invention can provide far more energy to its diamond forming system using kinetic energy which is unavailable to its conventional counterparts. The second law of thermodynamics tells us that the higher the energy of a system, the lower is its entropy.

The method of the present invention provides a single optimized diamond forming species to the site of diamond formation using magnetic confinement of the same diamond forming $C_1$ hydrocarbon radicals which conventional diamond fabrication processes allow to diffuse or "wander", and, in the course of such "wandering" (diffusive propagation) can cease to be single optimized diamond formers due to reactions with a chemically reactive carrier gas which the method of the present invention does not use during propagation further reducing the entropy of its system. Note that HPHT processes maintain their diamond formers within a defined confinement volume prior to subjecting them to the Hellish conditions within which diamond forms.

Where diamond formation occurs by the method of the present invention, the lowest entropy condition which this method and its dedicated and novel apparatus provide persist until the energy of the system has dissipated to a point where diamond formation cannot be sustained, thereupon other forms of carbon can occur which can be separated completely from the diamond which has formed. This can only occur where diamond forms as an event comprising high energy and, thus, low entropy as opposed to a continuous flow system which cannot discriminate or segregate conditions of energy and entropy.

While HPHT diamond fabrication processes have been considered to be totally inconsistent with chemical vapor deposition diamond fabrication processes, the method and apparatus of this invention contradict the assumption using the physics of magnetism, electromagnetism, and the second law of thermodynamics.

Summary

The present invention, both the method and the apparatus required to practice the method, provide numerous inventive aspects, some of which are:
1) a confined non-diffusive propagation of the paramagnetic $C_1$ hydrocarbon radicals,
2) magnetic fields for radical recombination countermeasure,
3) secondary magnetic force for
   a) separation of paramagnetic $C_1$ hydrocarbon radicals from diamagnetic side products, and
   b) transit velocities which outrun recombination kinetics
4) chemically inert carrier gas, helium as opposed to chemically reactive hydrogen gas, as a radical recombination countermeasure
5) production of homogeneous diamond product
6) useful for additive manufacturing More specifically, the present invention provides the following advantageous embodiments.

Provided is a method for fabricating diamond in an apparatus by carbon atom assembly which method entails:
  a) generating paramagnetic $C_1$ hydrocarbon radicals by subjecting methane or acetylene to a source of energy sufficient to break carbon-hydrogen bonds if methane is used, or sufficient to break carbon-carbon bonds if acetylene is used, to produce a fluence of the paramagnetic C1 hydrocarbon radicals;
  b) transiting the paramagnetic $C_1$ hydrocarbon radicals through a mass flow conduit extending from a hydrocarbon radical generator into and through an interface component between the hydrocarbon radical generator and a primary magnetic accelerator wherein the paramagnetic C1 hydrocarbon radicals are subjected to the magnetic force of one or more electromagnets within the core of the one or more electromagnets wherein the paramagnetic $C_1$ hydrocarbon radicals are resident to produce a fluence of accelerated and kinetically energized paramagnetic $C_1$ hydrocarbon radicals; and
  c) transiting the fluence of paramagnetic $C_1$ hydrocarbon radicals into a diamond fabricating reactor which contains a heated diamond fabrication substrate, whereby the fluence of accelerated and kinetically energized paramagnetic C1 hydrocarbon radicals impact the diamond forming deposition substrate, thereby transferring the energy from the paramagnetic $C_1$ hydrocarbon radicals to the diamond forming deposition substrate as a shock wave, the shock wave being of sufficient energy to produce a pressure domain which favors diamond formation by carbon atom assembly over graphite formation, thereby fabricating diamond.

In the present method, the paramagnetic $C_1$ hydrocarbon radicals transit through the mass flow conduit by non-diffusive propagation under the influence of a magnetic field to which unpaired valence electrons of the paramagnetic $C_1$ hydrocarbon radicals are aligned and coupled.

In the present method, non-diffusive propagation of the paramagnetic $C_1$ hydrocarbon radicals is driven by the force of an electromagnet deployed within an output heat exchanger of the hydrocarbon radical generator.

In the present method, the magnetic field is provided by permanent magnets deployed about the mass flow conduit within the interface component.

In the present method, the magnetic field is provided by permanent magnets deployed about the mass flow conduit within the diamond fabrication reactor.

Further, in the present method, the magnetic field provided by the permanent magnets prevents radical recoupling of carbon and carbon, and carbon with hydrogen when methane is used or carbon and carbon when acetylene is used.

The present method also provides a magnetic field which provides means to control the profile of radial distribution of the accelerated and kinetically energized paramagnetic C! hydrocarbon radicals transiting through the mass flow conduit within the diamond fabrication reactor.

In the present method, the methane or acetylene is diluted in an inert gas carrier prior to generating the paramagnetic C1 hydrocarbon radicals therefrom. The inert gas is helium, and not hydrogen, which is a chemically reactive species and to be avoided.

In the present method, the paramagnetic $C_1$ hydrocarbon radicals may be a methyl radicals, $CH_3$·, from methane or a carbyne radical, ·CH or •∶CH, from acetylene.

In the present invention, the source of energy is a microwave radiolysis power source, which, as an example, is a microwave generator operating at 2.45 GHz and about 0.8 to about 6 kW.

In the present invention, the method is conducted in an apparatus containing a generator in operable connection with an interface, which interface is in operable connection with a magnetic accelerator having one or more electromagnets for producing a magnetic force, which accelerator is in operable connection with a reactor, the reactor containing a diamond forming deposition substrate. The diamond forming deposition substrate contains an immobilized diamond seed.

Further, in the present method, the diamond seed is surface remediated by hydrogenolysis prior to use to remove non-diamond impurities, which impurities may include graphite and/or other non-diamond species.

Moreover, in the present invention, the immobilized diamond seed contains diamond powder impressed into malleable metal having an annealing or softening temperature below an operating for diamond fabrication. The malleable metal may be platinum, nickel or gold, for example.

The method of the present invention is conducted in an apparatus containing a radical generator in operable connection with an interface, which interface is in operable connection with a magnetic accelerator having one or more electromagnets for producing a magnetic force, which accelerator is in operable connection with a reactor, the reactor containing a diamond forming deposition substrate.

In the present method, the one or more electromagnets can be non-superconducting electromagnets which are cooled by liquid nitrogen.

Alternatively, the one or more electromagnets can be high temperature superconducting (HTSC) electromagnets, which are cooled with helium gas.

The present method entails a repetitive sequence of steps of:
a) generating the paramagnetic $C_1$ hydrocarbon radicals;
b) magnetically accelerating and kinetically energizing the paramagnetic C1 hydrocarbon radicals;
c) impacting said accelerated and kinetically energized paramagnetic C1 hydrocarbon hydrocarbon radicals on the deposition substrate thereby forming diamond on the deposition substrate, and further entailing:
d) remediating surfaces of the formed diamond with hydrogen;
wherein steps a)-d) are repeated until a sufficient mass of diamond is produced.

After these repetitive steps above, the diamond product is removed and the top and sides of the diamond product are subjected to a surface remediation by a wash with a lower alkyl alcohol followed by hydrogenolysis. By lower alkyl is meant C1 hydrocarbon —C6, such as methyl, ethyl, n-propyl, isopropyl, n-butyl, isobutyl, n-pentyl, isopentyl, n-hexyl and/or isohexyl. Thereafter, the diamond product bottom side metal foil is heated to its softening point and separated from the diamond product bottom side mechanically. The bottom side metal is dissolved in aqua regia, and the remaining bottom side of the diamond product is washed with an aqueous alkaline solution, such as dilute 5% by weight sodium carbonate in water, for example, followed by several rinses with distilled water followed by drying said diamond product to complete dryness. The bottom side of the dried diamond is remediated then by abrasion.

The paramagnetic C1 hydrocarbon radicals are generated with and transit through the present apparatus in a carrier gas of helium, and this transit occurs through the apparatus from the site of generation to the site of diamond fabrication by non-diffusive propagation with a mass flow conduit resulting in a confined trajectory, and, thus a homogeneous diamond product. This non-diffusive propagation is effected at cryogenic temperatures, and within a magnetic field to which valence electrons of the paramagnetic $C_1$ hydrocarbon radicals align and couple, thus, preventing radical recombination. This magnetic field is provided by permanent magnets and electromagnets.

Aside from the primary magnetic accelerator, there is also a secondary magnetic acceleration to which the paramagnetic hydrocarbon radicals are subjected, which is upstream of the primary magnetic accelerator. While the secondary magnetic acceleration is not as strong as the acceleration generated by the primary magnetic accelerator, the secondary magnetic acceleration is strong enough to separate the paramagnetic $C_1$ hydrocarbon radicals from side product diamagnetic hydrocarbon species which may form during paramagnetic $C_1$ hydrocarbon radical generation. Yet, it is the stronger primary magnetic accelerator that accelerates and kinetically energizes the paramagnetic $C_t$ hydrocarbon radicals.

By the above-described process, shaped and dimensionally precise high purity diamond products may be obtained.

The apparatus designed to enable the present process generally encompasses a) a radical generator, b) a mass flow conduit extending from the radical generator in a) to an interface and into a primary magnetic accelerator containing one or more electromagnets in operable connection with c)

a diamond fabrication reactor containing a diamond forming deposition substrate. The diamond forming deposition substrate contains an immobilized diamond seed.

More particularly, the radical generator comprises a microwave radiolysis power source, which preferably contains a microwave generator operating at 2.45 GHz and about 0.8 to 6 kW.

The above-described embodiments are intended to be non-limiting, and illustrative only.

What is claimed is:

1. A computer-controlled chemical vapor deposition apparatus for fabricating diamond by carbon atom assembly having a main computer running sense and control software in bidirectional communication with programmable logic controllers comprising components including;

a microwave radiolysis source, a heat exchanger, an interface, a magnetic accelerator, and a diamond fabrication reactor, each including in its center a mass flow conduit, the conduits being extended from radiolysis source to diamond fabrication reactor and being connected to each other through computer-controlled valves;

wherein the microwave radiolysis source is configured to generate microwave energy to generate hydrocarbon radicals from hydrocarbons introduced through mass flow conduit;

wherein the heat exchanger includes, secondary magnetic field generating electromagnetic coils deployed around the mass flow conduit and immersed in a refrigerant, to provide a countermeasure against recoupling of said radicals by aligning and coupling valence electrons of said radicals to the secondary magnetic field, said secondary magnetic field having sufficient force to enable non-diffusive propagation of the radicals to flow through said mass flow conduit in operable and fluid connection;

wherein said interface provides additional heat exchange and an additional radical recoupling countermeasure comprised of permanent magnets deployed around said mass flow conduit;

wherein said magnetic accelerator has one or more electromagnets immersed in a refrigerant contained in a vessel wherein the vessel is further contained in a second refrigerant vessel for generating a primary magnetic field;

wherein the magnetic accelerator is in operable and fluid connection with said diamond fabrication reactor within which a deposition substrate is heatable to 400-800 degrees C., the heatable deposition substrate being sufficient to fission carbon-hydrogen bonds of the radicals exiting from the magnetic accelerator and deposit carbon atoms obtained from said radicals onto said deposition substrate containing immobilized diamond seeds to assemble said carbon atoms into diamond; and a spectroscopic monitoring system to monitor diamond monitoring process to provide feedback to the computer for control; and a substrate positioning system for positioning the substrate in front of the mass conduit.

2. The computer-controlled apparatus of claim 1, which further comprises means for remediation of the product diamond.

3. The computer-controlled apparatus of claim 2, wherein said means for remediation of product diamond comprises a DC power supply capable of voltages in the range of 1-5 kV range required for energize discharge electrodes which produce hydrogen plasma from molecular hydrogen gas.

4. The computer-controlled apparatus of claim 1, wherein said microwave radiolysis cavity is enclosed by valves surrounded by a microwave reflecting grid in contact with a wave guide which delivers microwave energy from the microwave generator.

5. The computer-controlled apparatus of claim 4, wherein the microwave generator operates at 2.45 GHz and about 0.8 to 6 kW.

6. The computer-controlled apparatus of claim 1, wherein said one or more electromagnets are non-superconducting electromagnets.

7. The computer-controlled apparatus of claim 1, wherein said one or more electromagnets are superconducting electromagnets.

8. The computer-controlled apparatus of claim 1, wherein said programmable logic controllers and said main computer have either wired or wireless network means.

9. The computer-controlled apparatus of claim 1, wherein the gas management system provides hydrocarbon source gases methane or acetylene, helium carrier gas, hydrogen for remediation, and system purge gases comprising nitrogen, argon or carbon dioxide.

10. The computer-controlled apparatus of claim 1, wherein said valve control is for gate valve actuation with each valve being connected to a power terminal.

11. The computer-controlled apparatus of claim 1, wherein said spectroscopic monitoring is provided by Reflectance Fourier Transform Infrared Spectrometry (R-FTIR).

12. The computer-controlled apparatus of claim 1, wherein the main control computer comprises a multi-processor motherboard having four multi-core processors and at least 32 GB of memory.

13. The computer-controlled apparatus of claim 1, wherein the bidirectional communication is facilitated by wired or wireless bidirectional communication.

14. The computer-controlled apparatus of claim 1, wherein components 1)-4) are supported on a support rack.

15. The computer-controlled apparatus of claim 1, wherein the main computer running sense and control software in bidirectional communication with programmable logic controllers form a Supervisory Control and Data Acquisition (SCADA) system.

16. The computer-controlled apparatus of claim 15, wherein the SCADA system is U.NIX or LINUX operational.

* * * * *